(12) United States Patent
Moslehi et al.

(10) Patent No.: US 9,318,644 B2
(45) Date of Patent: Apr. 19, 2016

(54) ION IMPLANTATION AND ANNEALING FOR THIN FILM CRYSTALLINE SOLAR CELLS

(75) Inventors: Mehrdad M. Moslehi, Los Altos, CA (US); Virendra V. Rana, Los Gatos, CA (US); Pawan Kapur, Burlingame, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 13/483,024

(22) Filed: May 29, 2012

(65) Prior Publication Data

US 2013/0171767 A1 Jul. 4, 2013

Related U.S. Application Data

(63) Continuation-in-part of application No. 12/774,713, filed on May 5, 2010, now Pat. No. 8,420,435.

(60) Provisional application No. 61/490,859, filed on May 27, 2011, provisional application No. 61/175,698, filed on May 5, 2009.

(51) Int. Cl.
*H01L 31/18* (2006.01)
*H01L 21/265* (2006.01)
*H01L 31/0352* (2006.01)
*H01L 31/068* (2012.01)
*H01L 31/0224* (2006.01)

(52) U.S. Cl.
CPC ...... *H01L 31/1864* (2013.01); *H01L 21/26586* (2013.01); *H01L 31/022441* (2013.01); *H01L 31/03529* (2013.01); *H01L 31/035281* (2013.01); *H01L 31/068* (2013.01); *H01L 31/0682* (2013.01); *H01L 31/1804* (2013.01); *H01L 31/1896* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |

(Continued)

FOREIGN PATENT DOCUMENTS

| | | |
|---|---|---|
| DE | 41 41 083 A1 | 6/1993 |
| EP | 0 334 330 A2 | 9/1989 |

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Scott B Geyer
(74) *Attorney, Agent, or Firm* — John Wood

(57) ABSTRACT

A back contact back junction thin-film solar cell is formed on a thin-film semiconductor solar cell. Preferably the thin film semiconductor material comprises crystalline silicon. Base regions, emitter regions, and front surface field regions are formed through ion implantation and annealing processes.

35 Claims, 37 Drawing Sheets

(56) References Cited

U.S. PATENT DOCUMENTS

| | | | |
|---|---|---|---|
| 4,427,839 A | 1/1984 | Hall | |
| 4,430,519 A | 2/1984 | Young | |
| 4,461,922 A | 7/1984 | Gay et al. | |
| 4,479,847 A | 10/1984 | McCaldin et al. | |
| 4,626,613 A | 12/1986 | Wenham et al. | |
| 4,661,212 A | 4/1987 | Ehrfeld et al. | |
| 4,672,023 A | 6/1987 | Leung | |
| 4,922,277 A | 5/1990 | Carlson et al. | |
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis et al. | |
| 5,248,621 A | 9/1993 | Sano | |
| 5,316,593 A | 5/1994 | Olson et al. | |
| 5,348,618 A | 9/1994 | Canham et al. | |
| 5,397,400 A | 3/1995 | Matsuno et al. | |
| 5,458,755 A | 10/1995 | Fujiyama et al. | |
| 5,459,099 A | 10/1995 | Hsu | |
| 5,494,832 A | 2/1996 | Lehmann et al. | |
| 5,538,564 A | 7/1996 | Kaschmitter | |
| 5,616,185 A | 4/1997 | Kukulka | |
| 5,645,684 A | 7/1997 | Keller | |
| 5,660,680 A | 8/1997 | Keller | |
| 5,681,392 A | 10/1997 | Swain | |
| 5,704,992 A | 1/1998 | Willeke et al. | |
| 5,882,988 A | 3/1999 | Haberern et al. | |
| 5,899,360 A | 5/1999 | Mack et al. | |
| 5,928,438 A | 7/1999 | Salami et al. | |
| 5,994,640 A | 11/1999 | Bansemir et al. | |
| 6,058,945 A | 5/2000 | Fujiyama et al. | |
| 6,091,021 A | 7/2000 | Ruby et al. | |
| 6,096,229 A | 8/2000 | Shahid | |
| 6,114,046 A | 9/2000 | Hanoka | |
| 6,127,623 A | 10/2000 | Nakamura et al. | |
| 6,143,629 A | 11/2000 | Sato | |
| 6,204,443 B1 | 3/2001 | Kiso et al. | |
| 6,225,193 B1 | 5/2001 | Simpson et al. | |
| 6,294,725 B1 | 9/2001 | Hirschberg et al. | |
| 6,331,208 B1 | 12/2001 | Nishida et al. | |
| 6,399,143 B1 | 6/2002 | Sun et al. | |
| 6,416,647 B1 | 7/2002 | Dordi et al. | |
| 6,428,620 B1 | 8/2002 | Yamagata et al. | |
| 6,429,037 B1 | 8/2002 | Wenham et al. | |
| 6,441,297 B1 | 8/2002 | Keller et al. | |
| 6,448,155 B1 | 9/2002 | Iwasaki et al. | |
| 6,461,932 B1 | 10/2002 | Wang | |
| 6,524,880 B2 | 2/2003 | Moon et al. | |
| 6,534,336 B1 | 3/2003 | Iwane et al. | |
| 6,551,908 B2 | 4/2003 | Ukiyo et al. | |
| 6,555,443 B1 | 4/2003 | Artmann et al. | |
| 6,566,235 B2 | 5/2003 | Nishida et al. | |
| 6,602,760 B2 | 8/2003 | Poortmans et al. | |
| 6,602,767 B2 | 8/2003 | Nishida et al. | |
| 6,613,148 B1 | 9/2003 | Rasmussen | |
| 6,624,009 B1 | 9/2003 | Green et al. | |
| 6,645,833 B2 | 11/2003 | Brendel | |
| 6,649,485 B2 | 11/2003 | Solanki et al. | |
| 6,653,722 B2 | 11/2003 | Blalock et al. | |
| 6,664,169 B1 | 12/2003 | Iwasaki et al. | |
| 6,756,289 B1 | 6/2004 | Nakagawa et al. | |
| 6,818,104 B2 | 11/2004 | Iwasaki et al. | |
| 6,881,644 B2 | 4/2005 | Malik et al. | |
| 6,946,052 B2 | 9/2005 | Yanagita et al. | |
| 6,964,732 B2 | 11/2005 | Solanki | |
| 7,014,748 B2 | 3/2006 | Matsumura et al. | |
| 7,022,585 B2 | 4/2006 | Solanki et al. | |
| 7,026,237 B2 | 4/2006 | Lamb, III et al. | |
| 7,309,658 B2 | 12/2007 | Lazovsky et al. | |
| 7,368,756 B2 | 5/2008 | Bruhns et al. | |
| 7,402,523 B2 | 7/2008 | Nishimura et al. | |
| 7,745,313 B2 | 6/2010 | Wang et al. | |
| 7,786,376 B2 | 8/2010 | Nag et al. | |
| 7,857,907 B2 | 12/2010 | Cho et al. | |
| 7,915,154 B2 * | 3/2011 | Piwczyk | 438/557 |
| 7,999,174 B2 | 8/2011 | Moslehi | |
| 8,035,027 B2 | 10/2011 | Moslehi | |
| 8,035,028 B2 | 10/2011 | Moslehi | |
| 8,053,665 B2 | 11/2011 | Moslehi et al. | |
| 8,084,684 B2 | 12/2011 | Moslehi | |
| 8,129,822 B2 | 3/2012 | Moslehi | |
| 8,168,465 B2 | 5/2012 | Wang et al. | |
| 8,193,076 B2 | 6/2012 | Moslehi et al. | |
| 8,241,940 B2 | 8/2012 | Moslehi et al. | |
| 8,420,435 B2 | 4/2013 | Rana et al. | |
| 2002/0079290 A1 | 6/2002 | Holdermann | |
| 2002/0153039 A1 | 10/2002 | Moon et al. | |
| 2002/0168592 A1 | 11/2002 | Vezenov et al. | |
| 2002/0179140 A1 | 12/2002 | Toyomura | |
| 2003/0017712 A1 | 1/2003 | Brendel | |
| 2003/0039843 A1 | 2/2003 | Johnson et al. | |
| 2003/0124761 A1 | 7/2003 | Baert et al. | |
| 2004/0021062 A1 | 2/2004 | Zaidi | |
| 2004/0028875 A1 | 2/2004 | Van Rijn et al. | |
| 2004/0173790 A1 | 9/2004 | Yeo et al. | |
| 2004/0175893 A1 | 9/2004 | Vatus et al. | |
| 2004/0192044 A1 | 9/2004 | Degertekin et al. | |
| 2004/0235406 A1 | 11/2004 | Duescher | |
| 2004/0259335 A1 | 12/2004 | Narayanan et al. | |
| 2004/0265587 A1 | 12/2004 | Koyanagi et al. | |
| 2005/0160970 A1 | 7/2005 | Niira et al. | |
| 2005/0172998 A1 | 8/2005 | Gee et al. | |
| 2005/0176164 A1 | 8/2005 | Gee et al. | |
| 2005/0177343 A1 | 8/2005 | Nagae | |
| 2005/0189015 A1 | 9/2005 | Rohatgi et al. | |
| 2005/0199279 A1 | 9/2005 | Yoshimine et al. | |
| 2005/0274410 A1 | 12/2005 | Yuuki et al. | |
| 2005/0281982 A1 | 12/2005 | Li | |
| 2006/0021565 A1 | 2/2006 | Zahler et al. | |
| 2006/0043495 A1 | 3/2006 | Uno et al. | |
| 2006/0054212 A1 | 3/2006 | Fraas et al. | |
| 2006/0070884 A1 | 4/2006 | Momoi et al. | |
| 2006/0105492 A1 | 5/2006 | Veres et al. | |
| 2006/0177988 A1 | 8/2006 | Shea et al. | |
| 2006/0196536 A1 | 9/2006 | Fujioka et al. | |
| 2006/0231031 A1 | 10/2006 | Dings et al. | |
| 2006/0266916 A1 | 11/2006 | Miller et al. | |
| 2006/0270179 A1 | 11/2006 | Yang | |
| 2006/0283495 A1 | 12/2006 | Gibson | |
| 2006/0286775 A1 | 12/2006 | Singh et al. | |
| 2007/0077770 A1 | 4/2007 | Wang et al. | |
| 2007/0082499 A1 | 4/2007 | Jung et al. | |
| 2008/0047601 A1 | 2/2008 | Nag et al. | |
| 2008/0128641 A1 | 6/2008 | Henley et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0151784 A1 | 6/2009 | Luan et al. | |
| 2009/0199901 A1 | 8/2009 | Trassl et al. | |
| 2009/0227094 A1 | 9/2009 | Bateman et al. | |
| 2009/0260685 A1 | 10/2009 | Lee et al. | |
| 2009/0301549 A1 | 12/2009 | Moslehi | |
| 2009/0308439 A1 | 12/2009 | Adibi et al. | |
| 2010/0022074 A1 | 1/2010 | Wang et al. | |
| 2010/0052088 A1 | 3/2010 | Carey et al. | |
| 2010/0116316 A1 | 5/2010 | Moslehi et al. | |
| 2010/0124619 A1 | 5/2010 | Xu et al. | |
| 2010/0144080 A1 | 6/2010 | Ong | |
| 2010/0148318 A1 | 6/2010 | Wang et al. | |
| 2010/0148319 A1 | 6/2010 | Wang et al. | |
| 2010/0154998 A1 | 6/2010 | Ong | |
| 2010/0175752 A1 | 7/2010 | Wang et al. | |
| 2010/0203711 A1 | 8/2010 | Wang et al. | |
| 2010/0224229 A1 * | 9/2010 | Pralle et al. | 136/244 |
| 2010/0267186 A1 | 10/2010 | Wang et al. | |
| 2010/0267245 A1 | 10/2010 | Kamian et al. | |
| 2010/0279494 A1 | 11/2010 | Wang et al. | |
| 2010/0294333 A1 | 11/2010 | Wang et al. | |
| 2010/0294356 A1 | 11/2010 | Parikh et al. | |
| 2010/0300518 A1 | 12/2010 | Moslehi et al. | |
| 2010/0304521 A1 | 12/2010 | Seutter et al. | |

(56) References Cited

U.S. PATENT DOCUMENTS

| | | |
|---|---|---|
| 2010/0304522 A1 | 12/2010 | Rana et al. |
| 2011/0014742 A1 | 1/2011 | Parikh et al. |
| 2011/0030610 A1 | 2/2011 | Kamian et al. |
| 2011/0059587 A1* | 3/2011 | Luo et al. ............... 438/283 |
| 2011/0108098 A1 | 5/2011 | Kapur |
| 2011/0120882 A1 | 5/2011 | Crafts et al. |
| 2011/0124145 A1 | 5/2011 | Moslehi |
| 2011/0265867 A1 | 11/2011 | Moslehi |
| 2011/0272013 A1 | 11/2011 | Moslehi |
| 2011/0284068 A1 | 11/2011 | Moslehi et al. |
| 2011/0303280 A1* | 12/2011 | Pawlak et al. ............ 136/256 |
| 2012/0012160 A1 | 1/2012 | Moslehi |
| 2012/0017971 A1 | 1/2012 | Moslehi |
| 2012/0017988 A1 | 1/2012 | Moslehi |
| 2012/0021560 A1 | 1/2012 | Moslehi et al. |
| 2012/0028399 A1 | 2/2012 | Moslehi et al. |
| 2012/0085278 A1 | 4/2012 | Moslehi et al. |
| 2012/0103408 A1 | 5/2012 | Moslehi et al. |
| 2012/0122272 A1 | 5/2012 | Rana et al. |
| 2012/0125256 A1 | 5/2012 | Kramer et al. |
| 2012/0145553 A1 | 6/2012 | Kramer et al. |
| 2012/0167819 A1 | 7/2012 | Kramer et al. |
| 2012/0171804 A1 | 7/2012 | Moslehi et al. |
| 2012/0174860 A1 | 7/2012 | Moslehi |
| 2012/0174861 A1 | 7/2012 | Wang et al. |
| 2012/0178203 A1 | 7/2012 | Moslehi et al. |
| 2012/0180867 A1 | 7/2012 | Moslehi |
| 2012/0192789 A1 | 8/2012 | Kramer et al. |
| 2012/0225515 A1 | 9/2012 | Moslehi et al. |
| 2013/0330872 A1 | 12/2013 | Rana et al. |

FOREIGN PATENT DOCUMENTS

| | | |
|---|---|---|
| EP | 1 024 523 A1 | 2/2000 |
| EP | 1 054 458 A2 | 11/2000 |
| JP | 06-260670 A | 9/1994 |
| KR | 2010-0128153 | 12/2010 |
| WO | WO 96/41368 | 12/1996 |
| WO | PCT/EP1999/008573 | 5/2000 |
| WO | 2002-299661 A | 10/2002 |
| WO | WO/2010/111417 | 9/2010 |
| WO | WO/2012/166749 | 12/2012 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al., Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al., Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al., Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al., Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al., Large-Area Thin-Film Free-Standing Monocrystalline Si Solar cells by Layer Transfer, Leuven, Belgium, IEEE.

J.H.Werner et al., From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al., A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al., Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association, date: 2006.

R.Brendel, et al., Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

R.B. Bergmann, Crystalline Si Thin-Film Solar Cells: a Review, 1999, pp. 187-194, vol. 69, Applied Physics A Materials Science and Processing, Springer-Verlag.

Richard Auer et al., Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photovtaics: Research and Applications, 2006, pp. 393-411, vol. 14, John Wiley & Sons, Ltd.

Takao Yonehara, et al., Epitaxial Layer Transfer by Bond and Etch Back of Porous Si, Applied Physics Letter 64, Apr. 18, 1994, vol. 16, American Institute of Physics.

Toshiki Yagi, et al., Ray-Trace Simulation of Light Trapping in Silicon Solar Cell with Texture Structures, Solar Energy Materials & Solar Cells, 2006, pp. 2647-2656, vol. 90, Elsevier B.V.

(56) References Cited

OTHER PUBLICATIONS

International Preliminary Report on Patentability and Search Report for PCT/US2012/039901 having common priority claim to U.S. Appl. No. 61/490,859 filed May 27, 2011. (attached).

Non-Final Office Action for priority patent application U.S. Appl. No. 12/774,713 dated Aug. 9, 2012. (attached).

Non-Final Office Action for related U.S. App. No. 13/688,062 having common priority claim to U.S. Appl. No. 12/774,713 dated Aug. 11, 2014. (attached).

PCT International Search Report and Written Opinion dated Feb. 1, 2013 issued in PCT/US2012/039901.

PCT International Preliminary Report on Patentability dated Dec. 2, 2014 issued in PCT/US2012/039901.

EP Partial Supplementary Search Report dated Jan. 8, 2015 issued in EP 12793962.7.

EP Extended Search Report dated Apr. 29, 2015 issued in EP 12793962.7.

* cited by examiner

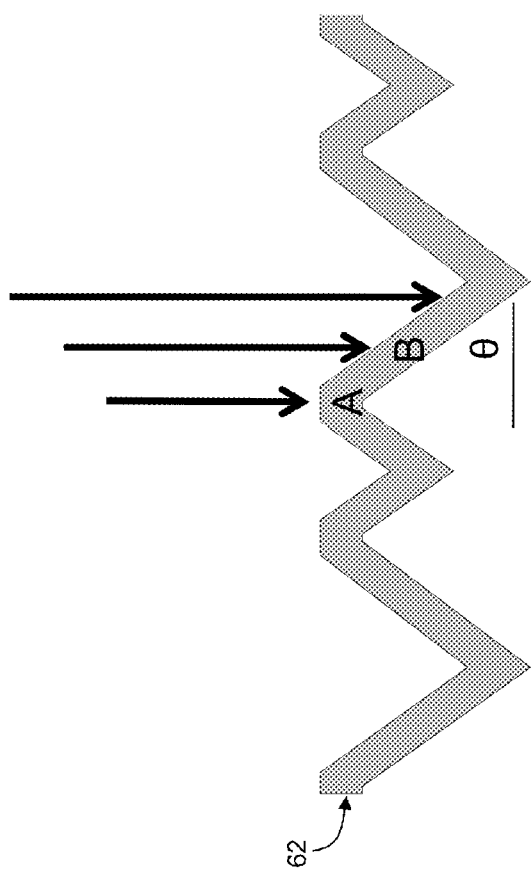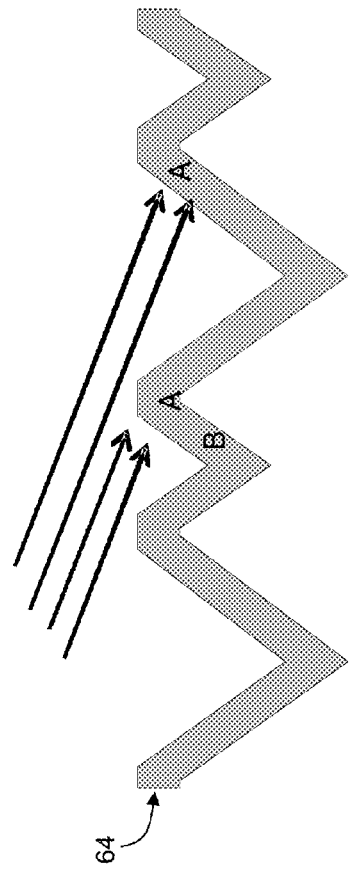
FIGURE 6
FIGURE 7

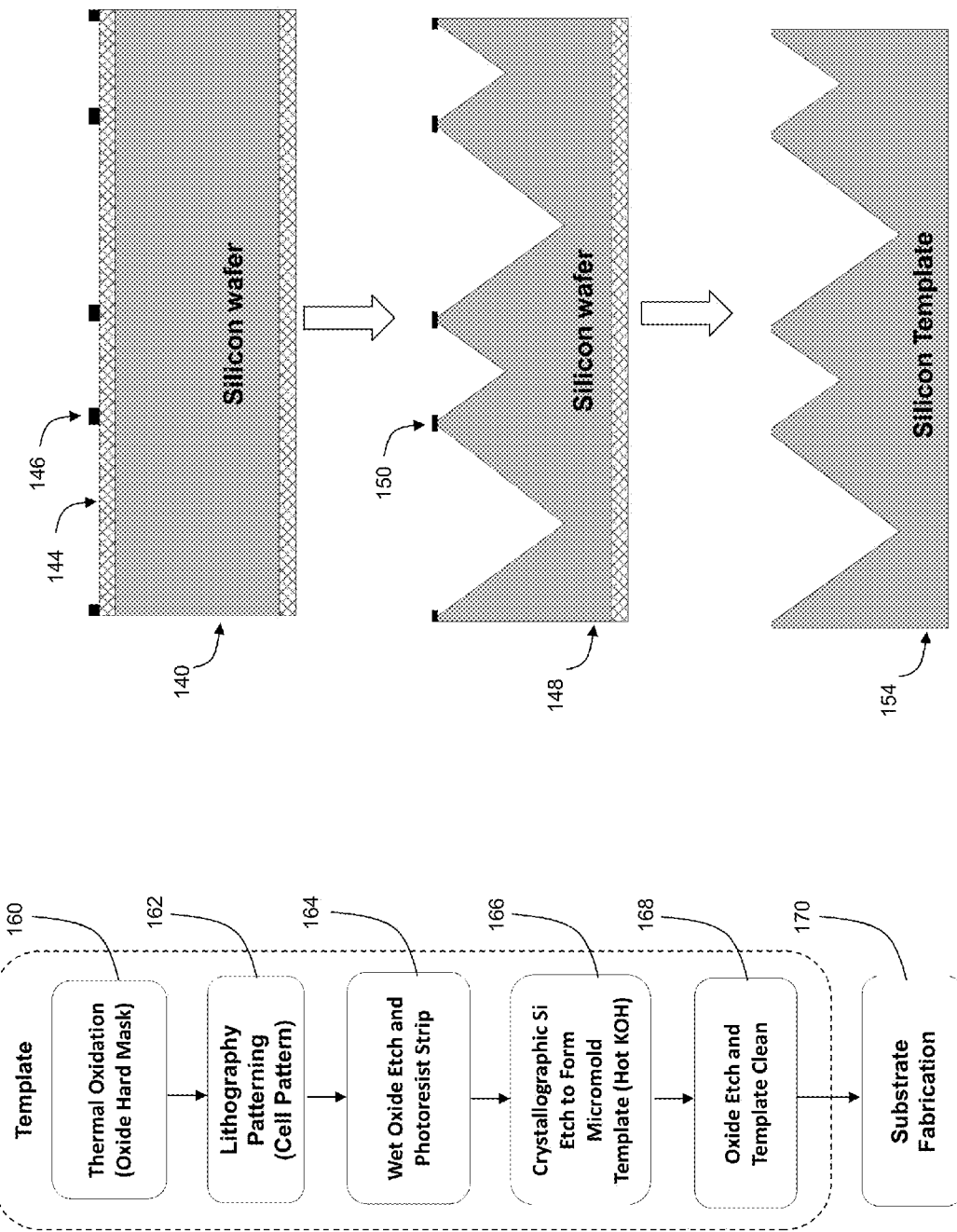

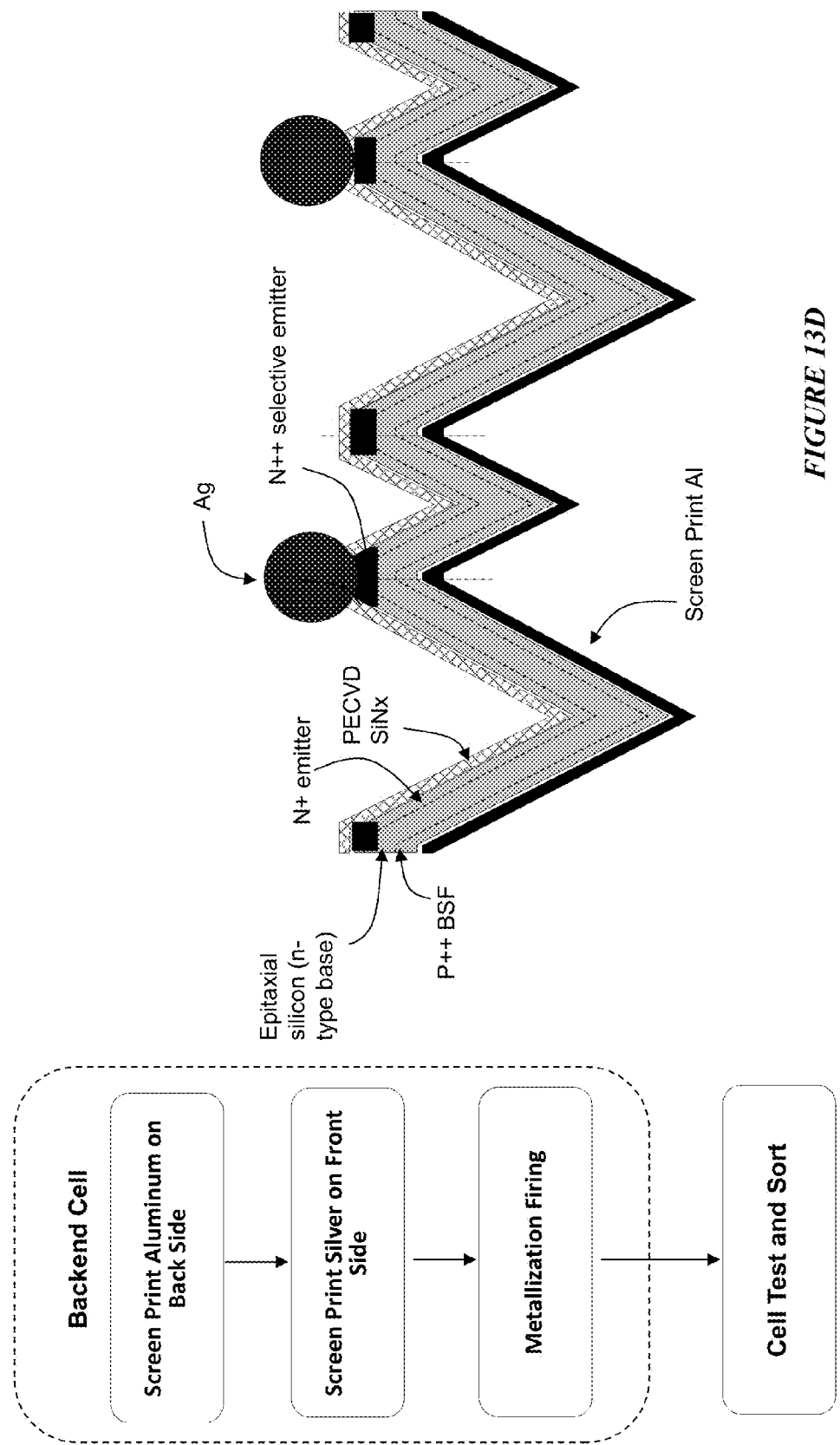

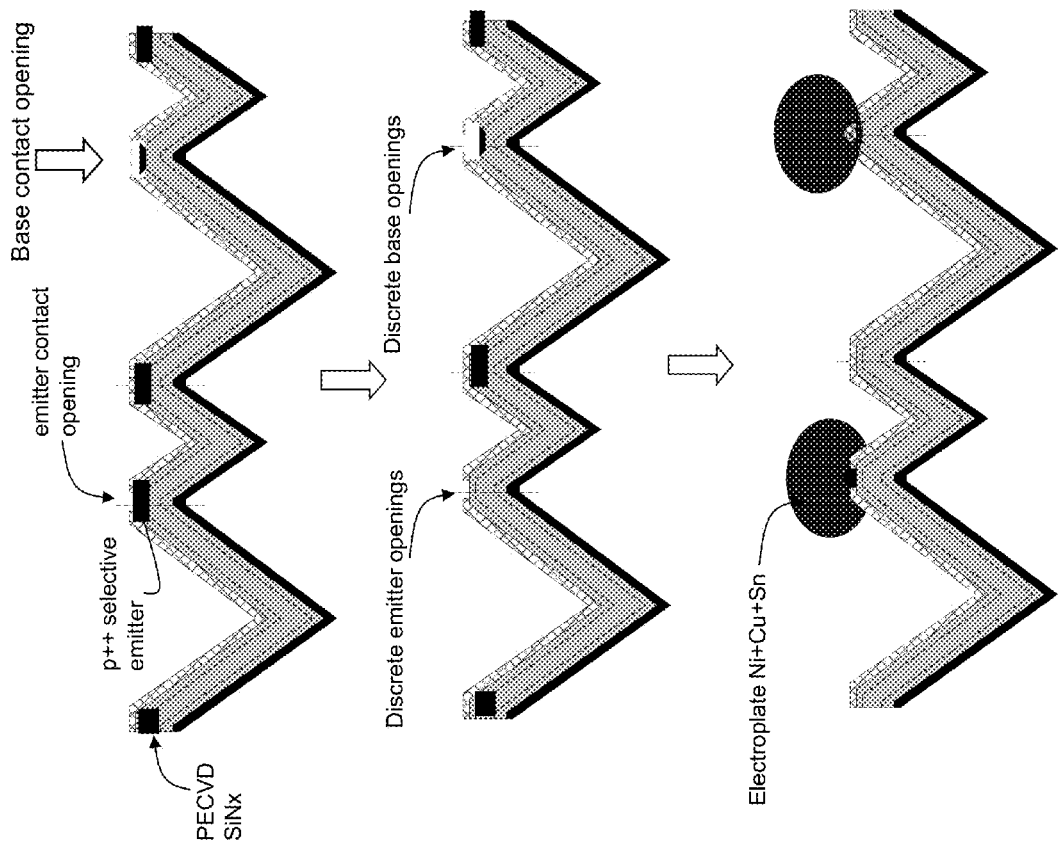
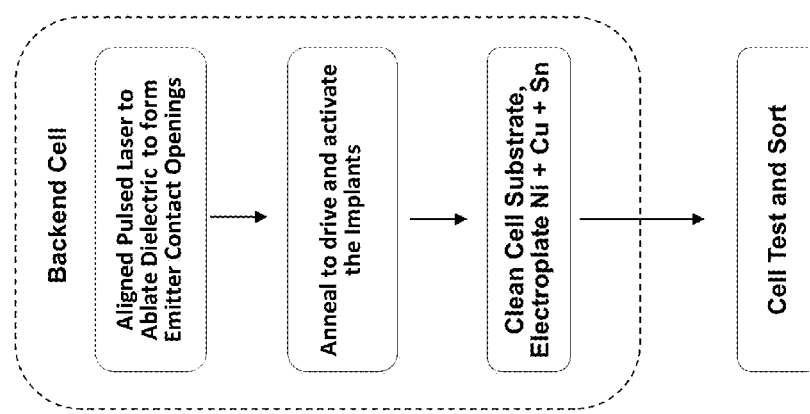
*FIGURE 15C*
*FIGURE 15D*

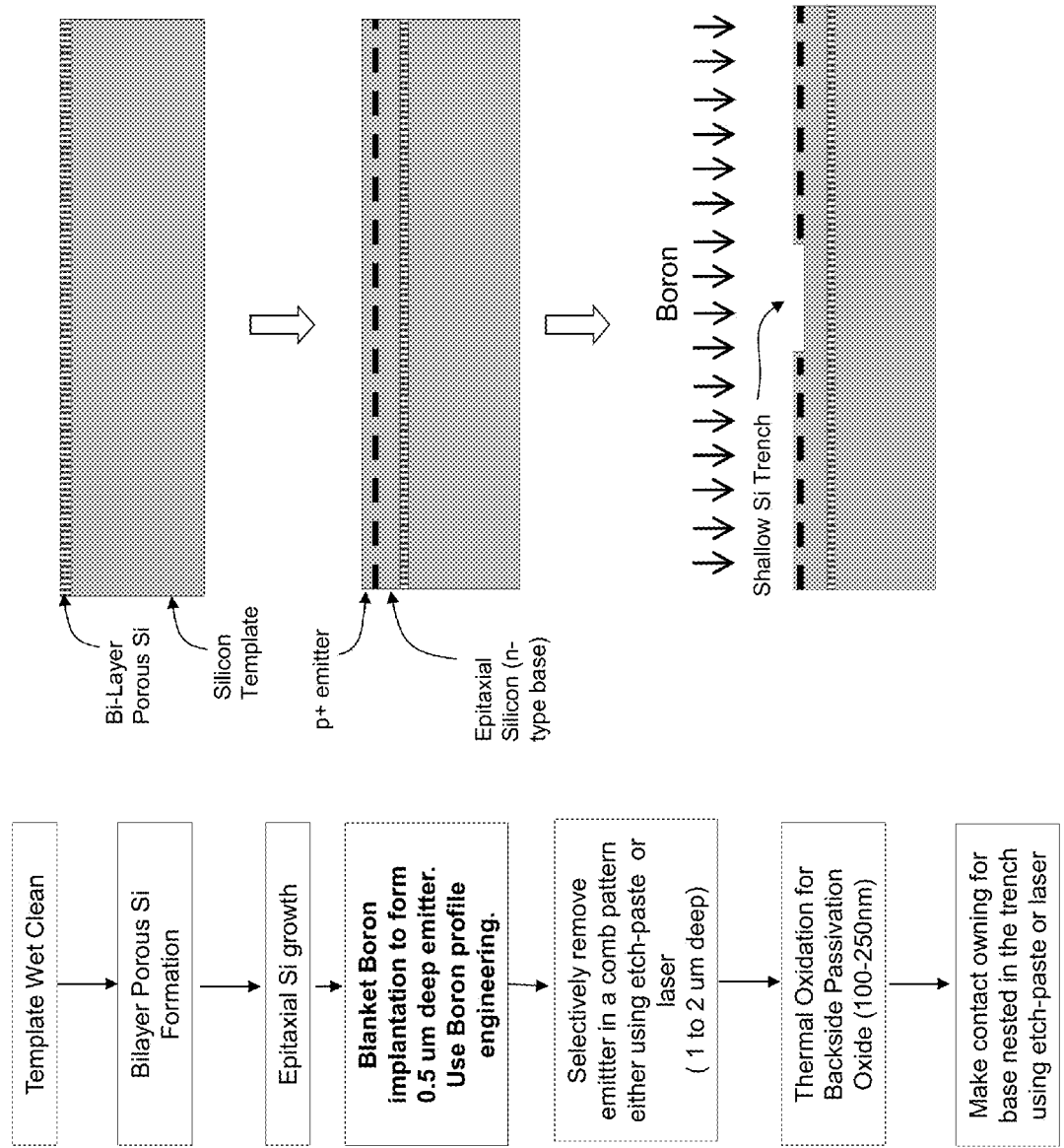

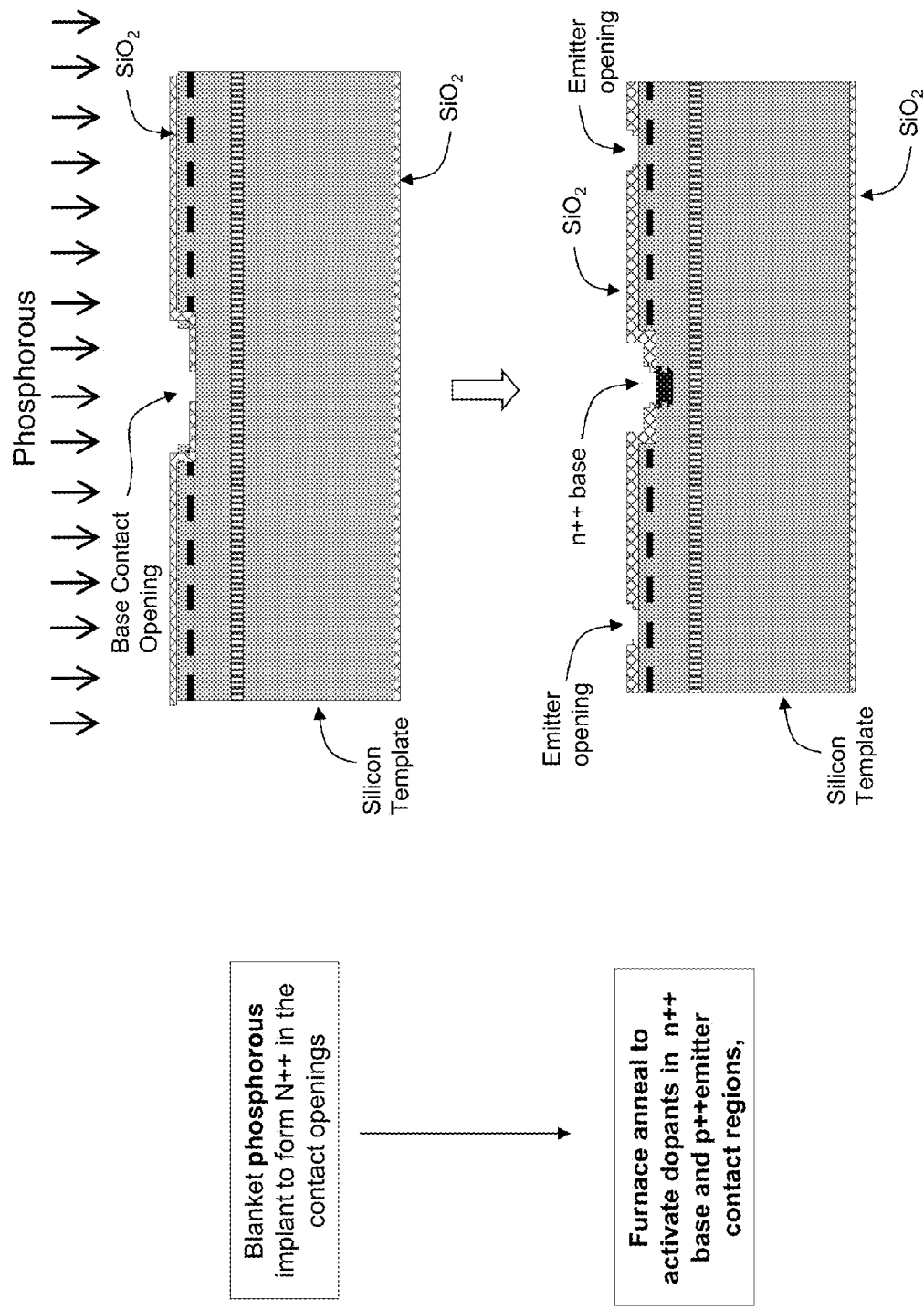

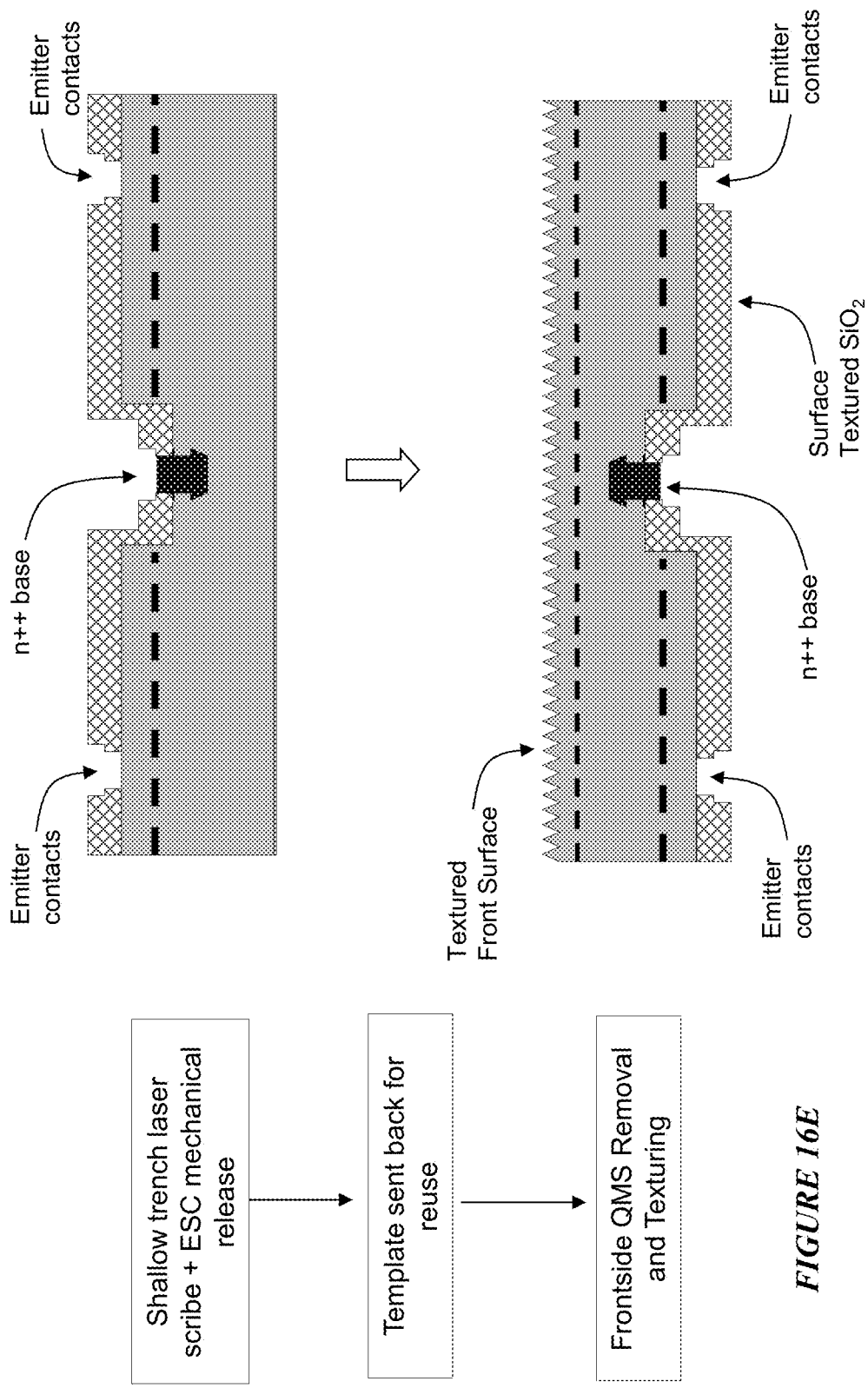

ION IMPLANTATION AND ANNEALING FOR THIN FILM CRYSTALLINE SOLAR CELLS

CROSS-REFERENCE TO RELATED APPLICATIONS

This application also claims the benefit of provisional patent application 61/490,859 filed on May 27, 2011, which is hereby incorporated by reference in its entirety.

This application is also a continuation-in-part of U.S. patent application Ser. No. 12/774,713 filed May 5, 2010 now U.S. Pat. No. 8,420,435 issued Apr. 16, 2013 which claims the benefit of U.S. Provisional Patent Application No. 61/175,698 filed May 5, 2009, all of which are hereby incorporated by reference in their entirety.

FIELD

This disclosure relates in general to the field of photovoltaics and solar cells, and more particularly to methods for manufacturing thin-film solar cells (TFSCs). More particularly, the present disclosure provides ion implantation applications for manufacturing Thin-Film Crystalline Silicon Solar Cells (TFSC).

BACKGROUND

Ion implantation involves implantation of ions of certain elements into a solid and is a standard technique used in the fabrication of semiconductor devices. The implantation of dopant atoms such as phosphorous (P), arsenic (As), and boron (B) may be used to form semiconductor junctions, while the implantation of oxygen may be used in silicon-on-oxide (SOI) devices. Additionally, it has been reported that crystalline silicon (c-Si) solar cells have been manufactured using ion implantation methods to form the p-n junctions. However, these efforts are directed towards planar crystalline silicon wafers. In current manufacturing methods for thin-film crystalline silicon solar cell (TFSC), either planar or three dimensional cells, the p-n junctions are often formed by either POCl3-based doping, or a phosphorous compound deposition or spray-on followed by annealing.

Ion implantation of P and B for forming emitters in a p-type or n-type silicon substrate followed by a suitable annealing treatment have been shown to yield solar cells with high efficiency. However, current ion implantation efforts are limited to planar, thick c-Si wafers (typically ≥200 um).

High efficiency c-Si solar cells have been made on very thin wafers, down to 45 um, by thinning down the conventional c-Si wafers from bulk silicon ingots or bricks, using integrated circuits (IC) packaging techniques. However, this approach is often not practical because of the high cost. C-Si Thin-Film Solar Cells (TFSC) may be advantageously made by depositing a thin layer of c-Si on a suitable substrate or by slicing a c-Si ingot into thin wafers using advanced wire sawing or other known techniques such as hydrogen implantation followed by annealing to cause thin wafer separation.

Often, high performance thin-film silicon substrates (TFSS) are made by depositing an epitaxial crystalline silicon layer according to chemical vapor deposition (CVD) process. Solar cells created in this epitaxial silicon deposition method may be planar or have a well defined structure. Although, in principle, any three-dimensional surface structure is possible for 3-D cells, various performance limitations make certain 3-D structures more advantageous—such as pyramidal or prism based three-dimensional surface features.

The current standard technique for the formation of selective emitters involves several steps. Usually, the full front surface of a p-type wafer is lightly doped using the POCl3 based process or a process involving spraying a phosphorous-compound followed by anneal. Then a passivating dielectric is deposited on the front surface of the silicon substrate. The regions that are desired to be metallization contacts are then selectively opened in this dielectric, usually by a laser ablation or an etch gel process. A second doping process is then carried out to selectively dope these localized regions with a high concentration of phosphorous. However, this process is often lengthy, costly, and inefficient.

When forming homogeneous emitter layers on a TFSS, controlling the dopant profile may provide higher efficiency. To maximize current collection from the solar cell, a good 'blue response' is required. This requires the maximum phosphorous content near the surface to be less than $1E21$ cm$-3$ from the surface and the depth of the emitter to be preferably in the range of 0.3 to 0.5 um thick. Because of this, there is a growing need in the solar industry for shallow emitters. However, the current industrial emitter formation processes, such as POCl3-based doping, phosphosilicate (PSG) deposition, or phosphoric acid spray-on followed by in-line anneal, do not provide control of the phosphorous concentration and depth independently. Thus, the emitter characteristics are solely determined by the temperature and time used for the doping anneal.

Further, the lifetime of minority charge carriers is greatly reduced at concentrations above $1E18$ cm$-3$. For maximum blue response this would appear to be the upper limit of the dopant concentration in the emitter. However, this would lead to very high emitter sheet resistance and high series resistance and low fill factor (FF) and low current density (Jsc). Therefore, a thin higher doped region near the surface is desired. However, current dopant profile controlling methodology is limited.

SUMMARY

Therefore a need has arisen for a simplified manufacturing method for forming a thin-film solar cell. Base regions, emitter regions, and front surface field regions are formed through ion implantation and annealing processes.

In accordance with the disclosed subject matter, applications of ion implantation and subsequent annealing activation in the manufacturing of thin-film crystalline silicon (c-Si) solar cells are provided that substantially reduce disadvantages of prior art methods.

Technical advantages of the disclosed methods may include utilizing a combination of the implantation annealing process with a passivation processes, such as oxidation, to simultaneously obtain high quality surface passivation. Yet another technical advantage may include the utilization of the field effect to enhance passivation—this may be achieved by suitably charging the overlying dielectric using ion implantation.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the claims of subsequently filed applications based on this provisional.

BRIEF DESCRIPTION OF THE DRAWINGS

The features, nature, and advantages of the disclosed subject matter will become more apparent from the detailed description set forth below when taken in conjunction with the accompanying drawings, wherein:

FIG. 6 shows an ion implantation process for variable doping on pyramidal three-dimensional TFSS;

FIG. 7 shows an angled ion implantation process on pyramidal three-dimensional TFSS;

FIGS. 11A through 11B FIG. 11A show a process flow for the formation of a reusable template for forming a crystalline thin-film silicon solar cell;

FIGS. 12A through 13D show the process flow for the formation of a front contact crystalline thin-film silicon solar cell in accordance with the disclosed subject matter;

FIGS. 16A through 16H show the process flow for the formation of a back contact planar crystalline thin-film silicon solar cell in accordance with the disclosed subject matter;

DETAIL DESCRIPTION

Figure 2A:
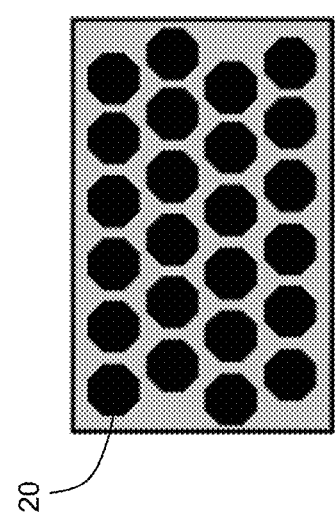
FIGS. 2A and 2B show a top and cross-sectional view, respectively, of an example of a three-dimensional thin-film silicon substrate (TFSS) with prism surface features.

The following description is not to be taken in a limiting sense, but is made for the purpose of describing the general principles of the present disclosure. The scope of the present disclosure should be determined with reference to the claims. And although described with reference to the manufacture of planar thin-film solar cells and three-dimensional thin-film solar cells with pyramidal and prism surface features, a person skilled in the art could apply the principles discussed herein to the manufacture of all structural types of thin-film solar cells.

Although described with reference to specific embodiments, one skilled in the art could apply the principles discussed herein to other areas and/or embodiments. A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials including but not limited to germanium, silicon germanium, silicon carbide, a crystalline compound semiconductor, or a combination thereof. Additional applications include copper indium gallium selenide (CIGS) and cadmium telluride semiconductor thin films.

Further, in this application the term "front" and "back" are used to refer to the position of the metal contacts on the solar cell. A front contact solar cell, or frontside contact, is one which positioned on the solar cell side facing towards the light. A back contact solar cell, or backside contact, is one which is positioned on the solar cell side facing away from the light.

Although the disclosure describes phosphorous ion implantation to form emitters and born implantation to form BSFs for p-type TFSCs, the same principles apply to B implantation to form emitters and P implantation to form BSFs for n-type TFSCs.

Although the disclosure has typically described P and B implantation for n and p doping, respectively, other elements such as As and Sb may be used for n doping, and Al, Ga, In, may be used for p doping.

Those with skill in the arts will recognize that the disclosed embodiments have relevance to a wide variety of areas in addition to those specific examples described below.

The present disclosure describes the use of ion implantation technique in the manufacture of 3-dimensional thin-film crystalline silicon solar cells (TFSC), including those with pyramidal and prism unit cell structures. The present disclosure also describes the use of ion implantation technique in the manufacture of planar thin film crystalline silicon (c-Si) solar cells (TFSC). The present disclosure describes the use of ion implantation to form emitter regions, selective emitter regions, base regions, selective base regions, back surface fields, and front surface fields in a TFSC and the application of ion implantation methods to form the p-n junction for TFSC.

Further, the present disclosure enables the use of ion implantation to independently control the dopant concentration and the emitter depth. The dopant profile control, sometimes referred to as profile engineering of emitters, is used to maximize the solar cell performance including but not limited to blue response, Voc, and current collection.

Figure 1A:
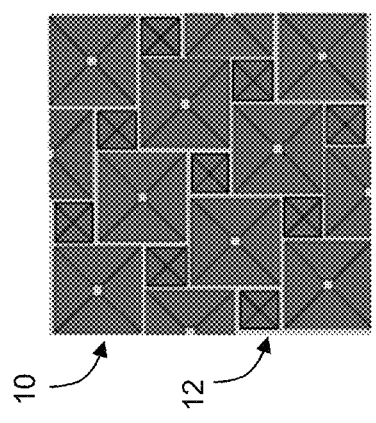
FIGS. 1A and 1B show a top and cross-sectional view, respectively, of an example of a pyramidal three-dimensional thin-film silicon substrate (TFSS)
Figure 1B:
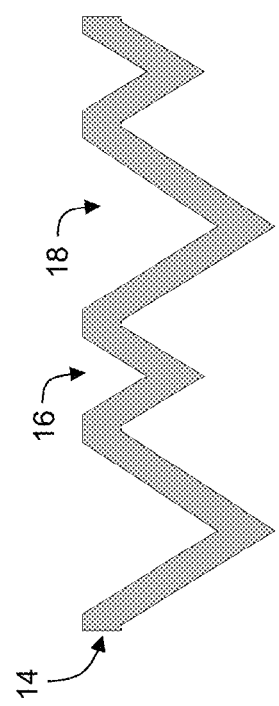

FIGS. 1A and 1B show a top and cross-sectional view, respectively, of an example of a pyramidal three-dimensional thin-film silicon substrate (TFSS), which also may be referred to as a wafer. FIG. 1A is a top view of an embodiment of a pyramidal TFSS comprised of large pyramidal cavities 10 and small pyramidal cavities 12 on a silicon substrate. FIG. 1B is a cross-section of the substrate shown in FIG. 1A, substrate 14, showing small pyramidal cavities 16 and large pyramidal cavities 18. It should be noted that the pyramidal structures may have flat top and bottom regions or may end in an angled apex/tips (as shown in FIG. 1B).

Figure 2B:
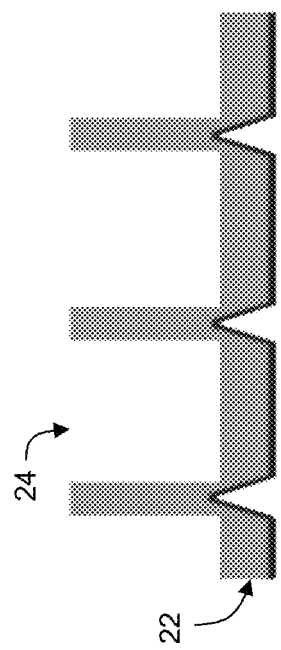

FIGS. 2A and 2B show a top and cross-sectional view, respectively, of an example of a three-dimensional thin-film silicon substrate (TFSS) with prism surface features. FIG. 2A is a top view of an embodiment of a prism TFSS comprised of hexagonal prism structures 20 on a silicon substrate. FIG. 2B is a cross-section of the substrate shown in FIG. 2A, substrate 22, showing hexagonal prism cavities 24.

One method for forming planar or three-dimensional TFSSs involves using an initial thick wafer as a substrate. The substrate may be mono- or multi-crystalline. To obtain a 3-D structure, the substrate surface may be patterned using techniques such as lithography. Next, a porous silicon structure is created on the surface. This is followed by epitaxially depositing the desired thickness of the silicon using techniques such as chemical vapor deposition (CVD). The epitaxial silicon layer is then dislodged from the porous silicon layer by mechanical or chemical means. This results in a wafer with a desired thickness and a planar or 3-D structure. The example thin-film silicon substrates shown in FIGS. 1 and 2 may be formed using this method.

In one embodiment, the present disclosure employs thin film solar cells that have a three-dimensional structure where a desired structural pattern has been formed using MEMS type processing.

Figure 3:
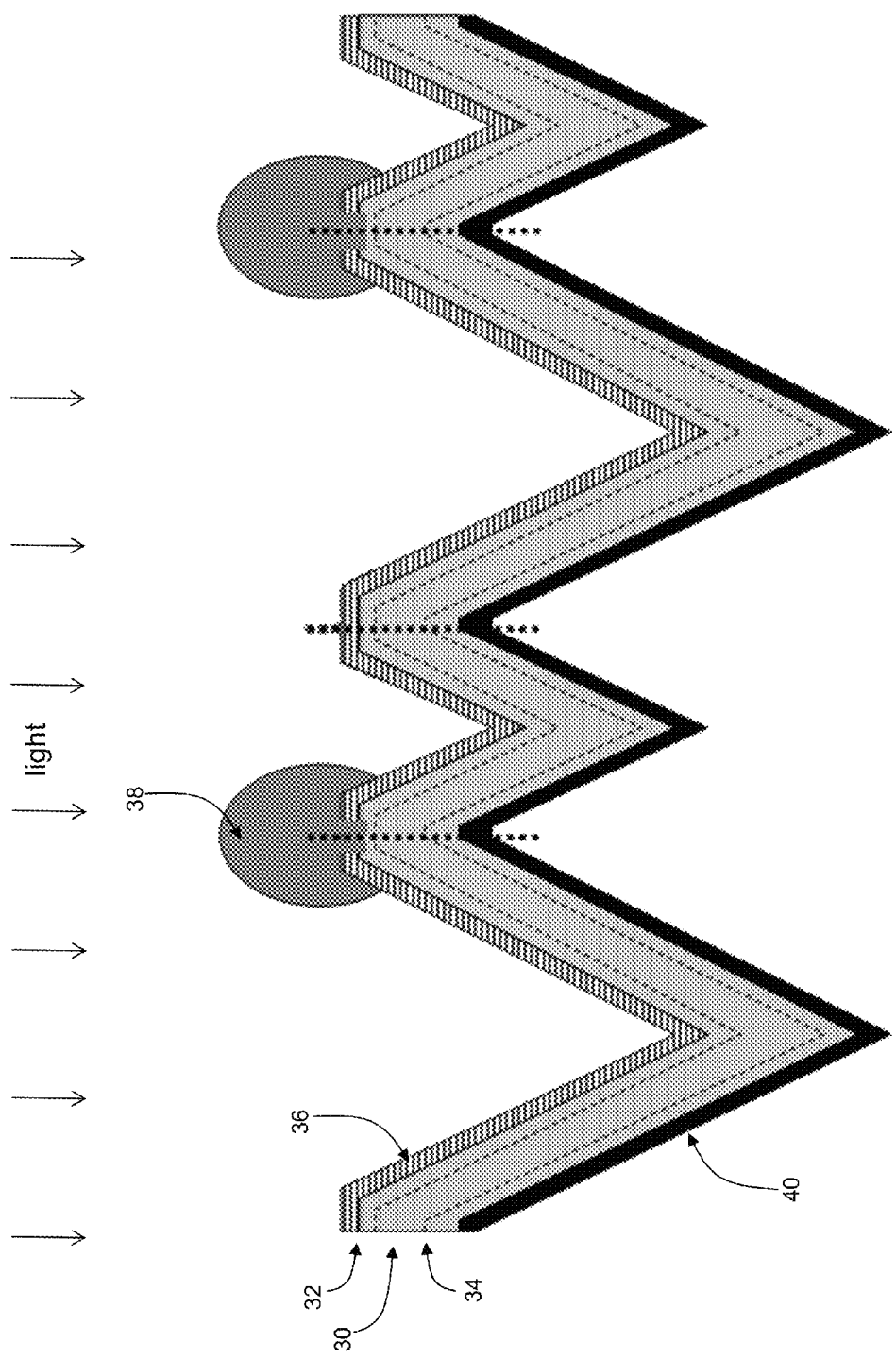
FIG. 3 illustrates a pyramidal three-dimensional thin-film solar cell with a standard configuration of frontside and backside contacts.

FIG. 3 illustrates a pyramidal three-dimensional thin-film solar cell with a standard configuration of frontside (the solar cell side facing the light) and backside contacts positioned on the surface of the cell. P-type (P+) base 30, often an epitaxial silicon layer, has been doped according to an ion implantation process to create N-type (N+) emitter layer 32 and p-type (P++) back surface field 34. Emitter metal 38 and base metal 40 is an electroplated or electroless plated single or multilayer high-conductivity metallized regions (silver, aluminum, nickel, titanium, cobalt, or tantalum)—shown, emitter metal 38 is silver and base metal 40 is aluminum. Alternatively, the metal layer could be inkjet dispensed. Anti-reflection coating 36 may also serve as a frontside passivation layer given a controlled thickness. In this embodiment, the emitter metal contacts are formed in continuous metal lines, i.e. fingers and busbars on the 3-D TFSC top surface. However, because the base metal contacts have been formed on the inverted pyramidal apex regions on the backside of the 3-D TFSS, the base metal contacts are isolated regions.

The following describes the formation of N+ emitter for a p-type base c-Si TFSC material. The same procedures may be used to make P+ emitter for an n-type base c-Si TFSC material. To form an N+ emitter in a p-type silicon TFSC, the dopant species may be P, As, and Sb, while B, Al, Ga, and In may be used to form P+ emitter in an n-type silicon TFSC substrate.

Ion implantation of P and B for forming the emitter in a p-type and n-type silicon, respectively, followed by a suitable annealing treatment, have been shown to yield solar cells with high efficiency. The present disclosure provides a similar P and B ion implantation combined with a suitable annealing treatment to form emitters in thin-film planar and three-dimensional solar cells in p-type or n-type silicon, respectively.

In one embodiment, the ion implantation methods for forming a homogenous emitter layer 32 and back surface field 34 include forming a homogeneous phosphorous doped emitter in the front surface of the substrate by using ion implantation after manufacturing a 3-D thin-film c-Si p- type wafer. The back surface field is created by implanting a P-type dopant such as boron. The cell is then completed using standard passivation and metallization techniques.

Figure 4:
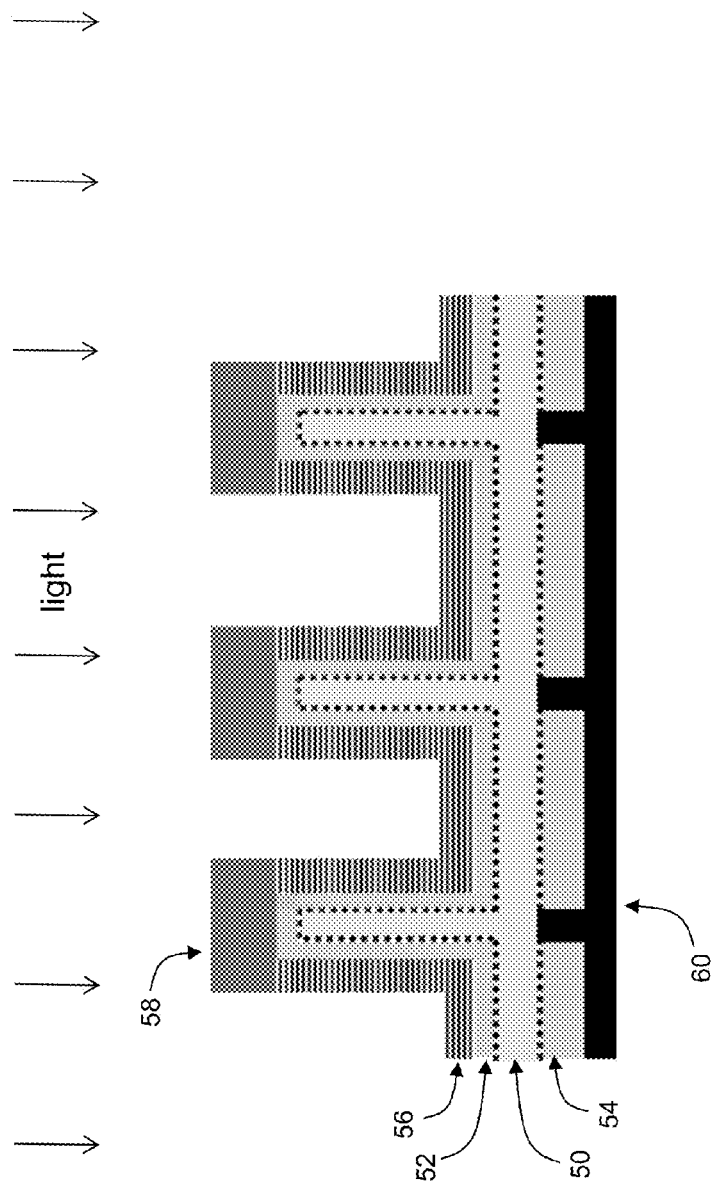
FIG. 4 illustrates a prism three-dimensional thin-film solar cell with a standard configuration of frontside and backside contacts.

FIG. 4 illustrates a prism three-dimensional thin-film solar cell with a standard configuration of frontside (light side) and backside contacts positioned on the surface of the cell. P-type (P+) base 50, often an epitaxial silicon layer, has been doped according to an ion implantation process to create N-type (N+) emitter layer 52. Back surface dielectric 54 acts as a passivation layer. Shown, emitter metal 58 is silver and base metal 60 is aluminum. Anti-reflection coating 56 is an optical coating is an optical coating applied to the surface of the TFSC to reduce reflection.

As in FIG. 3, emitter layer 52 may be created using phosphorous implantation and back surface dielectric 54 may be created using boron implantation. The TFSC depicted in FIG. 4 shows the metal to contact the back surface through a number of localized contacts opened in the back surface dielectric. The contact resistance of these contacts may be lowered using boron implantation. Alternatively, instead of these localized contacts a back surface field may be created using boron implantation.

For homogeneous emitter layers, using blanket implantation control of the dopant profile can provide higher efficiency. To maximize current collection from the solar cell, a good 'blue response' is required. This requires the maximum phosphorous content near the surface to be less than 1E21 cm−3 and the depth of the emitter to be preferably in the range of 0.3 to 0.5 um. Hence, the solar industry is moving to shallow emitters. However, the current industrial emitter formation processes, such as POCl3-based doping or PSG deposition or phosphoric acid spray-on followed by in-line anneal, do not provide the control of the phosphorous concentration and depth independently. The emitter characteristics are solely determined by the temperature and time used for the doping anneal. On the other hand, ion implantation provides the ability to make shallow junctions of desired dopant concentrations by the control of ion dose and energy. The use of the disclosed ion implantation process thus makes it possible to obtain emitters with the desired surface dopant concentration, profile, and depth. Implanted emitters also eliminate the phosphorus dead layer and other complications commonly associated with $POCl_3$-doped emitters.

Figure 5:
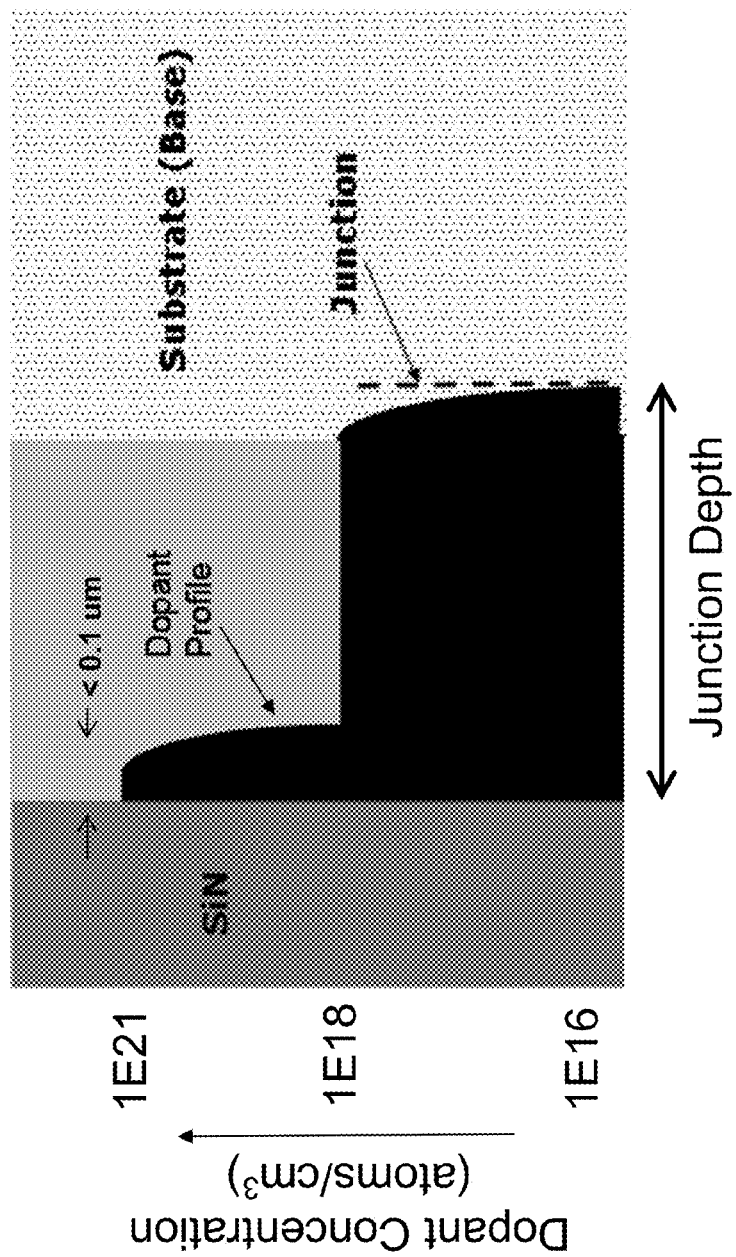
FIG. 5 is a graph representing an idealized dopant profile for homogeneous emitters.

FIG. 5 is a graph representing an idealized dopant profile for homogeneous emitters in dopant concentration (atoms/$cm^3$) over junction depth. Such a precise control of the dopant profile, sometimes referred to as profile engineering, may be only possible using a precision technology such as ion implantation. Shown, a very thin layer (<0.1 um) near the surface of the wafer has a high dopant concentration (up to 1e21/cm3) while the rest of the emitter has a dopant concentration close to 1E18 atoms/cm3.

Alternatively, higher efficiency of solar cells may be obtained using the 'selective emitter' approach. The current standard technique for the formation of selective emitters involves several steps. First, the full front surface of a p-type wafer is lightly doped using the POCl3 based process or a process involving spraying a phosphorous-compound followed by anneal. Then a passivating dielectric is deposited on the front surface. The regions that are desired to be contacted by metal are then selectively opened in this dielectric, either using laser ablation or etch gel. A second doping process is then carried out to selectively dope these localized regions with a high concentration of phosphorous. However, this process is often lengthy and costly.

FIG. 6 shows an ion implantation process for variable doping on pyramidal three-dimensional TFSS 62. Shown, pyramidal three-dimensional TFSS 62 has inverted pyramidal cavity walls aligned along the (111) crystallographic plane—thus θ is about 54.7°. The relative angular orientation of the implanted surface with respect to the incoming ion beam makes it possible to obtain a desired, variable doping by using an ion implantation process for doping the pyramidal three-dimensional TFSS 62. The regions on the 3-D TFSS which have surfaces perpendicular to the incident ion beam are heavily doped, such as Region A, thus, creating a lower sheet resistance junction. However, regions on the 3-D TFSS which receive ions at an angle, such as the (111) inverted pyramidal cavity wall surfaces, shown as Region B, are doped effectively at a lighter dose, thus, creating a higher sheet resistance junction. Since the (111) surface (or any oblique orientation surface) is inclined at angle θ (which is the angle with respect to the flat horizontal surfaces—shown these flat surfaces are aligned along the (100) crystallographic plane making θ about 54.7°), the dopant concentration is reduced to cos θ of the horizontal surface. After the deposition of a passivating dielectric such as SiN:H, only the selectively highly doped ledges of Region A on top of the 3D TFSS (or a fraction of them) are then contacted by metal for emitter contact metallization. This may be carried out by using one the several techniques such: as an Ag paste that etches through the passivating dielectric; by making openings using laser ablation of the passivating dielectric: by removal using etch paste, followed by plating-based and/or PVD metal deposition. Thus, the ion implantation process for variable doping to form selective emitters on the 3-D structure shown facilitates one step selective doping and the formation of dual-doped emitter junctions without a need for a more complex process flow using lithography or screen printing patterning.

FIG. 7 shows an angled ion implantation process on pyramidal three-dimensional TFSS 64. This ion implantation process may be used to selectively dope the regions around the tips/ledges of the three-dimensional surface features (shown as Region A) of TFSS 64. The low doped emitter is first uniformly formed using an implantation direction normal to the plane of the TFSS 64 or by standard industrial techniques. Next, angled ion implantation is used to selectively heavily dope the tips of the structure (Region A in FIG. 7) which are then selectively contacted by the metal.

The present disclosure also describes implantation of B and P ions to produce suitable back surface field (BSF) in thin-film planar and three dimensional solar cells in p-type or n-type silicon, respectively.

The current industrial practice of making the back surface field (BSF) using Al-paste firing and forming the Al—Si alloy to provide the P+ layer has severe limitations. The p/p+ interface is not sharp but is instead diffused—resulting in low reflectivity for minority carrier electrons. The Si/Al—Si interface is also diffused, resulting in low optical reflectivity for long wavelength photons. Additionally, there are manufacturing problems such as the low conductivity of Al paste and the wafer bow resulting from the intimate mixing of the thick paste with silicon wafer. Using the implantation of B ions for p-type substrates (and P for n-type) eliminates these issues. As explained above for emitters, a sharp BSF of a desired profile may be easily obtained using the ion implantation methods of the present disclosure.

To achieve uniform doping of the tip or ledges of the 3-D TFSC, the wafer may be rotated during implantation so that all sides or faces of the structure are uniformly doped.

Similar to the profile engineering disclosed above for the emitter, any desired profile of BSF may be obtained. The structure of 3-D TFSC may be used to obtain selective doping for the BSF. The heavily doped tips are then selectively contacted by a back metal, such as aluminum.

Similar to the case of emitter formation discussed in above, an angled ion implantation of the 3-D TFSC may be also used to obtain selective doping for the BSF. The heavily doped tips are then selectively contacted by back metal.

After the formation of the emitter and BSF, either homogeneously or selectively doped, the implant anneal process may be combined with oxidation to produce high quality front and back passivation of cells.

It is known that the passivation on N+ surfaces is enhanced when the passivating dielectric has extra positive charge. The SiN:H typically used in the solar industry has a surplus positive charge which, when controlled properly, can help provide superior passivation of N+ surfaces. Similarly, the dielectric layer passivating the back surface field may be implanted with a negatively charged ion to further reduce the surface recombination due to the field effect.

The ion implantation methods of the present disclosure may also be used to obtain localized openings in the dielectric layer for metal contacts. For this, the tips or ledges of the 3-D TFSC are selectively implanted with an ion species, such as nitrogen, that retards/slows the growth of oxide during a subsequent thermal oxidation process. During oxidation the passivating oxide grows everywhere except for these high, tip regions which have been selectively implanted. The small amount of SiN formation due the implantation of N is easily removed in a cleaning sequence involving dilute HF followed by phosphoric acid etch. These regions are then selectively contacted by metal. On the front surface the selectively opened regions can be selectively contacted with metal using plating, ink-jet or other techniques. This facilitates the optimization of front metal pattern to improve the cell performance. On the back side these regions can be selectively plated or contacted upon the blanket deposition of aluminum using PVD or evaporation schemes. Such localized contact scheme leads to the well know PERL type of cell structure and with it well known performance benefits.

Figure 8:
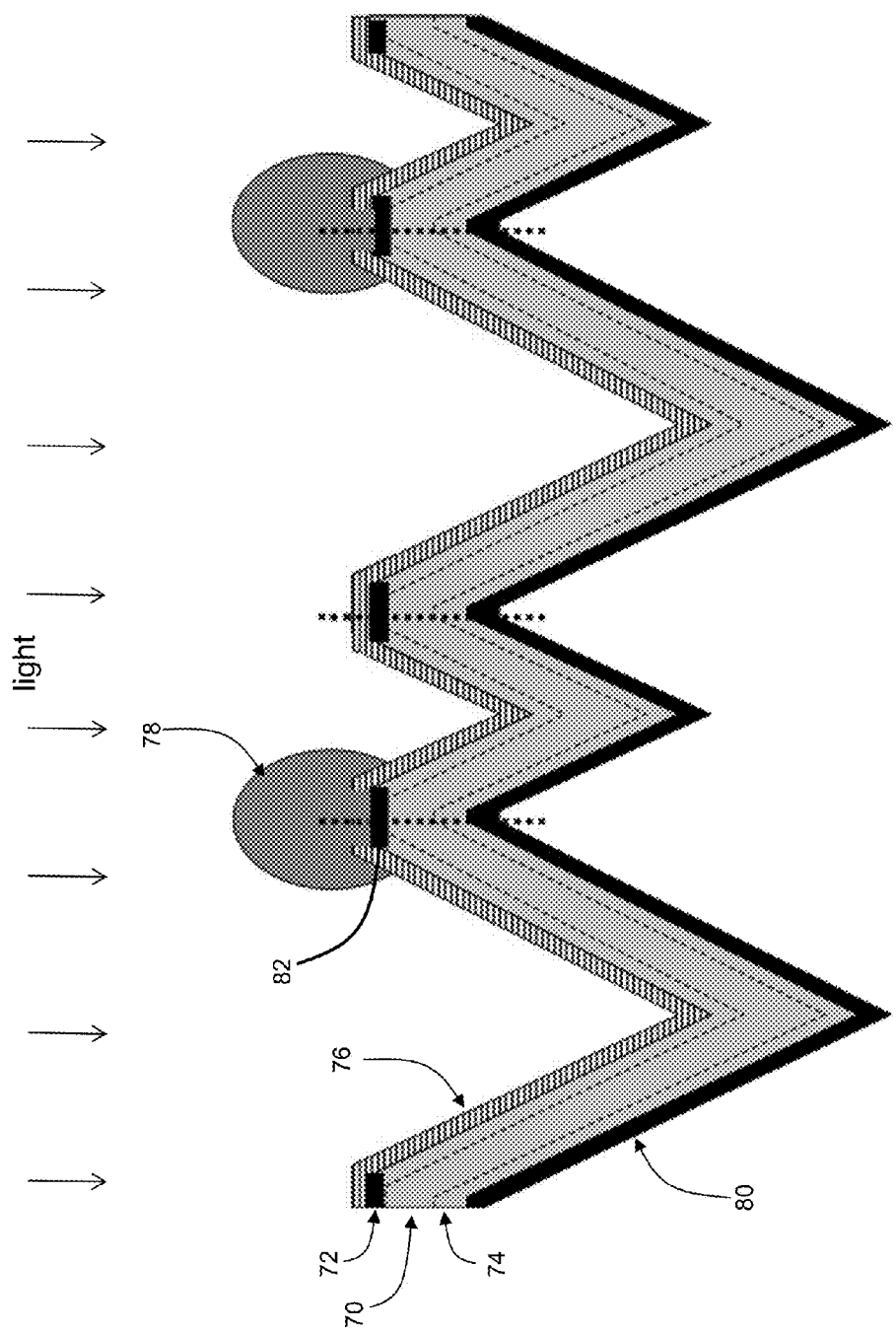
FIG. 8 illustrates a pyramidal three-dimensional thin-film solar cell with selective frontside emitters.

FIG. 8 illustrates a pyramidal three-dimensional thin-film solar cell with selective frontside emitters. P-type (P+) base 70, an epitaxial silicon layer, has been doped according to an ion implantation process to create N-type (N+) emitter layer 72 and p-type (P++) back surface field 74. Selective emitter 82 is formed through an angled ion implantation process. The cell is then completed using standard passivation and metallization techniques to form emitter metal contacts 78 (silver) and base metal contacts 80 (aluminum). Anti-reflection coating 76 is an optical coating is an optical coating applied to the surface of the TFSC to reduce reflection. FIGS. 12A-13D depict a detailed process flow describing the formation of the three-dimensional thin-film solar cell shown in FIG. 8.

Figure 9:
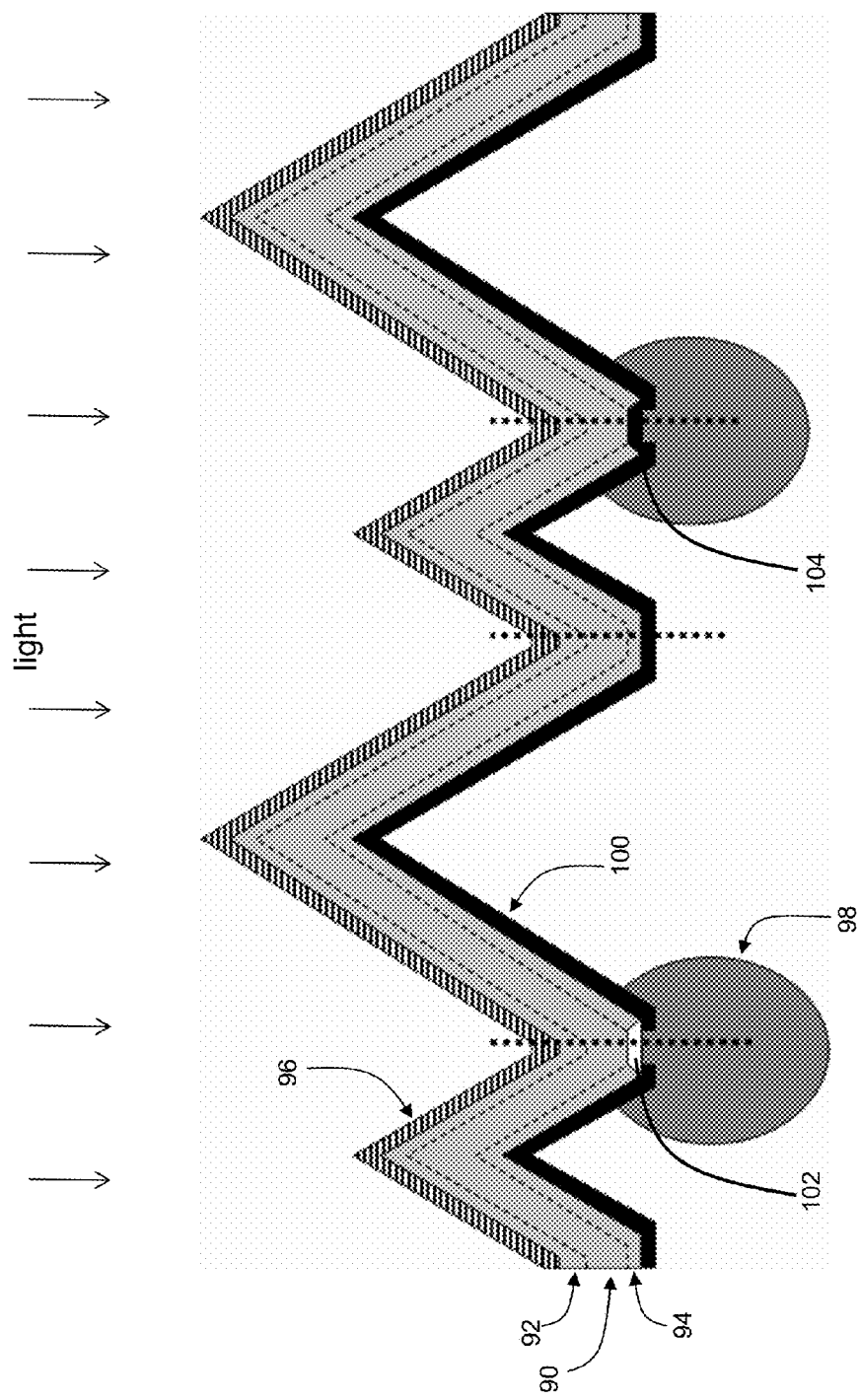
FIG. 9 illustrates a pyramidal three-dimensional thin-film solar cell with all backside contacts.

FIG. 9 illustrates a pyramidal three-dimensional thin-film solar cell with all backside contacts. N-type (N+) base 90, an epitaxial silicon layer, has been doped according to an ion implantation process to create N-type (N+) front side field 92 and p-type (P+) emitter layer 94. Selective emitter 104 and selective base 102 are formed through angled ion implantation processes. The cell is then completed using standard passivation and metallization techniques to form emitter metal 98 (which may be cobalt, copper, or nickel) and passivation dielectric layer 100. Anti-reflection coating 96 is an optical coating is an optical coating applied to the surface of the TFSC to reduce reflection.

Selective emitter 104 is conveniently obtained during the blanket implantation of emitter layer 94. The n-type wafer with a pyramidal 3-D structure is implanted with boron to form emitter layer 94—lower doped on the side walls but highly doped on the flat surface. Front side field 92 is obtained by blanket implantation of phosphorous. FIGS. 14A-15D depict a detailed process flow describing the formation of the three-dimensional thin-film solar cell shown in FIG. 9.

Figure 10:
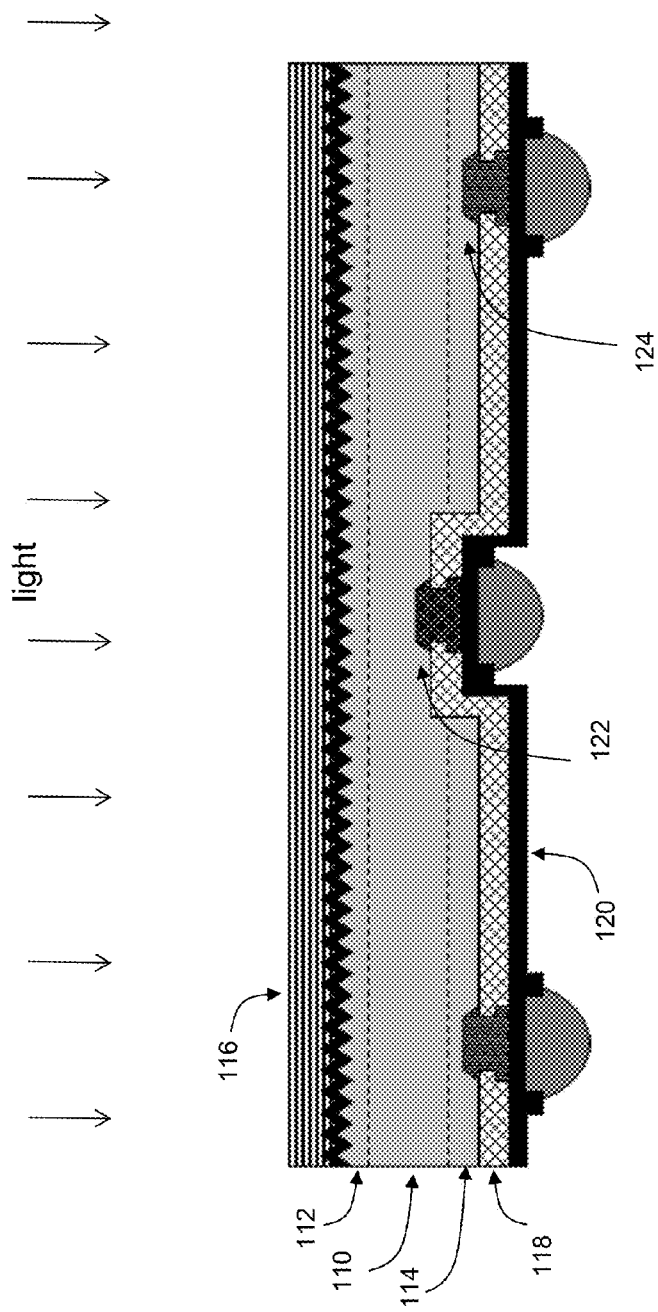
FIG. 10 illustrates a planar thin-film solar cell with all backside contacts.

FIG. 10 illustrates a planar thin-film solar cell with all backside contacts. N-type (N+) base 110, an epitaxial silicon layer, has been doped according to an ion implantation process to create N-type (N+) front side field 112 and p-type (P+) emitter layer 114. Selective emitter 124 and base 122 are formed through angled ion implantation processes and use plated metals, such as nickel and copper, as contacts. The cell is then completed using standard passivation and metallization techniques to form base and emitter contact metals and backside passivation dielectric layer 118. Anti-reflection coating 116 and reflective insulator 120 help to increase the light trapping capabilities of the planar TFSC.

The planar back contact TFSC in FIG. 10 may be made from planar thin-film c-Si wafers. N-type material is advantageous to when forming planar backside TFSC with methods of the present disclosure. P-type (P+) emitter layer 114 is first made using a blanket implantation of the back surface of the wafer with boron. Next, backside passivation dielectric layer 118 is grown or deposited. Base 122 is made by opening contacts in this dielectric and then implanting with phosphorous. Selective emitter 124 is made next by passivating with a dielectric layer and opening contacts and implanting with boron. Front surface field 112 is then obtained using the blanket implantation of phosphorous. FIGS. 16A-16H depict a detailed process flow describing the formation of the planar thin-film solar cell shown in FIG. 10.

FIG. 11A is a process flow showing the formation of a reusable template for forming a crystalline thin-film silicon solar cell (such as that shown in FIGS. 8 and 9). FIG. 11B is a corresponding illustrative depiction of the process steps in FIG. 11A. FIG. 11A is an embodiment of a process flow depicting major fabrication process steps for manufacturing an inverted pyramidal silicon template and three-dimensional thin-film silicon substrate for use in forming a thin-film silicon solar cell in accordance with the ion implantation methods of the present disclosure. In this embodiment, a template for manufacturing inverted pyramidal solar cells is formed.

The silicon template making process starts with a monocrystalline (100) silicon wafer (142). The starting wafer may be in circular or square shapes. Step 160 involves forming a thin hard masking layer (144) on the exposed wafer surfaces. The hard masking layer is used to mask the silicon surface areas that do not need to be etched in the later steps—the surface areas that will become the top surface of the template. The proper hard masking layer includes, but is not limited to, thermally grown silicon oxide and low-pressure vapor phase deposited (LPCVD) silicon nitride. Steps 162 and 164 involve a photolithography step, which consists of photoresist coating, baking, UV light exposure over a photomask, post baking, photoresist developing, wafer cleaning and drying. After this step, the pattern on the photomask (146) depicting an array or a staggered pattern of inverted pyramidal base openings, will be transferred to the photoresist layer. The patterned photoresist layer is used as a soft masking layer for the hard masking layer etching of step 166. Step 166 involves further transferring the photoresist pattern to the hard masking layer layered underneath by chemical etching, such as etching a thin silicon oxide layer with buffered HF solution. Other wet etching methods and dry etching methods as known in semiconductor and MEMS wafer processing may also be used. In step 168 the remaining soft masking layer, i.e. the photoresist layer (150), is removed and the wafer (148) is cleaned. Examples of photoresist removal process include wet methods, such as using acetone or piranha solution (a mixture of sulfuric acid and hydrogen peroxide), or dry methods such as oxygen plasma ashing. Also in step 168 the wafers are batch loaded in an anisotropic silicon wet etchant such as KOH solution. The typical etch temperature is in the range of 50° C. to 80° C. and etch rate is about 0.2 um/min to 1 um/min. TMAH (tetramethylammonium hydroxide) is an alternative anisotropic silicon etching chemical. The KOH or TMAH silicon etch rate depends upon the orientations to crystalline silicon planes. The (111) family of crystallographic planes are etched at a very slow rate and are normally "stop" planes for the anisotropic etching of a (100) silicon wafer with patterned hard mask. As a result, the intersection of two (111) planes or a (111) plane with a bottom (100) plane produce anisotropic etching structures for (100) silicon wafers after a time-controlled etch. Examples of these structures include V-grooves and pyramidal cavities with sharp tip cavity bottom (where (111) planes meet) or a small flat cavity bottom (a remaining (100) plane). In step 170, silicon template 154 is ready for processing.

Figures 12A, 12B:
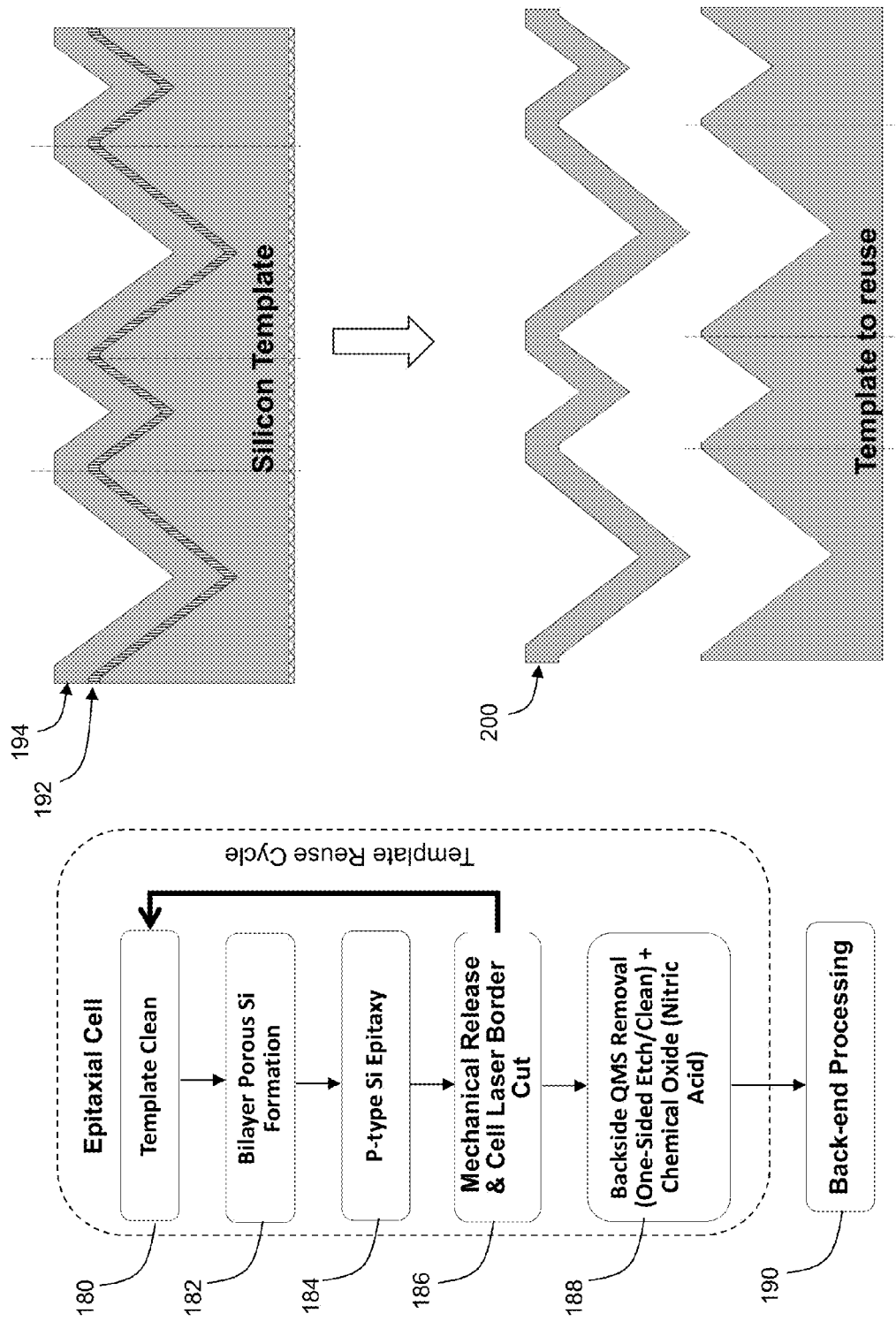

FIG. 12A is a process flow showing the formation of a epitaxial silicon cell used for forming a crystalline thin-film front contact silicon solar cell (such as that shown in FIG. 8). FIG. 12B is a corresponding illustrative depiction of the process steps in FIG. 12A.

In step 180 the remaining hard masking layer is removed, by HF solution in the case the hard masking layer is silicon dioxide. Next, the wafer may be cleaned in standard SC1 (mixture of $NH_4OH$ and $H_2O_2$) and SC2 (mixture of HCL and $H_2O_2$) wafer wet cleaning solutions followed by a thorough deionized wafer rinsing and hot $N_2$ drying. The disclosed process results in a silicon template with inverted pyramidal cavities.

Step 180 marks the beginning of a silicon template re-use cycle. In step 182, a porous silicon layer (192) is formed by electrochemical HF etching on the silicon template front surfaces. The porous silicon layer is to be used as a sacrificial layer for epitaxial silicon layer release. The porous silicon layer preferably consists of two thin layers with different porosities. The first thin porous silicon layer is a top layer and is formed first from the bulk silicon wafer. The first thin layer preferably has a lower porosity of 10%~35%. The second thin porous silicon layer is directly grown from the bulk silicon and is underneath the first thin layer of porous silicon. The $2^{nd}$ thin porous silicon layer preferably has a higher porosity in the range of 40%~80%. The top porous silicon layer is used as a crystalline seed layer for high quality epitaxial silicon growth and the bottom underneath higher porosity porous silicon layer is used for facilitating TFSS release due to its less dense physical connections between the epitaxial and bulk silicon interfaces and its weak mechanical strength. Alternatively, a single porous silicon layer with a progressively increased or graded porosity from top to bottom may also be used. In this case, the top portion of the porous silicon layer has a low porosity of 10% to 35% and the lower portion of the porous silicon layer has a high porosity of 40% to 80%. Before step 184, the epitaxial silicon growth, the wafer may be baked in a high temperature (at 950° C. to 1150° C.) hydrogen environment within the epitaxial silicon deposition reactor in order to form coalesced structures with relatively large voids within the higher-porosity porous silicon layer (or portion of a single layer) while forming a continuous surface seed layer of crystalline silicon on the lower-porosity porous silicon layer (or portion of a single layer). In step 184, a mono-crystalline silicon epitaxial layer with n-type base (194) is deposited on the front side only. The bulk base of the epitaxial layer is p-type, boron ($B_2H_6$) doped. The thickness of the epitaxial layer is preferably in the range of 5 um to 60 um. Prior to the release of the epitaxial silicon layer, an encompassing border trench may be made on the peripheral of the active wafer area to facilitate the release of the TFSS. The encompassing trenches may be formed by controlled laser cutting and their depths are preferably in the range of 5 um to 100 um. The trenches define the boundary of the 3-D TFSS to be released and allow initiation of the release from the trenched region. The remaining epitaxial silicon layer may be removed by mechanical grinding or polishing of the template edges. In step 186, the epitaxial layer of silicon (200) is released and separated from the silicon template. The released epitaxial silicon layer is referred to as a 3-D thin film silicon substrate (3-D TFSS). The epitaxial layer release methods disclosed in U.S. patent application Ser. No. 12/473, 811 entitled, SUBSTRATE RELEASE METHODS AND APPARATUS are hereby incorporated by reference. The 3-D TFSS may be released in an ultrasonic DI-water bath. Or in another release method, the 3-D TFSS may be released by direct pulling with wafer backside and top epitaxial vacuum chucked. In another release method, the epitaxial layer is released by direct pulling with wafer backside and top epitaxial vacuum chucked. Using this method the porous silicon layer may be fully or partially fractured. The chucks may use either electrostatic or vacuum chucking to secure the wafer. The wafer is first placed on bottom wafer chuck with TFSS substrate facing upwards. A bottom chuck secures the template side of wafer, and the top wafer chuck is gently lowered and secures TFSS substrate side of the wafer. The activated pulling mechanism lifts top chuck upwards, and the movement may be guided evenly by slider rails.

In step 188, the released 3-D TFSS backside surface is cleaned by short silicon etching using KOH or TMAH solutions to remove the silicon debris and fully or partially remove the quasi-mono-crystalline silicon (QMS) layer. After removal of the epitaxial silicon layer from the template, the template is cleaned in step 175 by using diluted HF and diluted wet silicon etch solution, such as TMAH and/or KOH to remove the remaining porous silicon layers and silicon particles. Then the template is further cleaned by conventional silicon wafer cleaning methods, such as SC1 and SC2 wet cleaning to removal possible organic and metallic contaminations. Finally, after proper rinsing with DI water and $N_2$ drying, the template is ready for another re-use cycle.

Figures 13A, 13B:
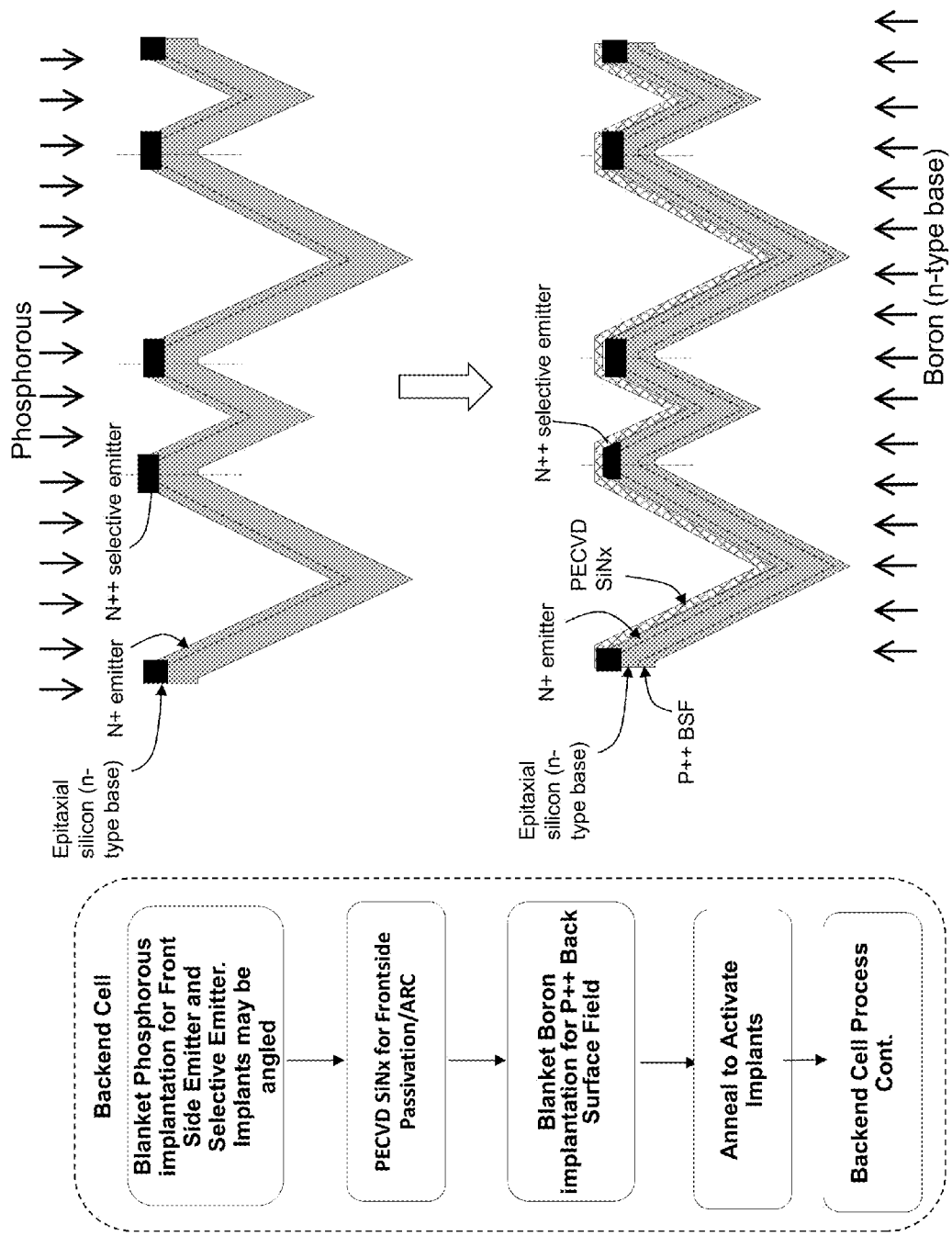

FIG. 13A is a process flow showing the formation of a front contact crystalline thin-film silicon solar cell (such as that shown in FIG. 8). FIG. 13B is a corresponding illustrative depiction of the process steps in FIG. 13A.

FIG. 13C is a continuation of the process flow in FIG. 13A showing the formation of a front contact crystalline thin-film silicon solar cell (such as that shown in FIG. 8). FIG. 13D is a corresponding illustrative depiction of the process steps in FIG. 13C.

Figure 14B:
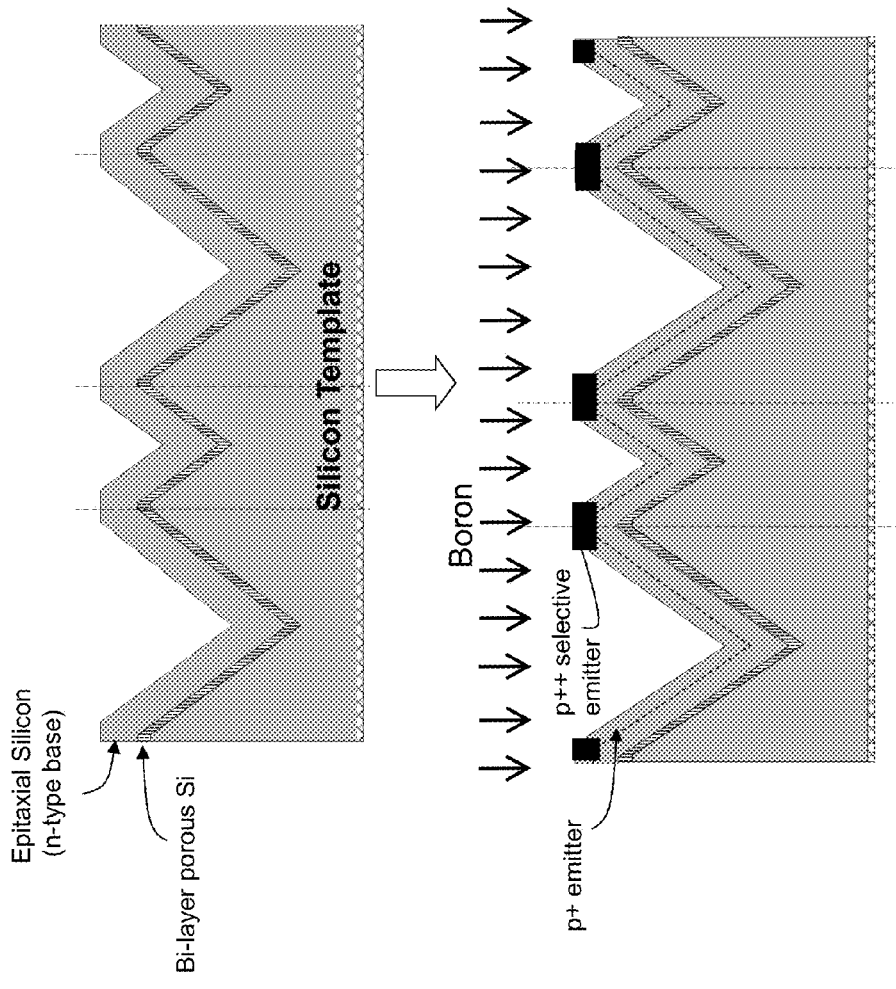
FIGS. 14A through 15D show the process flow for the formation of a back contact crystalline thin-film silicon solar cell in accordance with the disclosed subject matter.
Figure 14A:
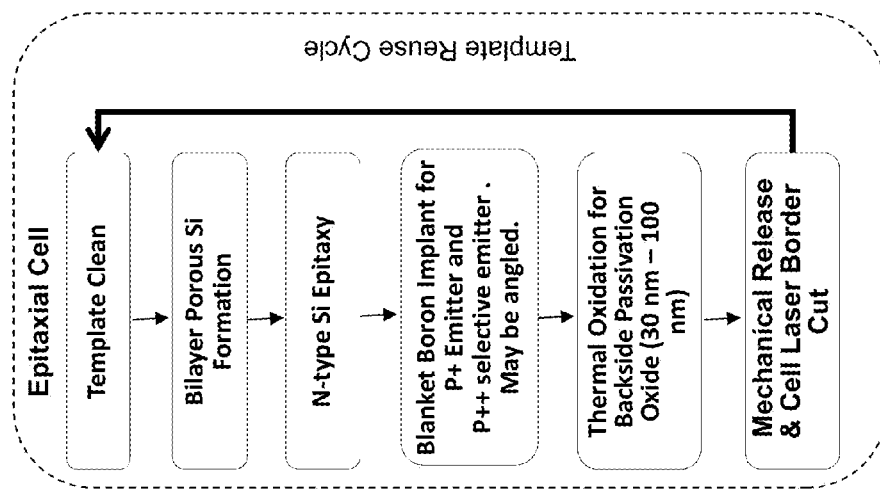

FIG. 14A is a process flow showing the formation of a epitaxial silicon cell used for forming a back contact crystalline thin-film silicon solar cell (such as that shown in FIG. 9). FIG. 14B is a corresponding illustrative depiction of the process steps in FIG. 14A.

Figure 14D:
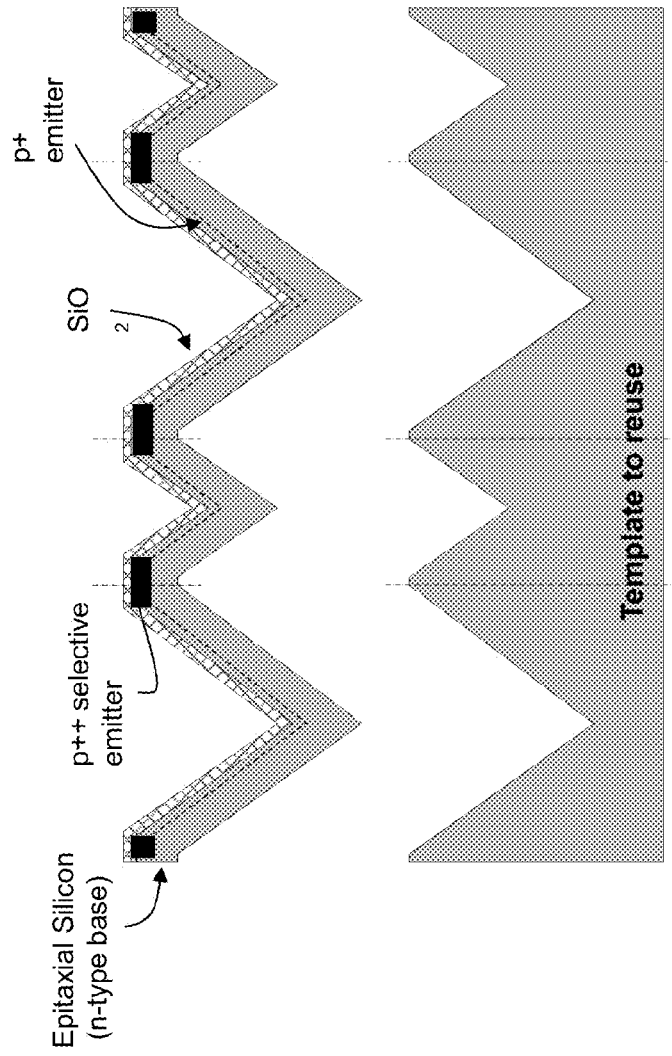
Figure 14C:
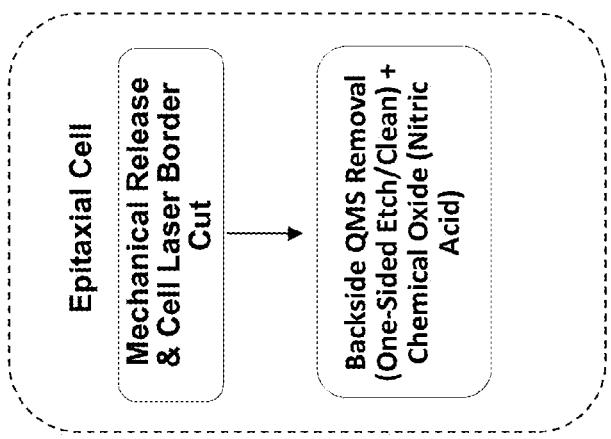

FIG. 14C is a continuation of the process flow in FIG. 14A showing the formation of a epitaxial silicon cell used for forming a back contact crystalline thin-film silicon solar cell (such as that shown in FIG. 9). FIG. 14D is a corresponding illustrative depiction of the process steps in FIG. 14C.

Figure 15B:
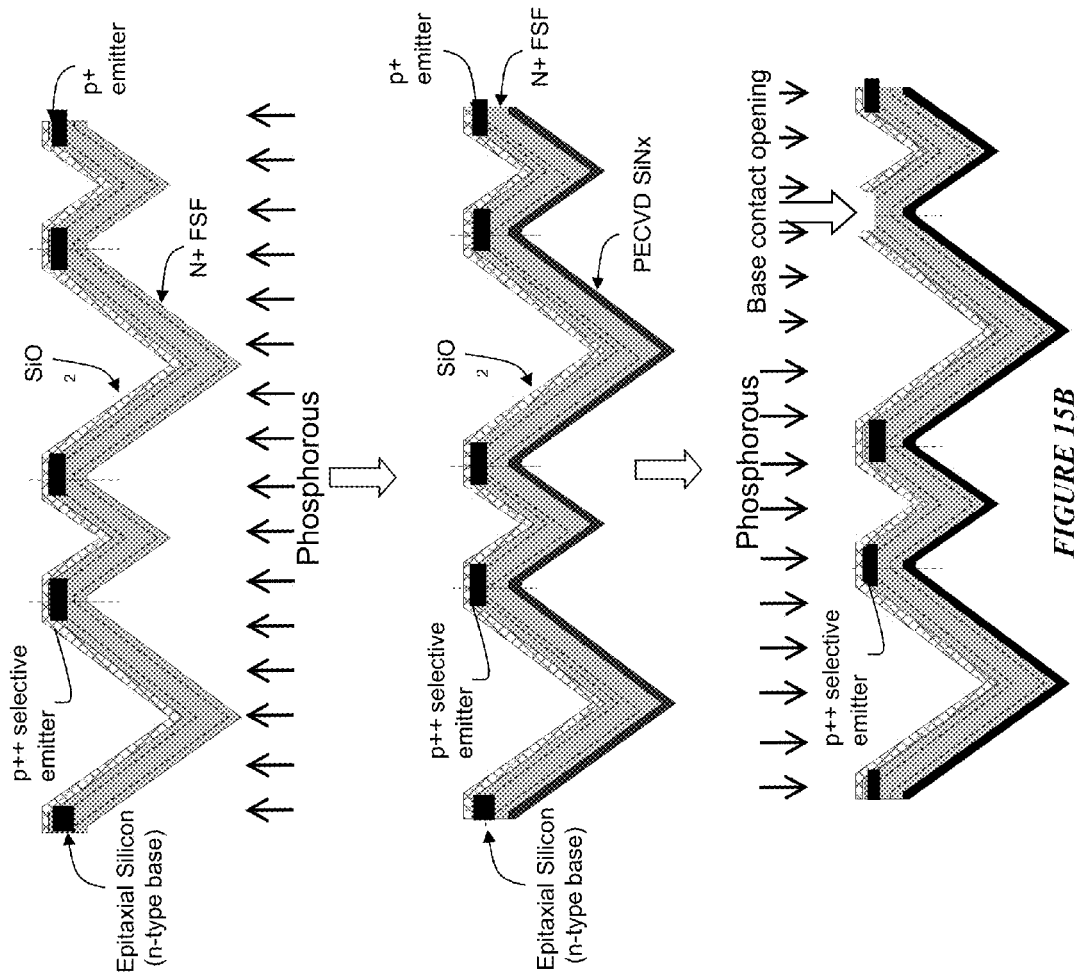
Figure 15A:
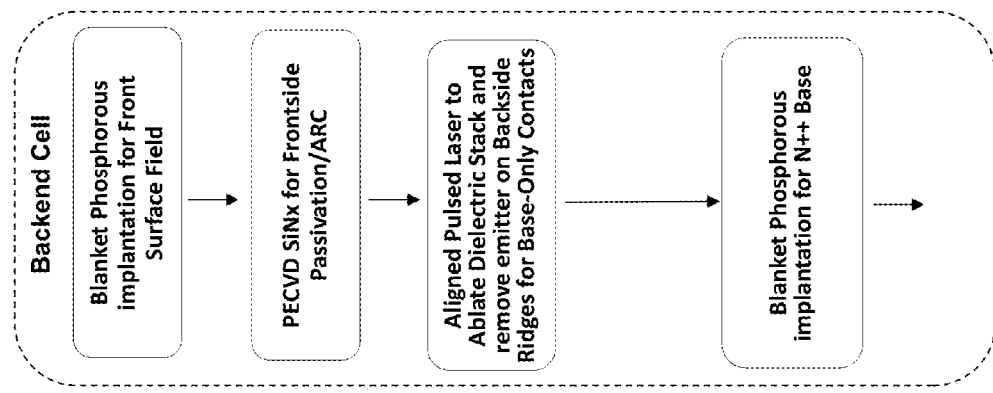

FIG. 15A is a process flow showing the formation of a back contact crystalline thin-film silicon solar cell (such as that shown in FIG. 9). FIG. 15B is a corresponding illustrative depiction of the process steps in FIG. 15A.

FIG. 15C is a continuation of the process flow in FIG. 15A showing the formation of a back contact crystalline thin-film silicon solar cell (such as that shown in FIG. 9). FIG. 15D is a corresponding illustrative depiction of the process steps in FIG. 15C.

FIG. 16A is a process flow showing the formation of a planar back contact crystalline thin-film silicon solar cell (such as that shown in FIG. 10). FIG. 16B is a corresponding illustrative depiction of the process steps in FIG. 16A.

FIG. 16C is a continuation of the process flow in FIG. 16A showing the formation of a planar back contact crystalline thin-film silicon solar cell (such as that shown in FIG. 10). FIG. 16D is a corresponding illustrative depiction of the process steps in FIG. 16C.

FIG. 16E is a continuation of the process flow in FIG. 16A showing the formation of a planar back contact crystalline thin-film silicon solar cell (such as that shown in FIG. 10). FIG. 16F is a corresponding illustrative depiction of the process steps in FIG. 16E.

Figures 16G, 16H:
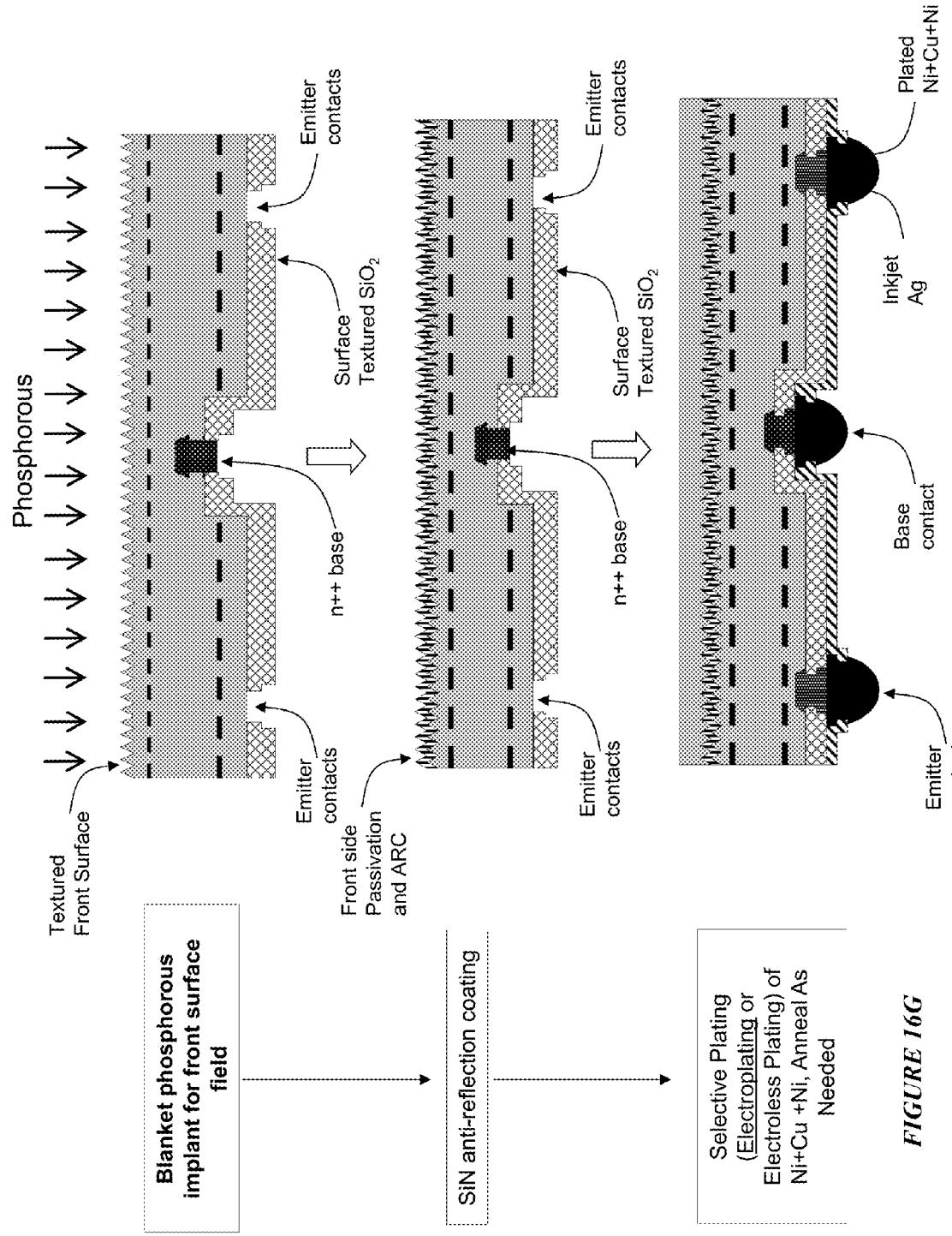

FIG. 16G is a continuation of the process flow in FIG. 16A showing the formation of a planar back contact crystalline thin-film silicon solar cell (such as that shown in FIG. 10). FIG. 16H is a corresponding illustrative depiction of the process steps in FIG. 16G.

In operation, the disclosed subject matter provides ion implantation methods for forming emitter regions, selective emitter regions, front surface fields, back surface fields, and base regions for the formation of crystalline thin-film silicon solar cells.

The following disclosure more directly relates to the present application and further discloses a unique structure and manufacturing method for all a back-contact, back-junction crystalline (preferably monocrystalline) semiconductor (including but not limited to silicon) solar cells using laser annealing along with ion implantation. Importantly, the ranges disclosed are for exemplary purposes only. Together, the use of laser and ion implantation technologies provides for a simpler cell fabrication process flow that enables low-temperature passivation layer formation, minimizes electrical shading, and results in a high open circuit voltage (Voc), short circuit current (Jsc), thus leading to a higher solar cell efficiency. Herein, the formation of localized, isolated base regions for p/n junction and front surface field (FSF) to improve minority carrier lifetime, using ion implantation followed by laser annealing, is disclosed. These techniques are highly suited to forming high-efficiency back-contact back-junction solar cells using thin crystalline silicon films obtained using epitaxial silicon deposition, or other techniques known in the industry, that may have any thickness in the silicon thickness range of from a few microns up to 100 microns (and more preferably in the range of about 5 microns to 50 microns). Furthermore, these techniques are particularly suited to solar cells that for various reasons, including but not limited to the thin cell lamination with a reinforcement plate, cannot be heated to high temperatures during part of their fabrication process, particularly during the formation of a surface passivation and anti-reflection coating layer.

Processes for back contacted cells with interdigitated metallization, herein called a NBLAC cell, have been described in PCT applications such as P.C.T. App. Nos. PCT/US10/59783, PCT/US10/59759, and PCT/US10/59748 by inventors Mehrdad Moslehi, et al. and filed Dec. 9, 2010.

Figure 17:
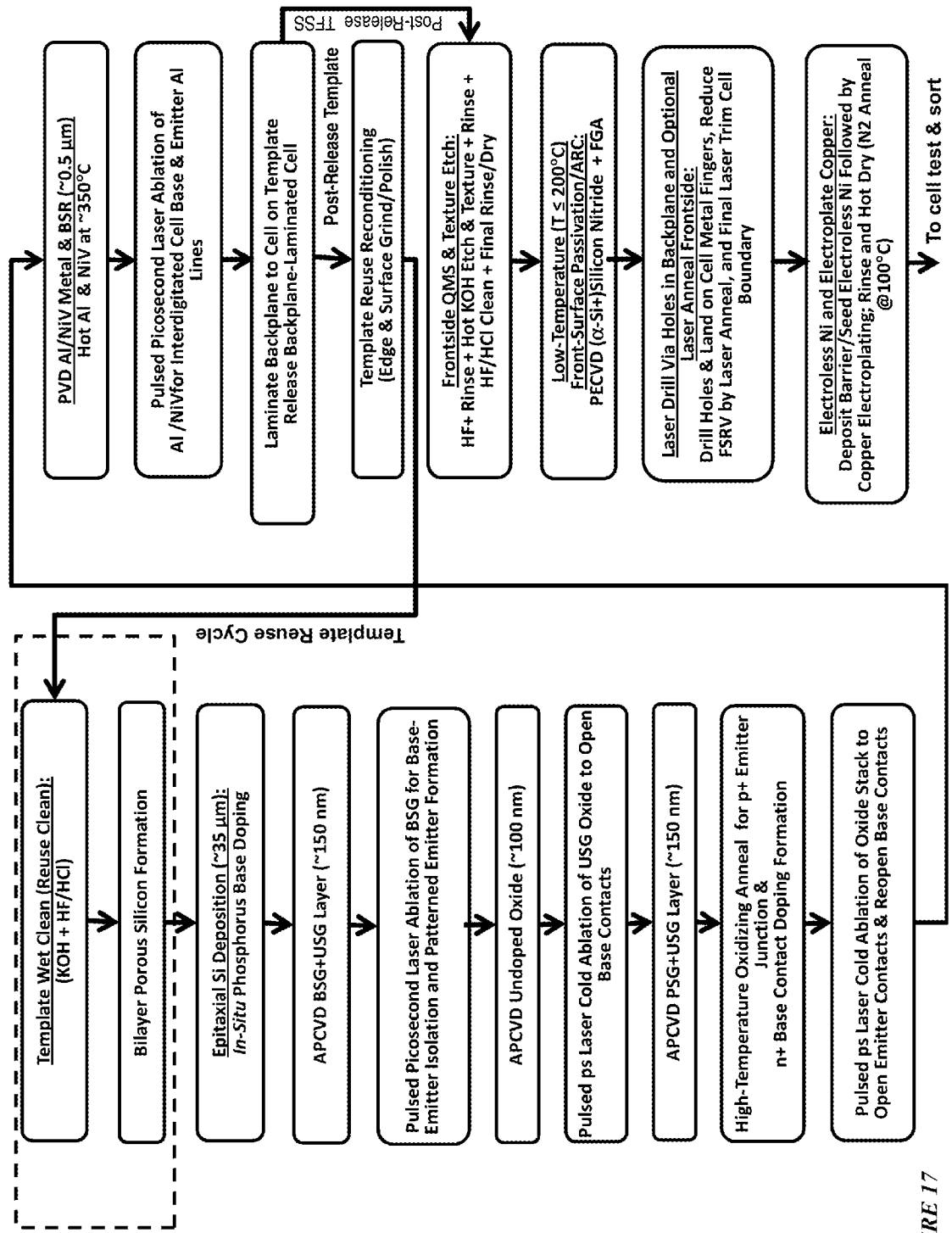
FIG. 17 is a process flow for commercially manufacturing an all back contact back-junction solar cell using planar thin films.

FIG. 17 is a process flow for commercially manufacturing an all back contact back-junction solar cell using planar thin films (e.g., monocrystalline silicon film thickness of from a few microns to about 100 microns) of crystalline silicon epitaxially deposited on reusable crystalline silicon templates. After cell formation, the thin silicon films are supported on backplanes that connect the solar cell to interconnects in the module.

Figure 18:
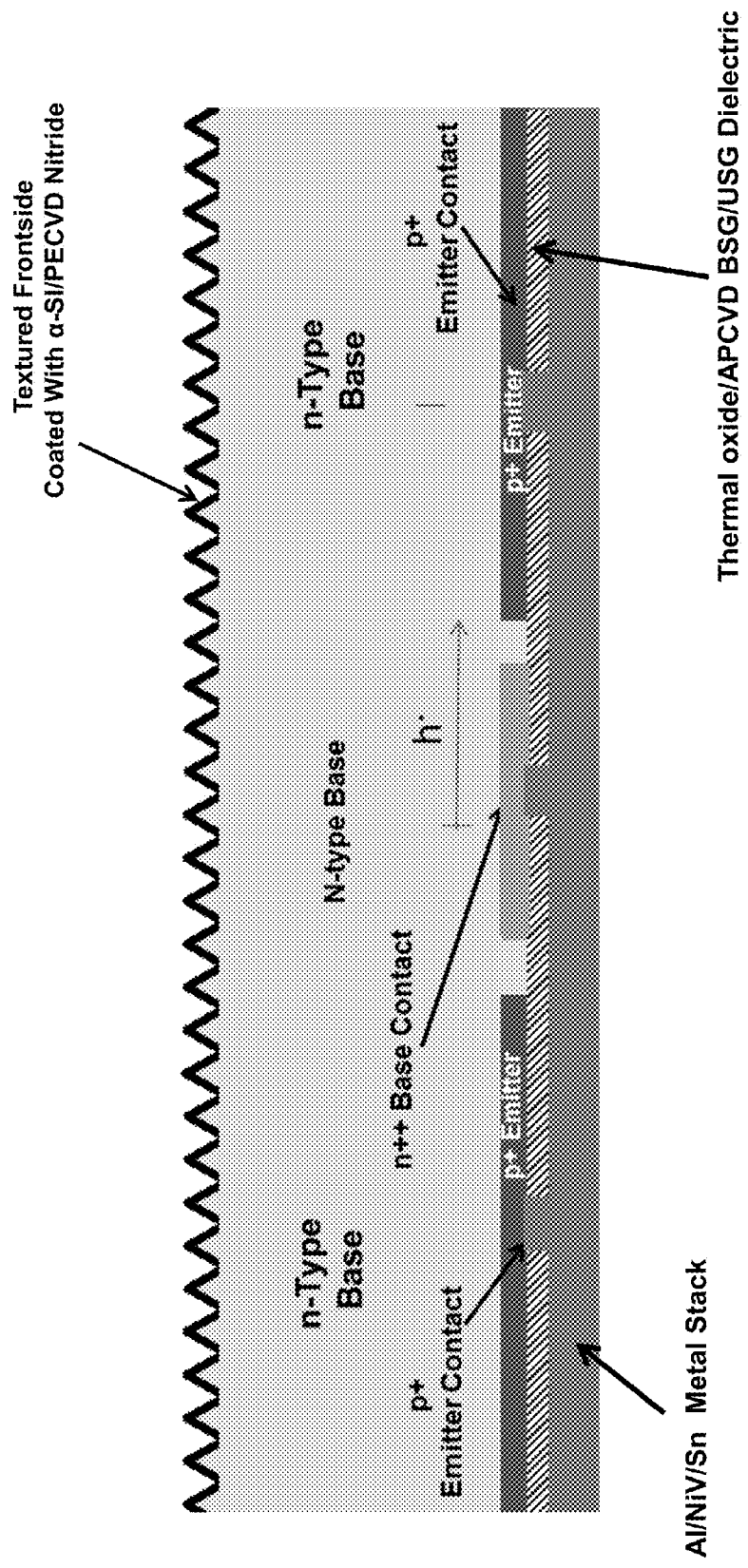
FIG. 18 is a cross section of a back contact/back junction solar cell structure.

FIG. 18 is a cross section of a back contact/back junction solar cell structure such as that formed by the process described in FIG. 17, where the backplane is not shown for clarity. As can be seen, the all back-contact back-junction solar cells have the alternating emitter and base regions on the same side (non-sunnyside or backside) in the silicon substrate that are contacted separately to interdigitated metal lines using contact openings in the dielectric overlying the silicon substrate and underneath the metal. The efficiency of these cells is critically dependent on the dimensions of the base regions with smaller dimensions leading to higher efficiency. In traditional all back-contact/back-junction solar cells, the n and p regions form alternate stripes. The minority charge carriers, holes in case of n-type base, have to traverse across the base region where there can be heavy recombination, as shown in FIG. 18, where h. denotes holes, the minority charge carriers. This phenomenon is termed electrical shading. Hence, reducing the width of the base region reduces the electrical shading, which reduces the recombination of these minority charge carriers and increases the solar cell efficiency. If areas of the base regions could be reduced to the bare minimum needed, the electrical shading will be reduced to the bare minimum and efficiency of the solar cell will be maximized. The use of pulsed laser ablation enables formation of small features, thereby forming the base stripes of very small width. The laser ablation technique can be further extended to form isolated islands of base regions that reduce the electrical shading to a minimum. The application of laser processing in solar cell manufacturing has been disclosed, in U.S. Patent Pub. No. 2012/0028399 by Virendra V. Rana and filed May 27, 2011 for example, which is herein incorporated by reference in its entirety.

Ion implantation process involves implantation of ions of dopant element in the silicon substrates. Ions of phosphorous (P), arsenic (As), and antimony (Sb), are implanted to form n-type silicon regions, while boron (B), aluminum (Al), Gallium (Ga), and Indium (In), are used to form p-type silicon regions. The most commonly used ions are P and As for n-type, and B for p-type doping of silicon. Advantages of using ion implantation are the ability to control the concentration and the depth of implanted ions by controlling the ion implantation dose and energy. Also, the implanted ions may be placed in silicon in any desired concentration profile (for instance, by a combination of multiple implants at different dose and energy levels). This technique is a non-contact, dry technique. Since the ion implantation is performed essentially at room temperature, this technique is suitable for solar cells that, for various reasons, cannot be heated to high temperatures after the ion implantation process step.

For implanted ions to produce the desired doping of crystalline silicon, they need to be activated. Although, the typical technique used in the industry is furnace heating or rapid thermal heating, these techniques are not suitable for cases where the solar cell or the assembly cannot be heated to a high temperature (for instance to a temperature much above 200° C.) after the ion implantation process. On the other hand, pulsed laser annealing may be highly localized (spatially selective on the laser-irradiated surface) and the irradiated surface may be heated to a relatively high temperature (sufficiently high to electrically activate the implanted dopant atoms, for instance, the irradiated surface temperature selectively raised to a temperature in the range of 750° C. to up to near silicon melt temperature) while keeping the cell back surface relatively cooler (for instance, limiting the back-surface temperature to no more than 200° C.). In addition, pulsed laser annealing using fast pulses, because of its extremely rapid heating and cooling rates and negligible heat diffusion into the substrate away from the irradiated surface, is ideally suited to producing the sharp dopant gradients where the dopant atoms are not moved (and the bulk substrate below the irradiated surface is not significantly heated) while being electrically activated. The application of laser annealing to improve passivation of surface coated with SiN, α-SI/SiN, or other suitable dielectrics, have been disclosed (see U.S. patent application Ser. No. 13/303,488 by Mehrdad Moslehi and filed Nov. 23, 2011 and U.S. patent application Ser. No. 13/477,088 by Virendra V. Rana and filed May 21, 2012 both of which are herein incorporated by reference in their entirety).

For fragile thin crystalline silicon films, suitable thin-substrate support and non-contact substrate processing techniques may be preferred in order to maintain high manufacturing yield. Both ion implantation and pulsed laser annealing satisfy this requirement. Also, because of considerable recent developments, these techniques now provide high throughput and may be tailored to larger cell sizes of any geometrical shape.

Figure 19:
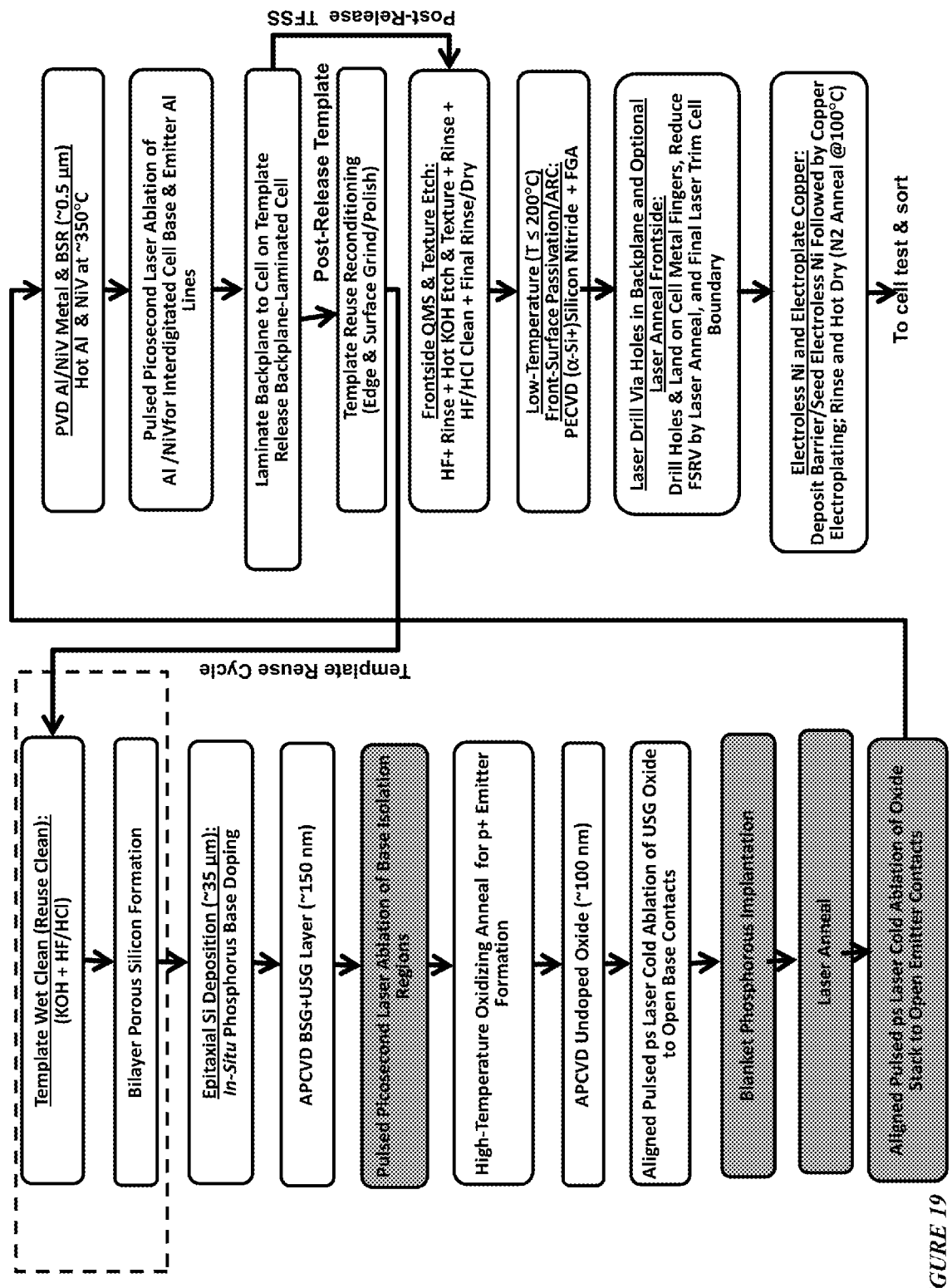
FIG. 19 is a modified process flow for the formation of islands (discrete) of isolated base contacts.
Figure 20:
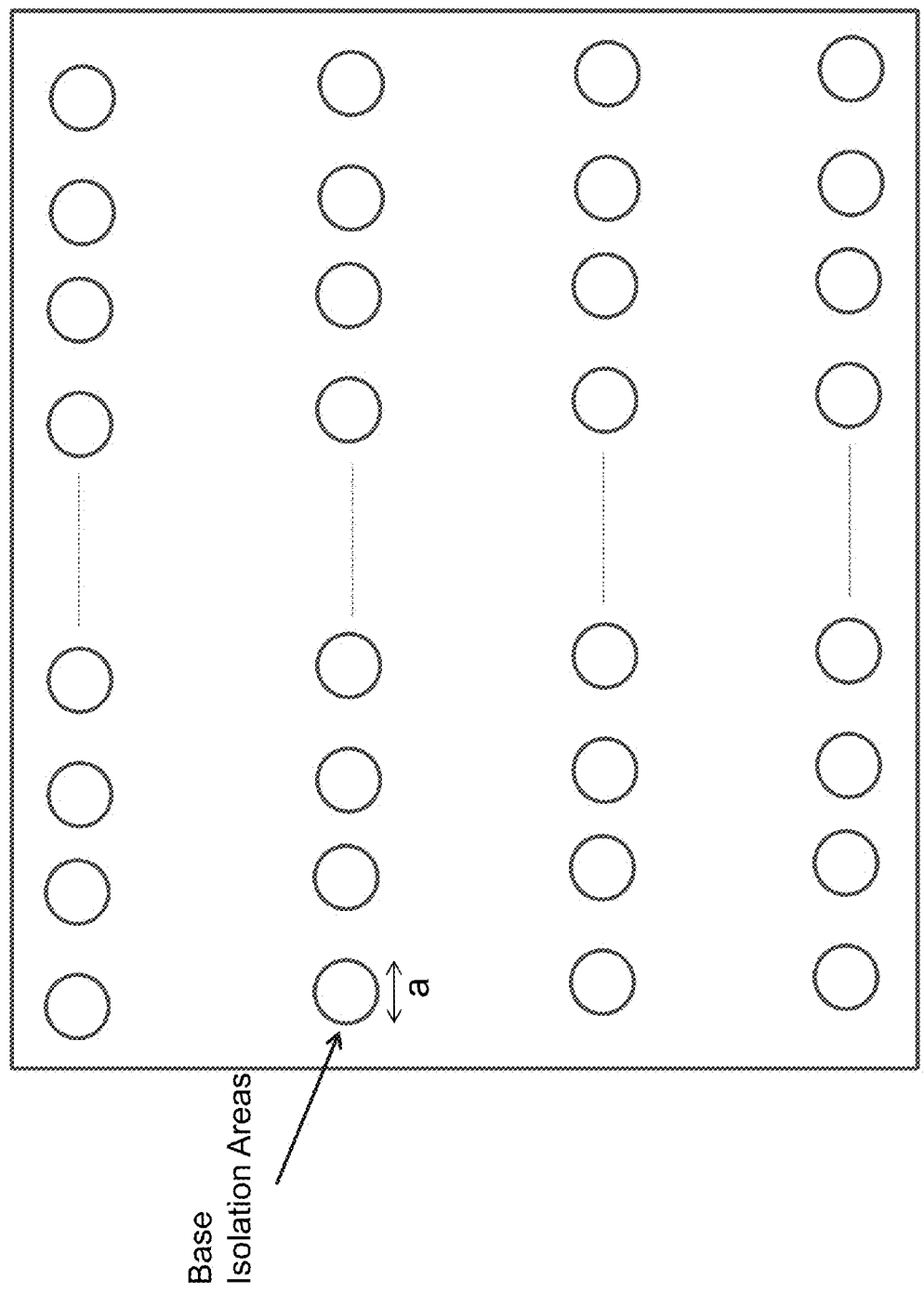
FIGS. 20 to 24 are diagrams of a solar cell after key fabrication steps of FIG. 19.
Figure 21:
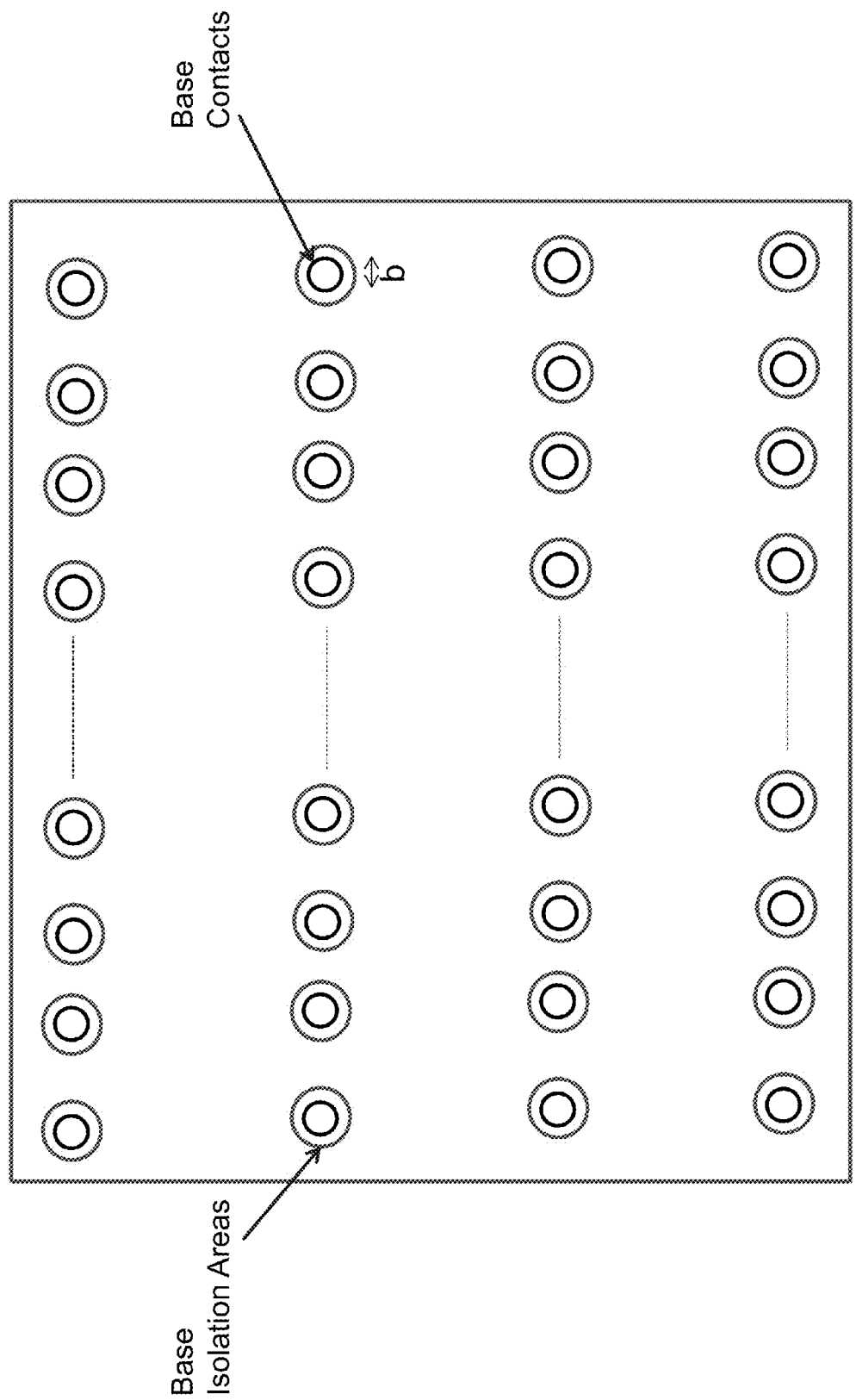
Figure 22:
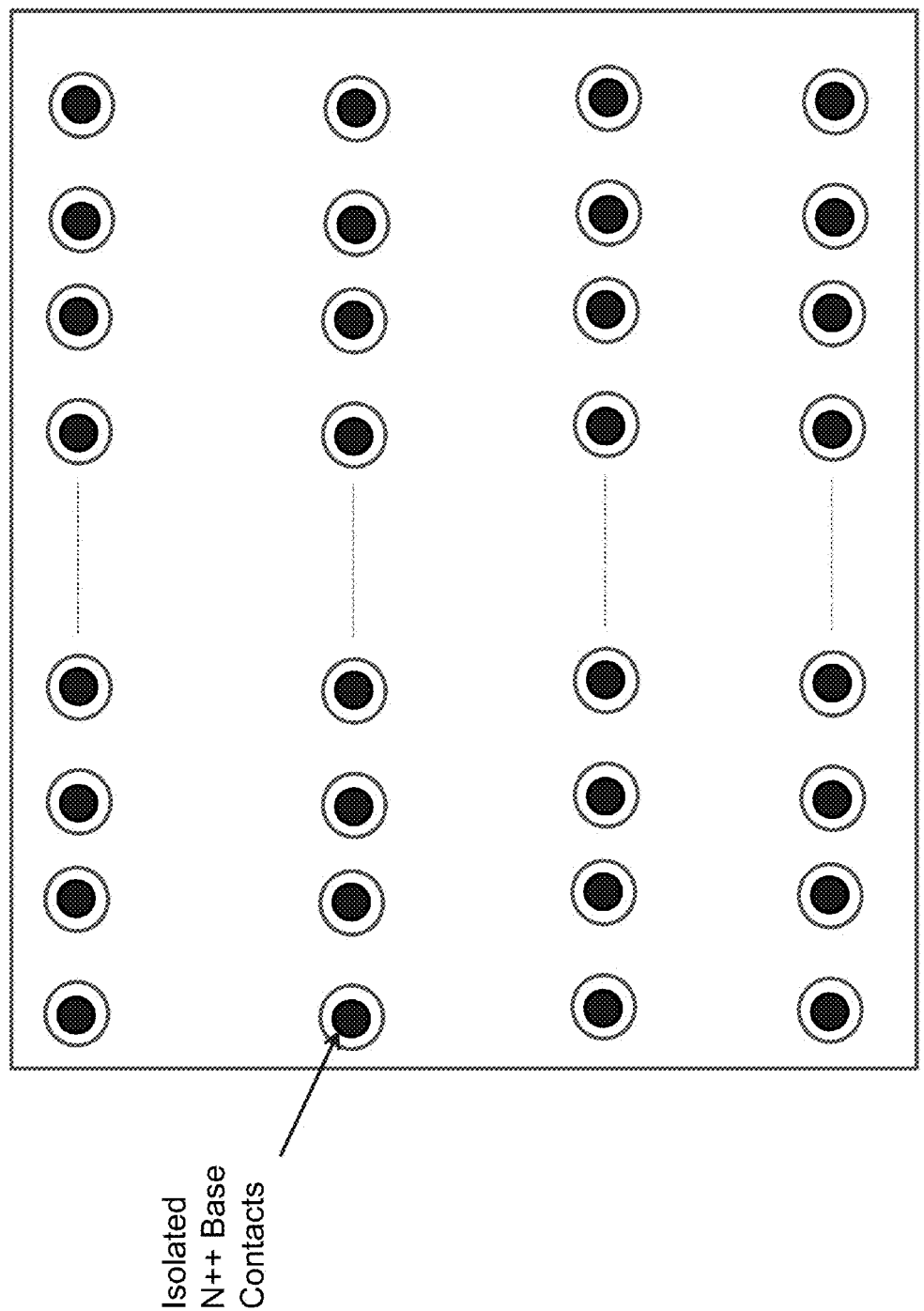
Figure 23:
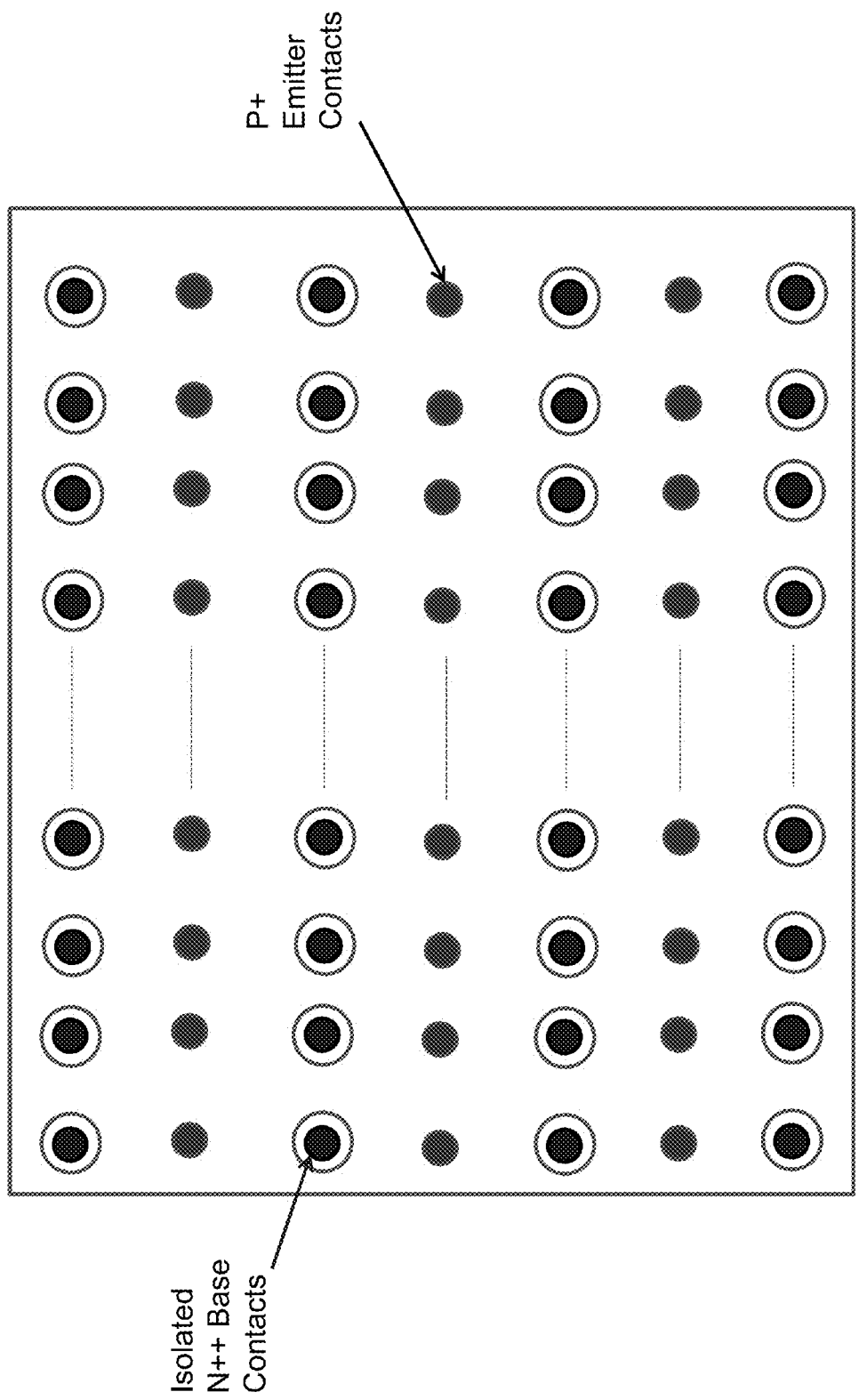
Figure 24:
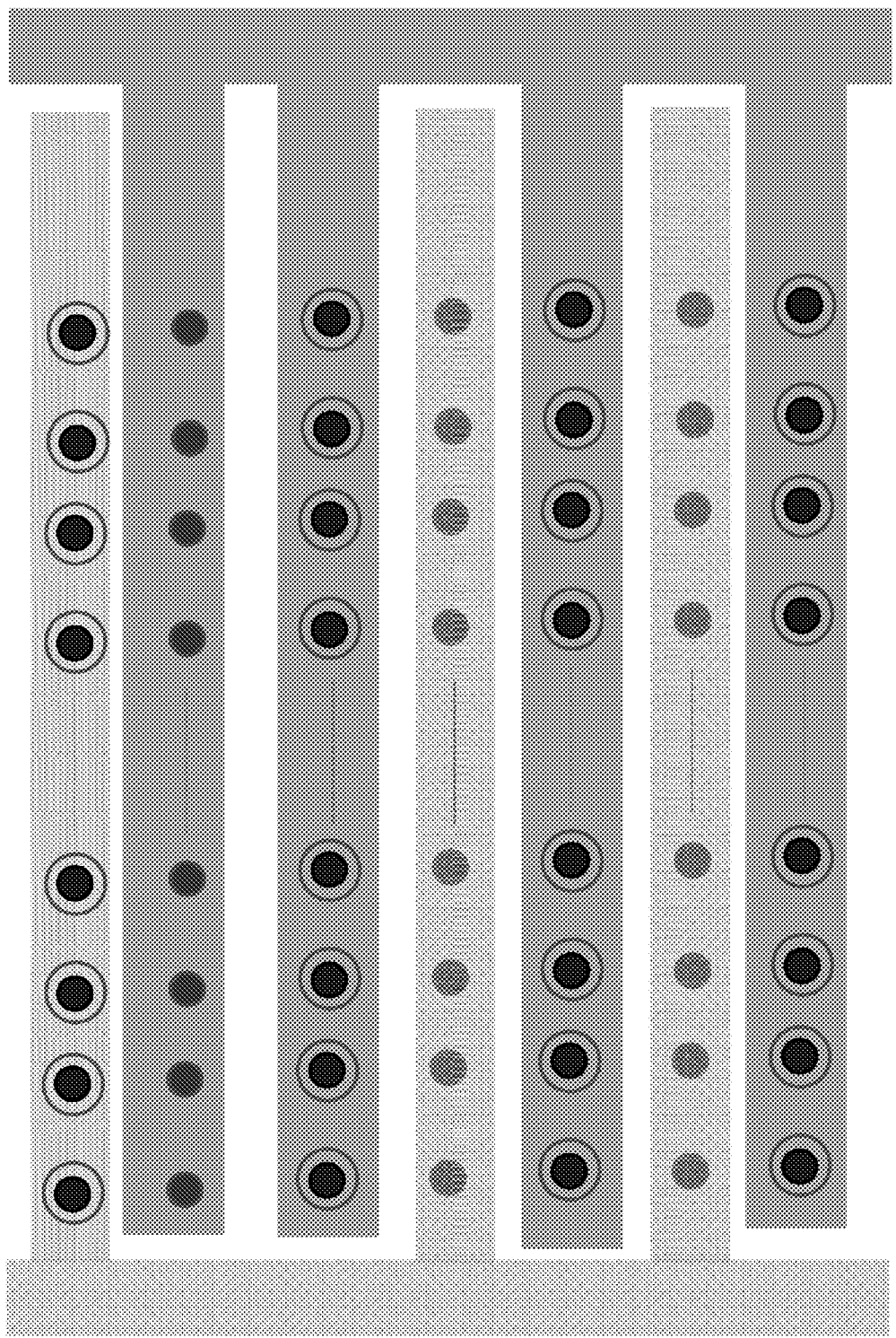

FIG. 19 is a modified process flow for the formation of base regions that utilizes ion implantation followed by laser annealing. Here, we describe the formation of isolated islands of base regions using the process shown in FIG. 19. The various process steps of FIG. 19 are shown by the solar cell structure depicted in FIGS. 20 to 24. FIG. 20 is a diagram of a solar cell after base isolation areas have been opened by laser. FIG. 21 is a diagram of a solar cell after base contacts have been opened by laser. FIG. 22 is a diagram of a solar cell after base contacts have been implanted with phosphorous and laser annealed. FIG. 23 is a diagram of a solar cell after emitter contacts have been opened by laser. FIG. 24 is a diagram of a solar cell after an interdigitated metal pattern is connected to the emitter and base.

After the deposition of Boron doped oxide (BSG), preferably by an atmospheric-pressure chemical-vapor deposition (APCVD) system, openings of dimension 'a' are preferably made in this oxide layer using a pulsed picoseconds or a femtoseconds laser (FIG. 20) that are large enough for the base contacts of size 'b', as well as the required isolation from emitter, 'a' minus 'b' (FIG. 21). The use of a pulsed picosecond or femtosecond laser significantly reduces the risk of damage to silicon by eliminating the Heat-Affected Zone (HAZ) and preventing/suppressing melting of underlying silicon. Next, a high temperature oxidation (or high-temperature anneal) is carried out at a temperature of preferably in the range of 950° C. to 1100° C. to dope the n-type silicon surface with boron to form emitter all over the wafer surface except in regions where the boron-doped oxide had been removed with pulsed laser ablation. This oxidation (or oxidizing anneal) also forms a thin layer (from a few nanometers to 10's of nanometers) of thermal oxide in the laser openings as well as at the interface of the born-doped oxide layer with silicon substrate. Next, a thin layer of undoped oxide (USG) is deposited (again, preferably using an APCVD process) and opening for base contacts are made in the stack formed by this layer and the thermal oxide underneath, using a pulsed picoseconds or a femtoseconds laser. These openings of dimension 'b' are inside the openings 'a' made earlier and aligned center-to-center. For example, the base contact diameter may range from 10 to over 100 µm, a preferred range being 20 to 50 µm. For example, the width of the isolation zone is 15 µm or more based on the laser beam alignment capability. For example, the percent of base opening (base contact area ratio) may be in the range from about 0.5% to over 10%, a preferred range being about 1 to 3%.

Next, a blanket ion implantation of phosphorous (P) is carried out (FIG. 22). The base contacts are selectively implanted with P since the thermal oxide/deposited oxide stacks act as a mask to prevent the implantation of emitter regions. The concentration (dose) and depth of P implants are suitable to obtain the desired doping for base contacts as well as the gradient required for back-surface field (BSF). The surface concentration of dopants may be from $1\times10^{19}$ to $1\times10^{21}$ cm3, a preferred range being from $5\times10^{19}$ to $1\times10^{20}$ cm3. The depth of implanted dopants may be from 0.1 to 5 µm, a preferred range being from 0.3 to 0.5 µm.

These implants are electrically activated using pulsed laser anneal (FIG. 22). Pulsed laser with nanoseconds pulsewidth and wavelength in the blue, green or infrared (IR) are suitable for this operation. The pulsewidth is in the range of approximately a few nanoseconds to a few microseconds, and preferably in the range of approximately 100 to 1,000 nanoseconds. However, in case of thicker silicon films it may be possible to use microseconds pulsewidth lasers.

After the doping and activation of the base contacts is complete, the contacts to emitter are opened using a pulsed picoseconds or a femtoseconds laser (FIG. 23). Next, the metal layer (preferably a metal stack layer comprising an aluminum layer in contact with the cell and at least another layer on top of aluminum comprising a metal from the group of NiV, Ni, or Ag) is deposited, typically using physical vapor deposition (PVD) to make contacts to the base and emitter openings and patterned using a pulsed picoseconds laser (or a combination of pulsed nanoseconds and pulsed picoseconds lasers) to isolate p and n contacts thereby forming the photovoltaic circuit (FIG. 24). The rest of process may be as described in FIG. 19.

Alternatively, instead of PVD metal stack, an aluminum containing paste can be screen printed and annealed to form the interdigitated metal pattern while also making connection to the emitter and base contacts. The rest of the process may be as described in FIG. 19.

Figure 25:
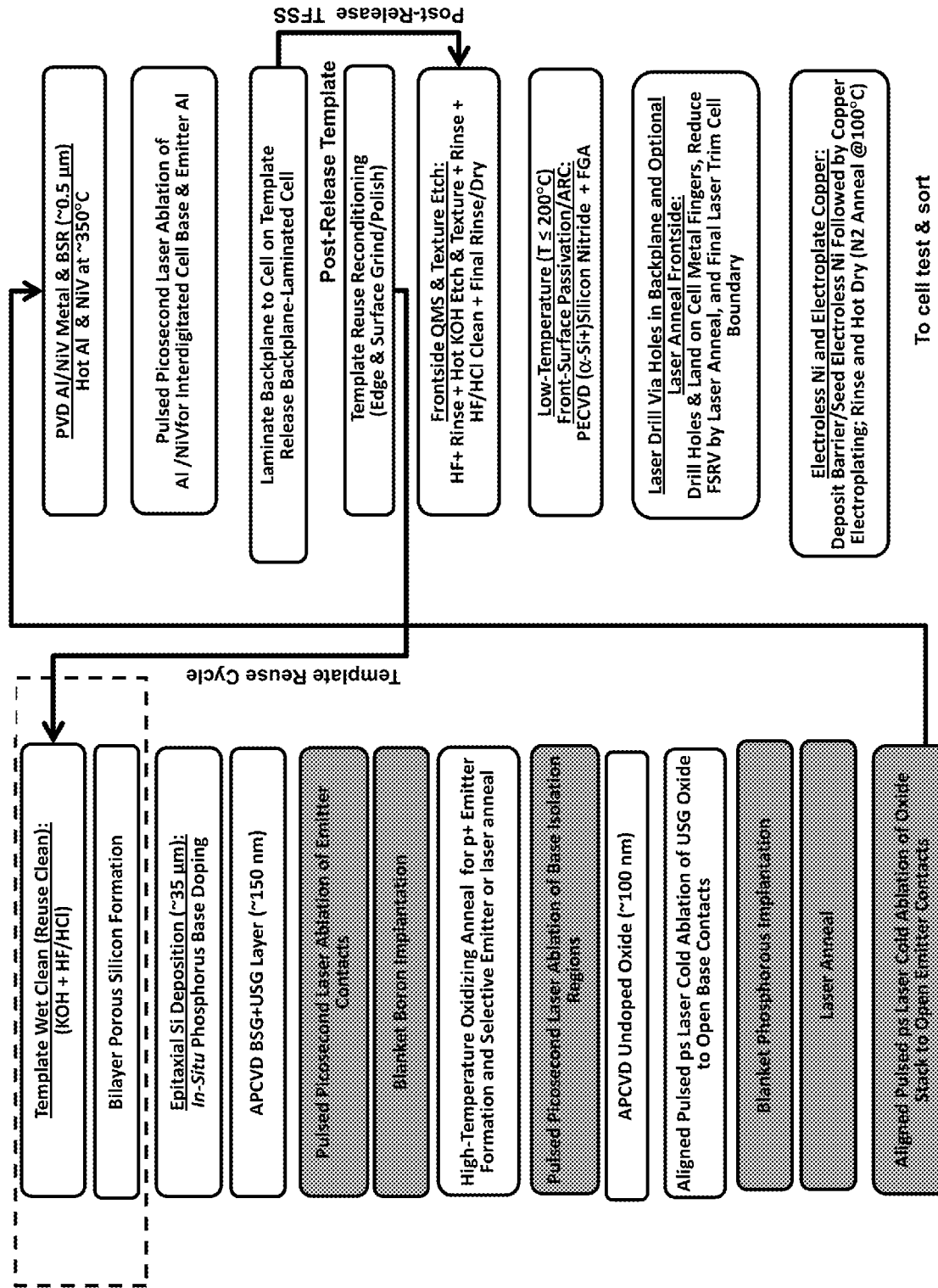
FIG. 25 is a process flow embodiment for forming a selective emitter.
Figure 26:
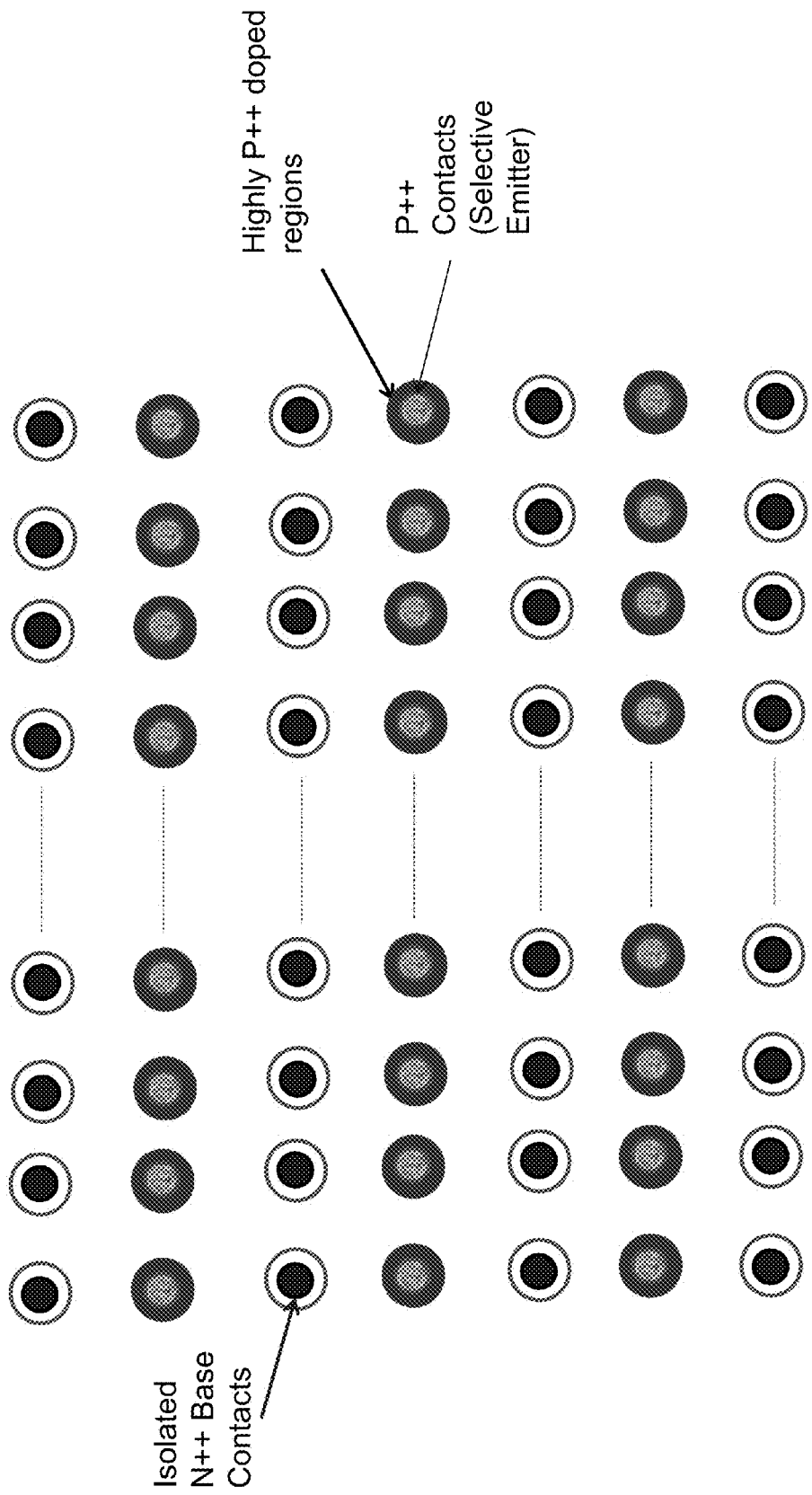
FIG. 26 shows a cell pattern with discrete isolated base and emitter.
Figure 27:
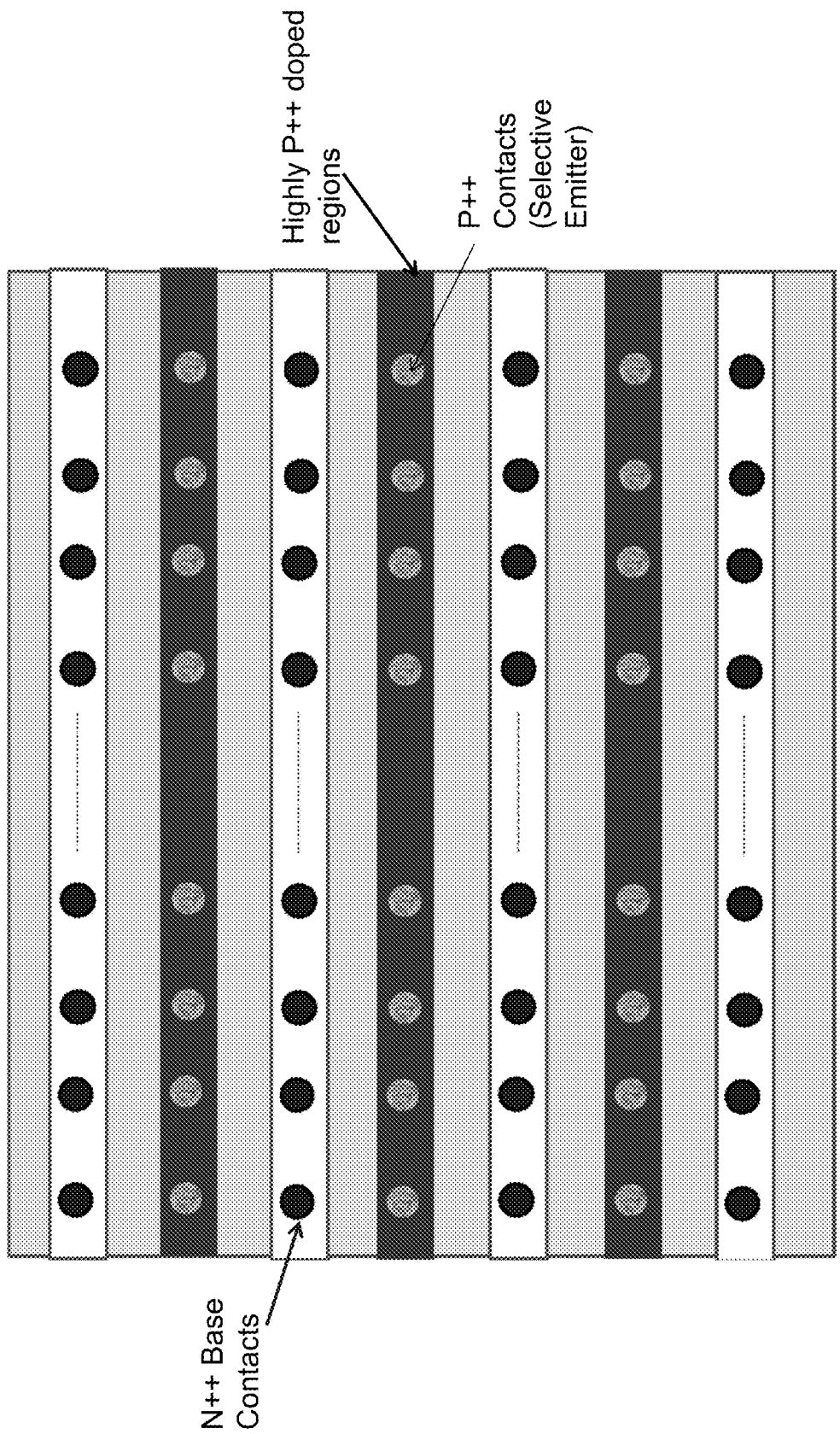
FIG. 27 shows an alternative cell pattern embodiment.

The use of ion implantation also provides a simple method to obtain the so-called "selective emitter" feature. In the selective emitter scheme, the doping concentration of emitter is kept low everywhere to reduce the absorption while under the metal contact the emitter is highly doped to reduce the contact resistance, and hence improve the solar cell efficiency. FIG. 25 is a process flow embodiment for forming a selective emitter. In this scheme before the base isolation region is opened, the BSG layer is removed using laser and the silicon so exposed is implanted with a high concentration of boron. The oxide film elsewhere blocks the boron implant from reaching the silicon. The surface concentration of boron dopants may be from $1\times10^{19}$ to $1\times10^{21}$ cm3, a preferred range being from $5\times10^{19}$ to $1\times10^{20}$ cm3. The depth of implanted dopants may be from 0.1 to 5 µm, a preferred range being from 0.3 to 0.5 µm. The silicon surface is furnace annealed or annealed using a laser. FIG. 26 shows a cell pattern with discrete islands of base and emitter contacts with selective emitter, FIG. 27 shows a cell pattern where the base isolation and selective emitter openings made using laser ablation may be continuous.

For back contact/back-junction cells the minority charge carriers that are generated near the top surface of the silicon have to travel all the way down to the contacts at the back surface. Since most of the photo-generated charge carriers (electron-hole pairs) are closer to the front surface there is a greater chance for them to recombine at this surface. Hence, the passivation of the front surface (or the cell sunny side) has to be excellent to obtain high cell efficiency. The passivation of the front surface is characterized by the front surface recombination velocity (FSRV), with lower FSRV values (typically stated in units of cm/sec) representing better surface passivation. The FSRV is typically reduced to a very low value using PECVD SiN deposition followed by annealing to a relatively high temperature (e.g., up to 300° C. to 850° C.), or PECVD amorphous silicon deposition (typically deposited at a temperature of less than 200° C.). However, both these processes have limitations. Good surface passivation requires annealing to temperatures as high as 8500° C., while passivation with amorphous silicon requires good quality surface cleaning and optimized PECVD amorphous-silicon deposition at temperatures of around 180° C. or above, as well as possibly post-deposition annealing at temperatures in the range of 180° C. to as high as 450° C. Both of these processes may not be suitable for solar cell assemblies that cannot be heated to 200° C. or above, during or after their front surface passivation process (for instance, for thin-film monocrystalline solar cells with reinforcement plates or layers which cannot stand thermal treatments much above approximately 200° C.).

Figure 28:
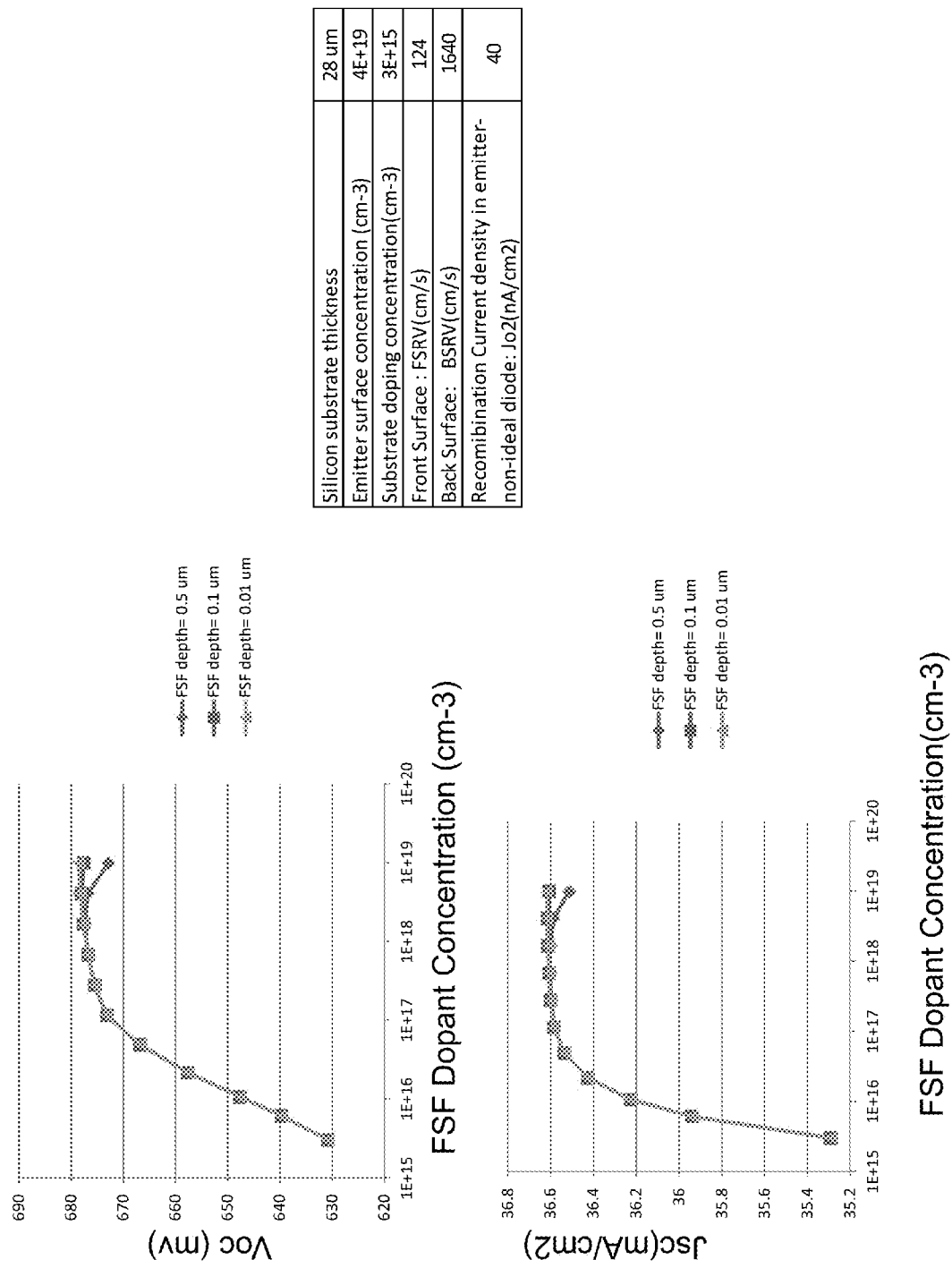
FIG. 28 are graphs showing simulation results of FSF dopant concentration.

An alternate scheme to lower the minority charge carrier recombination is to form a 'high-low' electrical field at the front surface. This field electrically repels the oppositely charged carriers so that they are not able to reach the front surface and recombine there. To repel holes, for n-type substrate or n-type base (such as in an n-type base back-contact/back-junction solar cell), this field is created by a zone of heavier doping of phosphorous (or another n-type dopant such as arsenic or antimony) to create an n+ doped surface. This high-low field at the front surface is called the front surface field (FSF). The results of a simulation based on PC1D are shown in the graphs in FIG. 28, where increasing the concentration of front surface doping by P increases both the Voc and Jsc, and thereby increases the solar cell efficiency. It may be seen that an FSF as thin as 100 A (or 10 nm) or even a thinner FSF layer in the top surface of the semiconductor layer can lead to increases in both open-circuit voltage (Voc) and short circuit current density (Jsc), almost as much as a much thicker FSF layer. The thickness of FSF needs to be low, because as seen in FIG. 25, for FSF thickness of 0.5 µm, both Voc and Jsc are observed to decrease at high doping concentration related to the blue response degradation by the thicker and more heavily doped FSF layer. For a back-junction/back-contact thin-film monocrystalline silicon solar cell with n-type base, using ion implantation of phosphorus (or arsenic or antimony or indium) followed by pulsed (pulse width preferably in the range of about 100 nanoseconds to a few microseconds) laser annealing (with the laser wavelength preferably in the blue, green, red, or near infrared region of the spectrum), the formation of FSF can be carried out by raising the effective surface temperature to a sufficiently high temperature (e.g., in the range of about 750° C. up to below the silicon melting point) where the temperature rise of the bulk and the backside of the semiconductor layer is substantially suppressed and the assembly components on the backside (such as the reinforcement or backplane layer on the cell backside), in-particular, are not exposed to temperatures close to approximately the temperature limit of the backside reinforcement plate (for instance, 200° C. or higher).

The FSF layer may be performed by using an ion implantation process either before or after formation of the front surface passivation layer (preferably by a PECVD process step), followed by a pulsed laser annealing after formation of the front surface passivation layer.

Figure 29A:
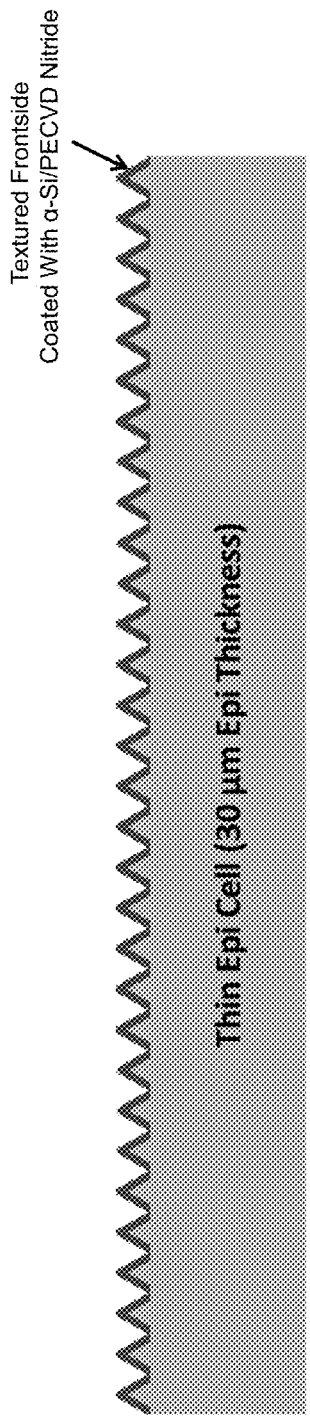
FIGS. 29A-C are cross sections of a solar cell after FSF formation process steps.
Figure 29B:
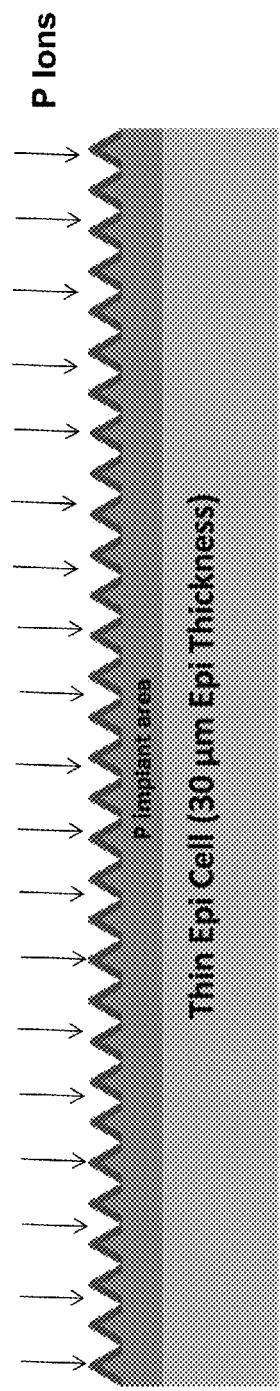
Figure 29C:
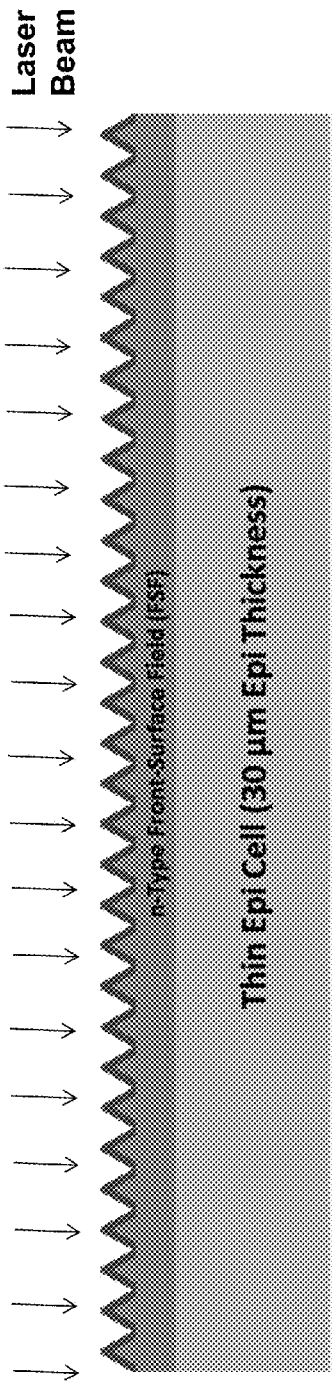

The formation of FSF on the front surface of silicon substrate using ion implantation of phosphorus (P) or another-n-type dopant (for a solar cell with n-type base), followed by pulsed laser anneal, is shown schematically in FIG. 29. FIG. 29A is a cross section of a solar cell with a textured frontside surface. FIG. 29B is a cross section of a solar cell after ion implantation of an n-type dopant such as phosphorous. FIG. 29C is a cross section of a solar cell after laser anneal to activate the implanted phosphorous (for n-type base).

The formation of electrically active FSF layer is carried out after surface texture, and preferably after deposition of the passivation and anti-reflection coating (ARC) layer(s) on the front surface of the silicon substrate (for instance, by PECVD formation of a single-layer or multi-layer passivation/ARC coating comprising a hydrogen-containing silicon nitride and/or a hydrogen-containing amorphous silicon layer). At this stage, the thin-film monocrystalline silicon substrate is supported by a backplane (either a permanently attached/laminated backplane or a temporary support carrier) that may not be heated to high temperatures due to backplane material temperature limits and/or coefficient of thermal expansion (CTE) mismatch with silicon (typically, these constraints may place an upper temperature limit in the range of approximately 150° C. to 300° C., and more likely below 250° C.).

The combination of ion implantation and pulsed laser anneal for formation of FSF field as disclosed herein has several major enabling advantages. Besides keeping the back surface of the solar cell assembly below the temperature limit of the solar cell backplane laminate (for instance below approximately 200° C.), an ion implantation process is a conformal process placing the implanted dopant species (e.g., phosphorus) at a uniformly constant depth conformal to the surface texture random pyramids, resulting in formation of dopant profile in silicon that is conformal to the textured solar cell surface. The ion implantation process can be performed either before or preferably after the formation of the front surface passivation/ARC coating using a relatively low-energy ion implantation process. If the ion implantation process is performed after the formation of the front surface passivation/ARC coating, the ion implantation energy is selected to place the peak concentration of the implanted profile approximately either at the interface between the silicon substrate and the passivation/ARC coating or within the passivation/ARC coating layer. The dose of the ion implantation process may be adjusted such that the resulting peak implanted dopant concentration is preferably in the range of about $5 \times 10^{16}$ to $1 \times 10^{19}$ cm-3. The front surface passivation may be SiN (composed of a single or at least two different refractive indices) or amorphous silicon/SiN stack, or oxide/SiN stack, or other layers and stacks such as silicon oxynitride, with or without an oxide underlayer, and silicon carbide, etc. The ion implantation process is tuned to provide dopant implantation, such as phosphorus (P) implantation for n-type base, such that the concentration peak is preferably at or near the silicon substrate/passivation layer interface. The surface concentration of dopant, P for n-type base, may be from 1E16 to 1E20 cm-3, while the preferred range is 5E16 to 1E19 cm-3. The dopant atoms may be implanted and laser annealed to form an FSF layer to a depth below silicon surface that may range from about 10 A to about 1 micron, while FSF layers in the thickness range of about 50 A to about 0.1 μm are preferred to prevent blue response degradation.

Because of extremely rapid heating and cooling times and limited heat diffusion depth, pulsed laser annealing can electrically activate the implanted dopant atoms without an appreciable movement. As a preferred process, pulsed laser annealing is performed under conditions which prevent excessive heating and melting of silicon in order to prevent damage to silicon and degradation of the passivation properties. This makes possible the formation of relatively sharp step function profiles of dopant atoms that help to amplify the repulsion field, and FSF field-assisted improvement of the front surface passivation properties. A nanoseconds (to microseconds) pulsed laser with wavelength in the blue or green or red or infrared (IR) is suitable for spatially selective annealing. The preferred pulsewidth is in the range of approximately 100 to 1,000 nanoseconds. However, in case of thicker silicon films it may be possible to use microseconds pulsewidth lasers. Other pulsed laser sources with pulse width between about 1 nanosecond to 100 nanoseconds or up to several microseconds may also be used.

Figure 30:
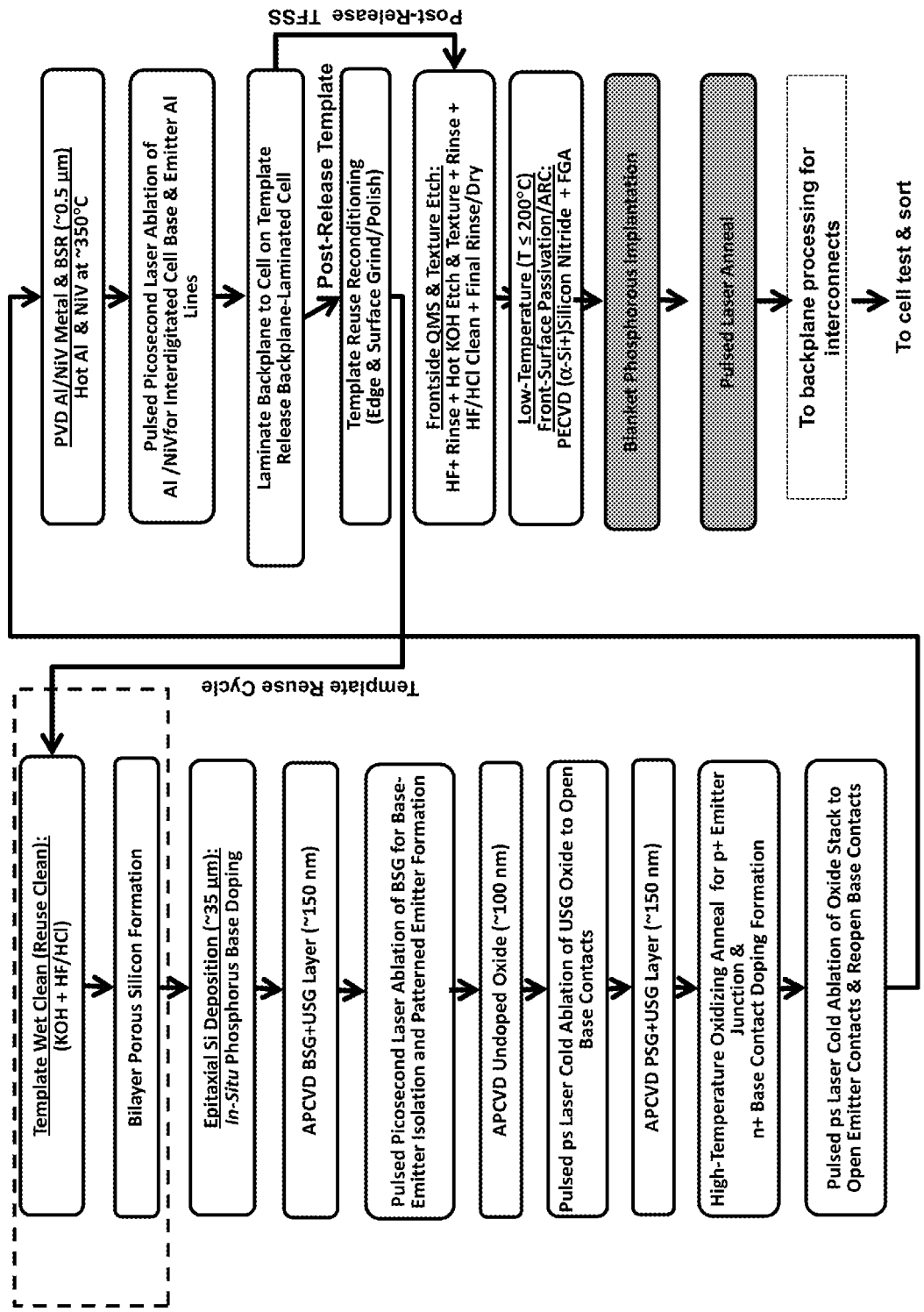
FIG. 30 is process flow to form a solar cell with an FSF layer.
Figure 31:
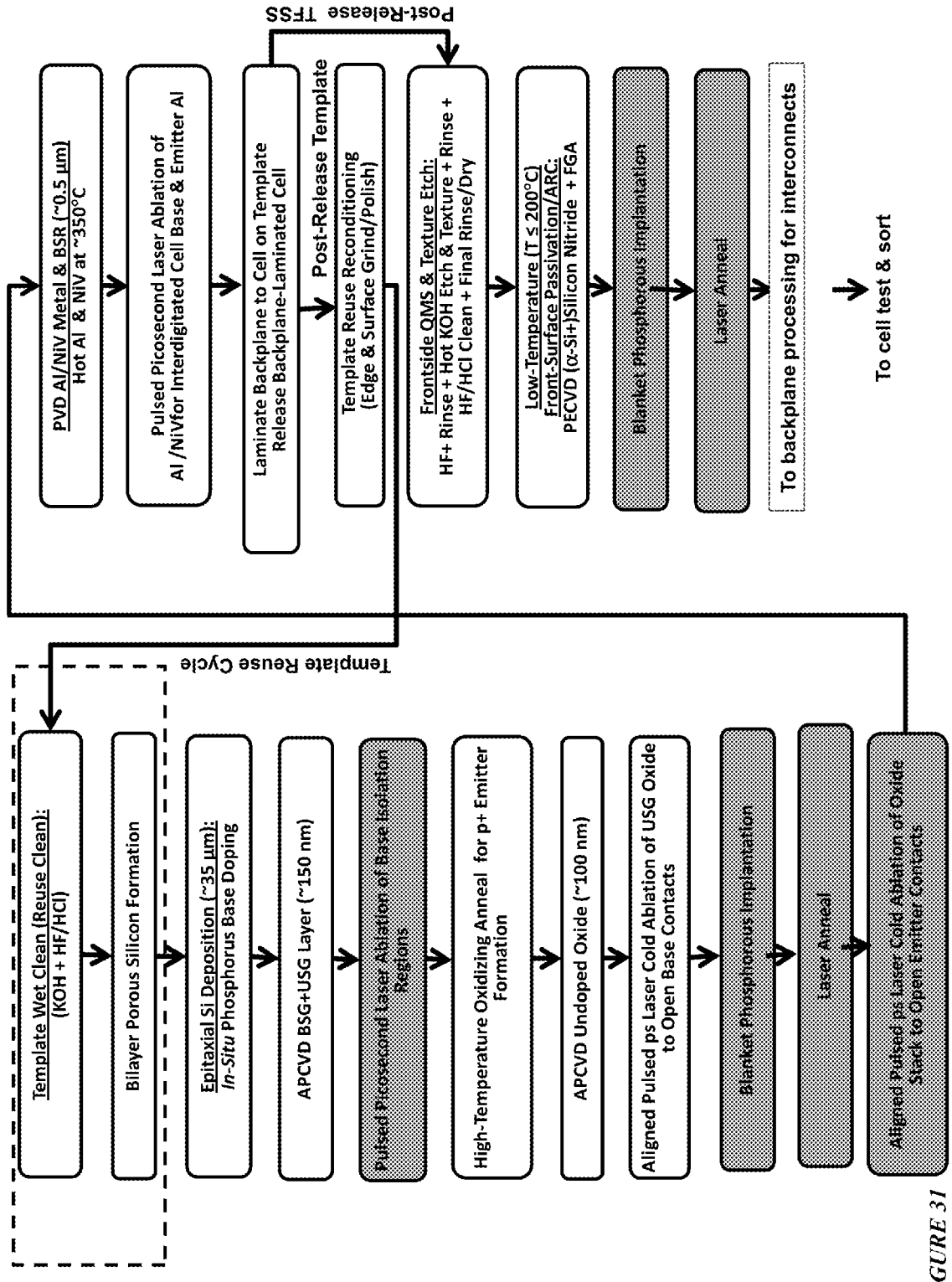
FIG. 31 is a combined process flow in accordance with the disclosed subject matter.
Figure 32:
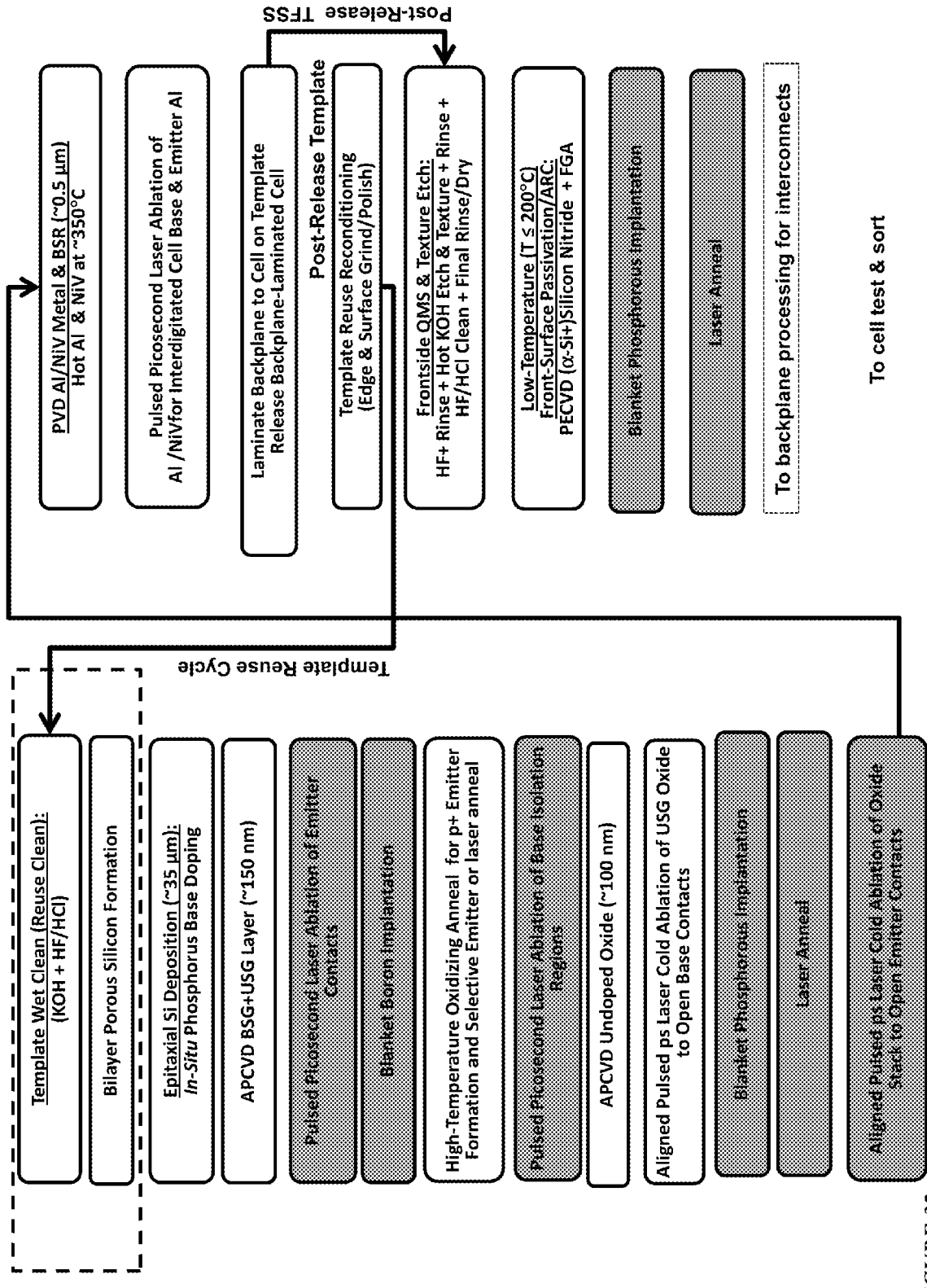
FIG. 32 is a process flow in accordance with the disclosed subject matter.
Figure 33:
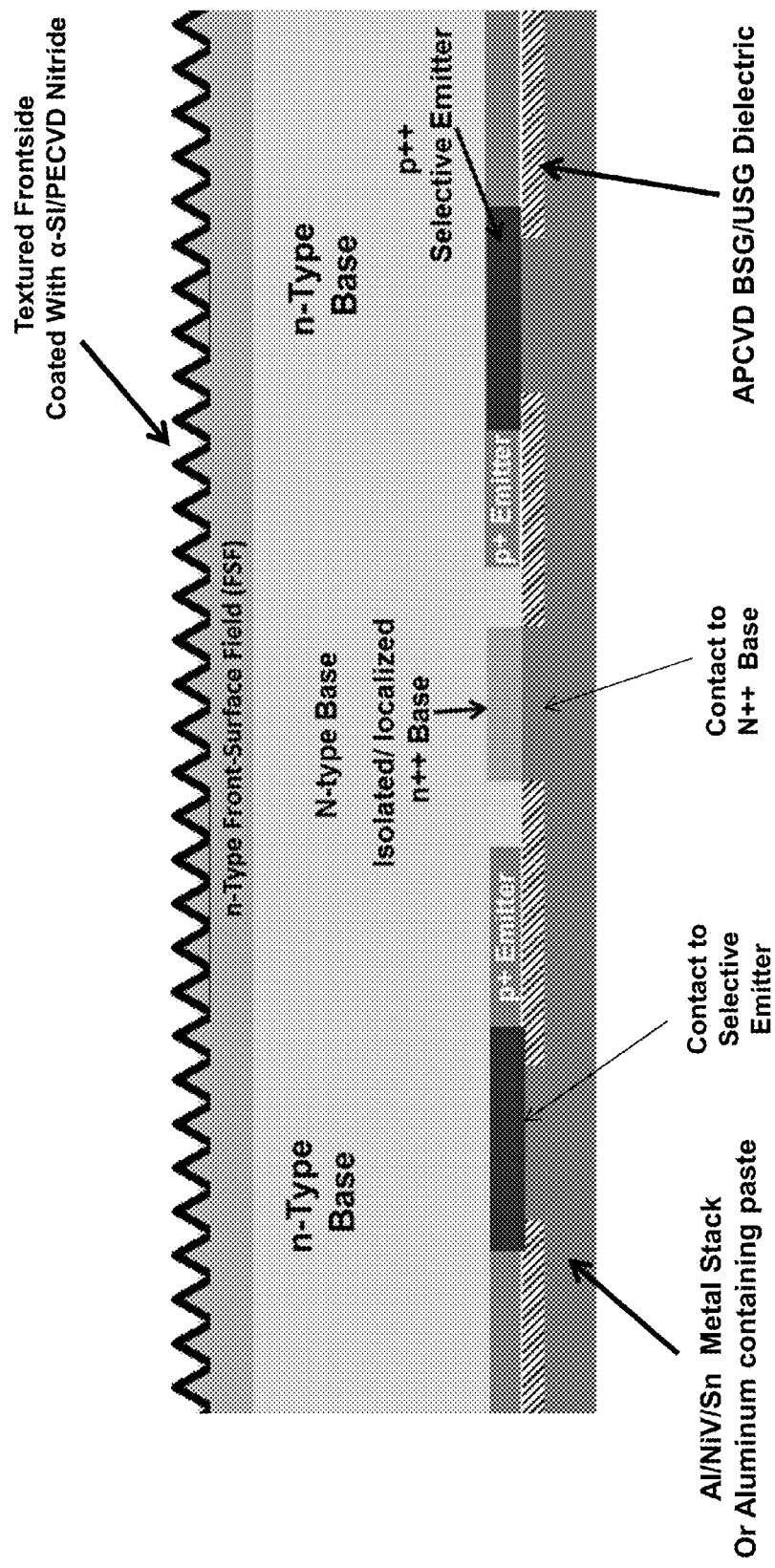
FIG. 33 is a diagram of a cross section of the solar cell formed in accordance with the disclosed subject matter.

A process flow to form a solar cell with an FSF layer based is shown in FIG. 30. FIG. 31 shows a combined process flow where a high efficiency solar cell is made with ion implanted and annealed base contacts in the rear with an FSF in the front based on the embodiments of this disclosure. FIG. 32 shows a process flow where the selective emitter formation is also included. FIG. 33 is a diagram of a cross section of the solar cell formed in accordance with the disclosed subject matter (the backplane is not shown for clarity).

Although the process flow and techniques are described for a cell based on n-type base, the same considerations apply to a cell based on p-type base where the base doping and the FSF formation is done using implantation of boron (or another suitable p-type dopant such as gallium or aluminum).

Although, for simplicity the process has been described for a planar silicon film, the same holds true for 3-D silicon substrates formed using pre-structured templates with various pyramidal or prism 3D patterns.

Two additional methods for laser anneal are further described below, whereby, the sunny side of the solar cell is annealed without necessarily affecting the back or the non-sunny side of the solar cell.

Conventional back contacted solar cells are n-type substrate and use PECVD based SiN based passivation for the sunny side. This passivation also serves as an anti reflection coating and has a positive fixed charge which helps create a field effect by reflecting the minority carriers (holes in this case) away from the surface. The typical good quality passivation deposition temperature for the PECVD SIN is about 400° C. In certain cases, the maximum tolerable temperature can be much less than 400° C., as dictated by the integration scheme. For example, in the case of very thin film crystalline silicon solar cells, which are supported by carriers which are not capable of going higher than a maximum temperature less than 400° C.

In a particular instance, this temperature can be as low as 200° C. With the constraint of 200° C. maximum temperature, the issue is to get a passivation quality as good as a 400° C. typical passivation. A possible solution is to deposit very thin amorphous silicon (can be between 30 A to 100 A) range such that it is non-absorptive. The idea is that amorphous silicon contains significant hydrogen, which can passivate the dangling bonds, thereby improving the passivation quality. However, the problem is that at 200° C. temperature, the Hydrogen atoms may not have enough mobility to migrate from amorphous silicon to the silicon interface.

To aid the mobility of the Hydrogen atoms, laser anneal is deployed, which in its pulsed form lasts for a very short duration. This should be enough to cause the migration of H2 atoms for short distance, without disturbing the integrity of the other parts of the structure. The laser process must be such that the front surface is selectively heated, while ensuring that back surface, which may consist of temperature sensitive metal structures, is not affected.

In one embodiment this can be achieved using short wavelength laser, which is absorbed near the sunny side surface of the solar cell. Short wavelength laser (such as green) will be absorbed readily within a distance of 1 um or less, thus minimizing the chance of hitting the temperature sensitive back structure of a back contacted cell.

In another embodiment, longer wavelengths such as 1 μm range may be used. A longer wavelength will travel longer distance into silicon and may reach the backside without getting absorbed in the bulk. Thus, a process must be designed such that front, sunny side, is heated, while the laser is stopped from hitting the backside. This can be achieved, either by absorbing the laser power in the silicon or by reflecting is before it reaches the backside. The absorption can be done in the bulk after the laser has already passed through the critical front side. This can be achieved using the aforementioned technique of flooding the bulk with carrier excited by potentially a different wavelength laser in a CW mode and relying on plasma dispersion effect to get it absorbed. Amongst several ways of reflecting the annealing laser, two specific embodiments are described below.

In one instance, the fact that annealing laser is monochromatic is exploited. A mirror is created on the backside using different refractive index. The thicknesses are tuned in accordance with the refractive index such that laser at 1 um (or the relevant wavelength in use) is selectively reflective by the dielectric mirror stack. In one example, the dielectric mirror stack can be made using SiO2 and SIN. The SiO2 can either by deposited using myriad techniques such as thermal oxidation or APCVD. While, SiN can be deposited using PECVD. In many instances, at least a part of the dielectric stack might already be part of the back surface passivation. Since the metal is behind the dielectric mirror, thus formed, the laser is reflected back toward the front surface before it touches the back metal.

In another instance of reflecting the annealing long wavelength laser, the angle of incidence of the laser may be varied in conjunction with the topography of the front typically textured surface. In most back contacted solar cells, the frontside consists of a passivation on top of silicon. Thus, the light enters typically from a high refractive index to a lower refractive index. Thus, the angle of incidence of the annealing laser can be varied in a manner such that when light falls on the back Silicon/dielectric (typically SiO2) interface, its angle of incidence at this surface is greater than the critical angle for total internal reflection (henceforth, TIR). Thus, TIR causes the laser beam to be reflected back toward the front side well before it has a chance to touch the backside metal stack.

In operation, the following processes and process embodiments are herein provided: a process to form isolated islands of base and/or front surface field (FSF), using ion implantation followed by pulsed laser annealing are disclosed for all back-contact back-junction solar cells using thin-film crystalline silicon substrates; processes to form isolated islands of base and front surface field (FSF), using ion implantation followed by pulsed laser annealing are disclosed for all back-contact back-junction solar cells using thin-film crystalline silicon substrates with assemblies such as cell reinforcement plates or backplane laminates that cannot be heated to a temperature above approximately a maximum temperature in the range of 150° C. to 3500° C.

In another embodiment, processes to form isolated islands of base and front surface field, using ion implantation followed by pulsed laser annealing for 3-D back-contact back-junction solar cells using thin-film crystalline silicon substrates; a process to form the selective emitter is disclosed using ion implantion followed by furnace or laser anneal. In the selelctive emitter region the surface concentration of boron dopants may be from 1×1019 to 1×1021 cm3, a preferred range being from 5×1019 to 1×1020 cm3. The depth of implanted dopants may be from 0.1 to 5 μm, a preferred range being from 0.3 to 0.5 μm; processes to form front surface field (FSF), using ion implantation followed by pulsed laser annealing are disclosed for all back-contact back-junction solar cells using thin-film crystalline silicon substrates where the peak concentration of implants is in the range of 1E16 to 1E20 cm−3, the preferred range being 5E16 to 5E18 cm−3.

In another embodiment, processes to form front surface field (FSF), using ion implantation followed by laser annealing are disclosed for all back-contact back-junction solar cells using thin-film crystalline silicon substrates where the depth of the resulting FSF layer formed by a combination of ion implantation and pulsed laser anneal is in the range of approximately 10 A to 0.5 μm, the preferred range being about 50 to 1000 A.

In another embodiment, the FSF formation is carried out for textured thin film silicon substrates that may be passivated with be SiN or amorphous silicon/SiN stack, or oxide/SIN stack, or other layers and stack such as silicon oxynitride, with or without an oxide underlayer, and silicon carbide, etc, deposited at temperatures lower than 200° C.

In another embodiment, processes to form front surface field (FSF), using ion implantation followed by pulsed laser annealing are disclosed for all back-contact back-junction solar cells using thin-film crystalline silicon substrates where the concentration peak for the dopant is approximately at the silicon/passivation layer interface.

In another embodiment, processes to form front surface field (FSF), using ion implantation followed by laser annealing are disclosed for all back-contact back-junction solar cells using thin-film crystalline silicon substrates are disclosed where pulsed laser annealing is carried out using pulses with pulse width in the range of nanoseconds to microseconds, preferably a nanoseconds laser with blue or green or red or IR wavelength, the preferred pulse width being in the range of approximately 100 to 1000 nanoseconds.

In another embodiment, processes to form isolated islands of base for all back-contact back-junction solar cells using thin-film crystalline silicon substrates are disclosed where the isolated base contact islands are formed using aligned laser ablation using picoseconds or femtoseconds pulsed laser with UV, green, or IR wavelengths. The base contact diameter can range from 10 to 100 μm, preferred range being 20 to 50 μm. The width of the isolation zone is preferably >15 μm based on the laser beam alignment capability. The percent of base opening can be in the range from about 0.5% to 10%, the preferred range being 1% to 3%.

In another embodiment, processes to form isolated islands of base for all back-contact back-junction solar cells using thin-film crystalline silicon substrates are disclosed where the base doping is carried out by ion implantation and followed by pulsed laser anneal. The surface concentration of dopants can be from 1E19 to 1E21 cm−3, preferred range being from 5E19 to 1E20 cm−3. The depth of implanted and annealed dopant can be approximately from 0.1 to 5 µm, preferred range being from about 0.3 to 0.5 µm In another embodiment, processes to anneal the wafer using a laser are disclosed where the laser beam is prevented from heating the backplane as it is reflected from the SiO2/SiN bilayer at the back of the silicon film.

In another embodiment, process to anneal the wafer using laser are disclosed where the laser beam is prevented from heating the back plane as it undergoes full internal reflection because of the angle at which it is made to be incident on the back plane. This may be performed by controlling the incident angle of the laser beam depending on the dielectric stack on the front surface of the wafer.

The foregoing description of the exemplary embodiments is provided to enable any person skilled in the art to make or use the subject matter. Various modifications to these embodiments will be readily apparent to those skilled in the art, and the generic principles defined herein may be applied to other embodiments without the use of the innovative faculty. Thus, the subject matter to be claimed in subsequently filed applications is not intended to be limited to the embodiments shown herein but is to be accorded the widest scope consistent with the principles and novel features disclosed herein.

What is claimed is:

1. A method for making base regions in a thin-film crystalline silicon substrate, the method comprising:
    forming openings in a dielectric layer for base contacts on a thin-film crystalline silicon substrate, wherein said openings form a patterned dielectric layer;
    implanting ions of an dopant element in said thin-film crystalline silicon substrate within said patterned dielectric layer to selectively introduce said dopant element at said base contacts, said patterned dielectric used as an ion implantation mask;
    activating said implanted dopant element to form electrically active doped base contacts;
    forming emitter contacts on said thin-film crystalline silicon substrate; and
    forming metallization contacts on said emitter contacts and said base contacts.

2. The method of claim 1 wherein said dopant element comprises at least one element from the group of phosphorus, arsenic, antimony, and indium in conjunction with an n-doped epitaxial silicon substrate.

3. The method of claim 1, further comprising the step of forming a crystalline thin-film silicon substrate, the steps comprising:
    forming a porous sacrificial layer on and substantially conformal to the surface of a silicon template;
    subsequently depositing an epitaxial silicon layer on said sacrificial layer;
    performing a plurality of solar cell processing steps including said ion implantation process; and
    releasing said epitaxial silicon layer from said silicon template through a mechanical release or epitaxial lift off process.

4. The method of claim 1, wherein said silicon substrate is an n-type silicon substrate and the base contact doping element is phosphorous (P), arsenic (As), or antimony (Sb).

5. The method of claim 1, wherein said silicon substrate is a p-type silicon substrate and the base contact doping element is boron, gallium, or aluminum.

6. The method of claim 1, wherein said opening for base contacts is performed using laser ablation.

7. The method of claim 6, wherein said laser ablation is pulsed pico-second laser ablation.

8. The method of claim 6, wherein said laser ablation is pulsed femto-second laser ablation.

9. The method of claim 1, wherein said activating said implanted dopant element is performed using furnace annealing.

10. The method of claim 1, wherein said activating said implanted dopant element is performed using laser annealing.

11. The method of claim 10, wherein said laser annealing is pulsed nanosecond laser annealing.

12. The method of claim 1, wherein the base and emitter contacts are patterned in parallel linear regions.

13. The method of claim 1, where the base and emitter contacts are formed as discrete islands.

14. The method of claim 1, wherein the percent of base opening can be in the range from about 0.5% to 10%.

15. The method of claim 1, where laser ablation is carried out using laser with wavelength being IR, green, or UV, or any wavelength between.

16. The method of claim 1, where the surface concentration of dopants in the base may be from $1\times10^{19}$ to $1\times10^{21}$/cm3, implanted at a depth of 0.1 to 5 µm.

17. A method for making a front surface field region in a thin-film crystalline silicon substrate, the method comprising:
    implanting dopant atoms on the front side of a thin-film crystalline silicon substrate, wherein the dopant element has a peak concentration in the range of 1E16 to 1E20 cm$^{-3}$; and
    activating said implanted ions using laser annealing using a continuous wave (CW) laser or a pulsed laser to form a front surface field on said thin-film crystalline silicon substrate.

18. The method of claim 17, wherein said dopant element comprises at least one element selected from the group of phosphorus, arsenic, antimony, and indium in conjunction with an n-doped epitaxial silicon substrate.

19. The method of claim 17, wherein said front surface field has a depth in the range of 10 angstroms to about 1 micron on the front side of said thin-film crystalline silicon substrate.

20. The method of claim 17, wherein said thin-film crystalline silicon substrate is passivated with a passivation layer deposited at a temperature less than 250° C.

21. The method of claim 20, wherein said passivation layer is chosen from the group consisting of SiN, amorphous silicon/SiN stack, oxide/SiN stack, or silicon oxynitride with and without an oxide underlayer, and silicon carbide.

22. The method of claim 20, wherein the passivation layer is deposited after the ion implantation and laser anneal.

23. The method of claim 20, wherein the ion implantation and anneal is carried out after the passivation layer is deposited.

24. The method of claim 17, wherein the peak concentration of the dopant element is at the interface of the silicon film and the said passivation layer.

25. The method of claims 17, wherein the incident angle of the laser beam is controlled based on a dielectric stack on the front surface of said substrate to prevent from heating the back plane as it undergoes full internal reflection.

26. The method of claim 17, wherein said laser has a wavelength less than or equal to 1064 nanometers.

27. The method of claim 17, wherein said dopant element comprises at least one element selected from the group of phosphorus, arsenic, antimony, and indium in conjunction with an n-doped silicon substrate.

28. A method for making selective emitter regions in a thin-film crystalline substrate, the method comprising:

forming first openings in a parallel linear region pattern for emitter contacts on a thin-film crystalline silicon substrate;

selectively implanting ions of an dopant element in said thin-film crystalline silicon substrate at said emitter contacts;

activating said implanted ions to form doped emitter contacts; and forming metallization contacts on said emitter contacts and base contacts on said thin-film crystalline silicon substrate.

29. The method of claim 28, wherein said silicon substrate is an n-type silicon substrate and said emitter contact doping element is boron, gallium, or aluminum.

30. The method of claim 28, wherein said silicon substrate is a p-type silicon substrate and said emitter contact doping element is phosphorous (P), arsenic (As), indium (In), or antimony (Sb).

31. The method of claim 28, wherein said silicon substrate is a p-type silicon substrate and a base contact doping element is boron, gallium, or aluminum.

32. The method of claim 28, wherein the opening for emitter is performed using pulsed laser ablation.

33. The method of claim 28, wherein the implant activation is performed using furnace annealing.

34. The method of claim 28, wherein the implant activation is performed using laser annealing.

35. The method of claim 28, wherein said base and emitter contacts are discrete islands.

* * * * *